(12) United States Patent
Kanno

(10) Patent No.: US 10,419,625 B2
(45) Date of Patent: Sep. 17, 2019

(54) PHOTOELECTRIC CONVERSION DEVICE, IMAGE READING DEVICE AND IMAGE FORMING APPARATUS

(71) Applicant: Tohru Kanno, Osaka (JP)

(72) Inventor: Tohru Kanno, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/103,391

(22) Filed: Aug. 14, 2018

(65) Prior Publication Data
US 2019/0007566 A1 Jan. 3, 2019

Related U.S. Application Data

(63) Continuation of application No. PCT/JP2017/004346, filed on Feb. 7, 2017.

(30) Foreign Application Priority Data

Mar. 16, 2016 (JP) ................................. 2016-052509

(51) Int. Cl.
*H04N 1/60* (2006.01)
*H04N 1/00* (2006.01)
(Continued)

(52) U.S. Cl.
CPC ... *H04N 1/00251* (2013.01); *H01L 27/14643* (2013.01); *H04N 5/341* (2013.01);
(Continued)

(58) Field of Classification Search
None
See application file for complete search history.

(56) References Cited

U.S. PATENT DOCUMENTS 6,423,957 B1* 7/2002 Kim .................... H04N 5/3575
250/208.1
7,920,184 B2* 4/2011 Rossi .................... H04N 5/378
250/208.1
(Continued)

FOREIGN PATENT DOCUMENTS

EP 2 192 764 A1 6/2010
JP 2003-101881 4/2003
(Continued)

OTHER PUBLICATIONS

International Search Report dated May 9, 2017 in PCT/JP2017/004346 filed on Feb. 7, 2017.
(Continued)

*Primary Examiner* — Dung D Tran
(74) *Attorney, Agent, or Firm* — Oblon, McClelland, Maier & Neustadt, L.L.P.

(57) ABSTRACT

A photoelectric conversion device includes a pixel array including one or more linear array, each including plural linearly-arranged pixels; and plural memory circuits, each including plural memory cells. The plural pixels in the pixel array are connected one-to-one to the plural memory cells of the plural memory circuits. Each of the plural pixels alternately outputs a photoelectric conversion value indicating an electric voltage generated in accordance with a light amount of an incident light entering the pixel, and a reset value indicating a reference charge of the pixel, to the memory cell corresponding to the pixel. Each of the plural memory cells temporarily stores the photoelectric conversion value and the reset value output from the pixel corresponding to the memory cell. Each of the plural memory circuits outputs the photoelectric conversion values and the reset values stored in the plural memory cells of the memory circuit, in a predetermined order.

17 Claims, 34 Drawing Sheets

(51) Int. Cl.
  *H04N 5/369*    (2011.01)
  *H04N 5/378*    (2011.01)
  *H01L 27/146*   (2006.01)
  *H04N 5/341*    (2011.01)
  *H04N 5/3745*   (2011.01)
  *H04N 5/376*    (2011.01)

(52) U.S. Cl.
  CPC ........... *H04N 5/3692* (2013.01); *H04N 5/378* (2013.01); *H04N 5/3745* (2013.01); *H04N 5/3765* (2013.01)

(56) References Cited

U.S. PATENT DOCUMENTS

| | | | |
|---|---|---|---|
| 8,081,100 B2 | 12/2011 | Kanno | |
| 8,284,286 B2 | 10/2012 | Mabuchi | |
| 8,405,017 B2* | 3/2013 | Neter | H04N 5/3559 250/208.1 |
| 8,817,153 B2* | 8/2014 | Bahukhandi | H04N 5/37455 348/308 |
| 9,185,314 B2* | 11/2015 | Mantri | H04N 5/359 |
| 9,344,652 B2 | 5/2016 | Itano et al. | |
| 9,888,199 B2* | 2/2018 | Gomi | H01L 27/14618 |
| 2007/0279505 A1 | 12/2007 | Iwamoto et al. | |
| 2008/0068467 A1 | 3/2008 | Kanno et al. | |
| 2008/0204567 A1* | 8/2008 | Xu | H03F 3/005 348/222.1 |
| 2011/0157616 A1 | 6/2011 | Aoyama et al. | |
| 2013/0221199 A1* | 8/2013 | Kato | H04N 5/3692 250/208.1 |
| 2015/0077605 A1* | 3/2015 | Takada | H01L 27/148 348/300 |
| 2015/0163378 A1 | 6/2015 | Konno et al. | |
| 2015/0163403 A1* | 6/2015 | Wakabayashi | H04N 5/378 348/308 |
| 2016/0003673 A1 | 1/2016 | Hashimoto et al. | |
| 2016/0006961 A1 | 1/2016 | Asaba et al. | |
| 2016/0028985 A1* | 1/2016 | Vogelsang | H01L 27/14641 348/294 |
| 2017/0180655 A1* | 6/2017 | Kaneko | H04N 5/357 |

FOREIGN PATENT DOCUMENTS

| | | |
|---|---|---|
| JP | 2006-030248 | 2/2006 |
| JP | 2007-267031 | 10/2007 |
| JP | 2007-336519 | 12/2007 |
| JP | 2008-078771 | 4/2008 |
| JP | 2008-078796 | 4/2008 |
| JP | 2011-151794 | 8/2011 |
| JP | 2013-211838 | 10/2013 |
| JP | 2015-032943 | 2/2015 |
| JP | 2016-019055 | 2/2016 |

OTHER PUBLICATIONS

Written Opinion dated May 9, 2017 in PCT/JP2017/004346 filed on Feb. 7, 2017.
Extended European Search Report dated Feb. 15, 2019 in European Patent Application No. 17766130.3, 9 pages.

* cited by examiner

PHOTOELECTRIC CONVERSION DEVICE, IMAGE READING DEVICE AND IMAGE FORMING APPARATUS

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2017/004346 filed on Feb. 7, 2017 and designating the U.S., which claims priority of Japanese Patent Application No. 2016-052509 filed on Mar. 16, 2016. The entire contents of the foregoing applications are incorporated herein by reference.

BACKGROUND OF THE INVENTION

1. Field of the Invention

The disclosure herein generally relates to a photoelectric conversion device, an image reading device, and an image forming apparatus.

2. Description of the Related Art

Image reading devices and image forming apparatuses are provided with photoelectric conversion devices (image sensors) such as CCD sensors or CMOS sensors, in order to capture images. Particularly, in image reading devices, such as scanners, image forming apparatuses, such as copiers or printers/MFP (Multi-function peripherals), linear sensors are used for capturing images.

Previously, linear sensors used in scanners were mainly CCD linear sensors. However, because the CCD linear sensors output analog signals, analog signal processing (offset correction, waveform shaping, amplification, AD conversion, or the like) and data transmission are required at subsequent stages. Moreover, the CCD linear sensors require high power-supply voltages (10 V, 12 V, or the like), consume large amounts of power, and are difficult to handle due to a large number of peripheral components. In order to operate the CCD linear sensors, large loads are applied to the image reading devices or the image forming apparatuses.

In contrast, CMOS sensors, which have become popular for area sensors, can operate at low power-supply voltages (3.3 V, 5 V, or the like). Moreover, products of CMOS sensors often have analog/digital converters built-in, and CMOS processes performed in the CMOS sensors facilitate integration with digital circuits in peripheral devices. CMOS area sensors are disclosed, for example, in Japanese Unexamined Patent Application Publication No. 2003-101881 and Japanese Unexamined Patent Application Publication No. 2015-032943.

A small portion of the CMOS sensors includes CMOS linear sensors that can be used in scanners of printers/MFP designed for offices, for example.

The linear sensor is preferably required to be provided with a function of a global shutter, which the CCD linear sensors commonly have. Moreover, the linear sensor may include a plurality of linear arrays, each including a plurality of pixels arranged along a main scan direction (e.g. three linear arrays corresponding to pixels of three colors of R/G/B, respectively). In this case, the linear sensor is preferably required to output photoelectric conversion values obtained by pixels at the same position of the respective linear arrays. However, it is not known whether conventional CMOS linear sensors are provided with the above-described function.

Moreover, the conventional CMOS sensors output analog signals, and the advantages of CMOS circuits in ease of integration with surrounding digital circuits have not been fully applied. A part of CMOS linear sensors designated for special use (factory automation, security cameras or the like) have AD converters built in. However, such CMOS linear sensors have, as scanners of printers/MFP designed for offices, various/special shapes that are difficult to handle, excessive performance, and high costs.

SUMMARY OF THE INVENTION

The present invention aims at providing a photoelectric conversion device of a CMOS linear sensor, that has lower cost than conventional devices, can operate by a global shutter, can effectively operate even in the case of including a plurality of linear arrays, and can be easily integrated with peripheral circuits.

According to an aspect of the present invention, a photoelectric conversion device includes a pixel array provided with a linear array or a plurality of linear arrays, each including a plurality of pixels that are linearly arranged; and a plurality of memory circuits, each including a plurality of memory cells.

The plurality of pixels in the pixel array are connected one-to-one to the plurality of memory cells of the plurality of memory circuits.

Each of the plurality of pixels alternately outputs a photoelectric conversion value indicating an electric voltage generated in accordance with a light amount of an incident light entering the pixel, and a reset value indicating a reference charge of the pixel, to the memory cell corresponding to the pixel.

Each of the plurality of memory cells temporarily stores the photoelectric conversion value and the reset value output from the pixel corresponding to the memory cell.

Each of the plurality of memory circuits outputs the photoelectric conversion values and the reset values stored in corresponding memory cells of the plurality of memory cells of the memory circuit, in an order determined in advance.

Advantageous Effect of Invention

According to an aspect of the present invention, a photoelectric conversion device of a CMOS linear sensor, that has lower cost than conventional devices, can operate by a global shutter, can effectively operate even in the case of including a plurality of linear arrays, and can be easily integrated with peripheral circuits, can be provided.

BRIEF DESCRIPTION OF THE DRAWINGS

Other objects and further features of embodiments will become apparent from the following detailed description when read in conjunction with the accompanying drawings, in which.

DETAILED DESCRIPTION OF THE PREFERRED EMBODIMENTS

In the following, with reference to drawings, a photoelectric conversion device according to an embodiment will be described.

First Embodiment

Figure 1:
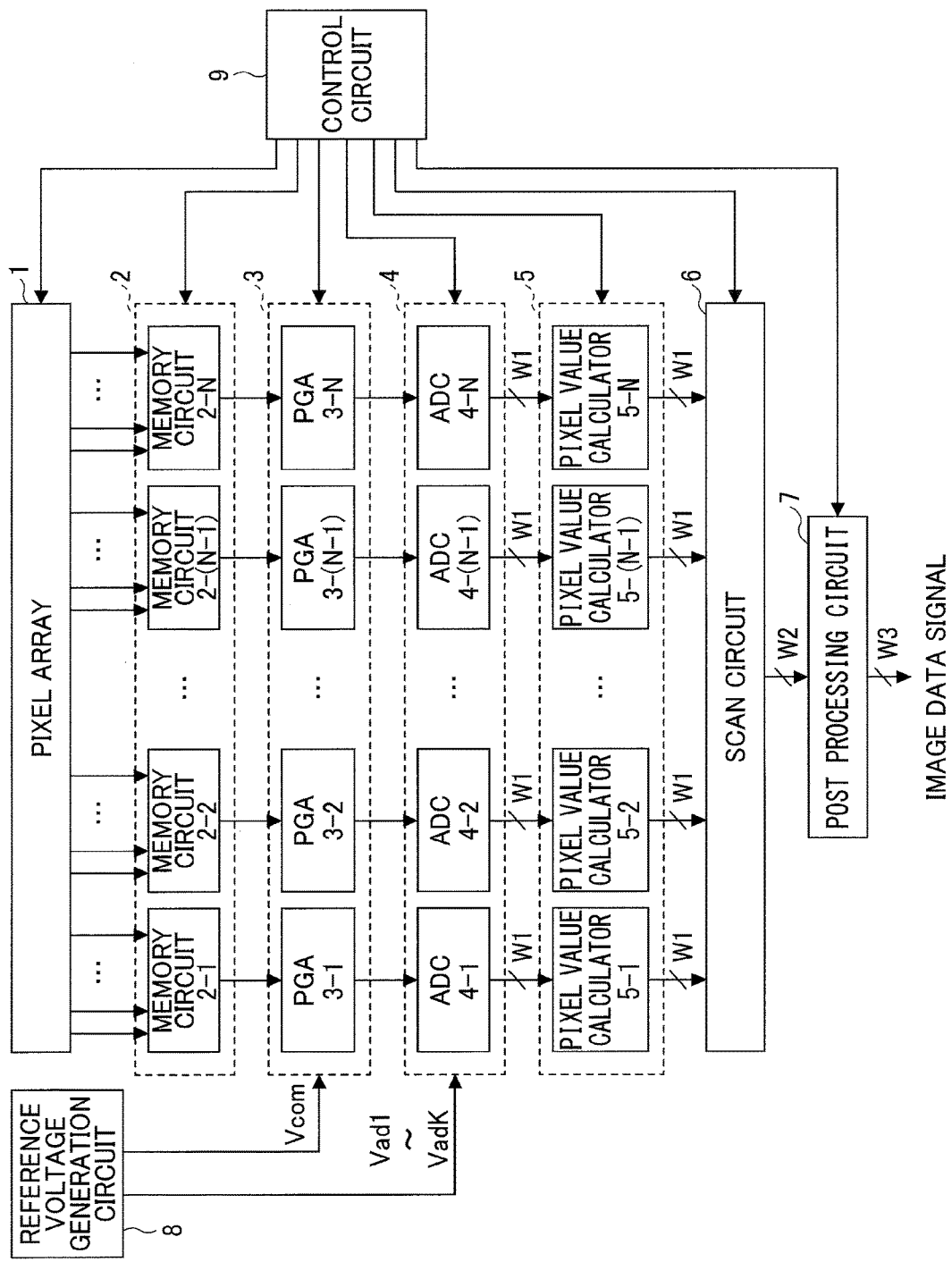
FIG. 1 is a block diagram depicting an example of a configuration of a photoelectric conversion device according to a first embodiment.

FIG. 1 is a block diagram depicting an example of a configuration of a photoelectric conversion device according to a first embodiment. The photoelectric conversion device, illustrated in FIG. 1, includes a pixel array 1, memory circuits 2-1 to 2-N, programmable gain amplifiers (PGA) 3-1 to 3-N, analog/digital converters (ADC) 4-1 to 4-N, pixel value calculators 5-1 to 5-N, a scan circuit 6, a post processing circuit 7, a reference voltage generation circuit 8, and a control circuit 9. The photoelectric conversion device illustrated in FIG. 1 is a CMOS linear sensor, and used, for example, in a scanner of a printer/MFP designed for offices.

The pixel array 1 includes a linear array or a plurality of linear arrays, each including a plurality of pixels that are linearly arranged. Each of the plurality of pixels output alternately a photoelectric conversion value indicating an electric voltage generated in accordance with a light amount of an incident light entering the pixel, and a reset value indicating a reference charge in the pixel. The photoelectric conversion value and the reset value are analog values. In the case where the pixel array 1 is provided with a plurality of linear arrays, each of the plurality of linear arrays may correspond to a color of a plurality of colors, which are different from each other.

Each of the memory circuits 2-1 to 2-N includes a plurality of memory cells. A plurality of pixels in the pixel array 1 are coupled one-to-one to the plurality of memory cells in the memory circuits 2-1 to 2-N. In the case where the pixel array 1 includes a plurality of linear arrays, each of the memory circuits 2-1 to 2-N, for each of the plurality of linear arrays, may be coupled to at least one pixel in the corresponding linear array. Each of the plurality of pixels outputs alternately a photoelectric conversion value and a reset value to a memory cell corresponding to the pixel. Each of the plurality of memory cells temporarily stores the photoelectric conversion value and the reset value, which are analog values, output from the pixel corresponding to the memory cell. Each of the memory circuits 2-1 to 2-N outputs the photoelectric conversion values and the reset values stored in the plurality of memory cells, respectively, in the memory circuits 2-1 to 2-N, in an order that was determined in advance, to the corresponding PGA 3-1 to 3-N.

In a subsequent stage of the memory circuits 2-1 to 2-N, the PGA 3-1 to 3-N are connected, respectively. Each of the PGA 3-1 to 3-N generates a difference value between the photoelectric conversion value and the reset value for each pixel, which are output from the memory circuit connected to the PGA; and an offset value of the PGA based on a first reference voltage Vcom, and amplifies them. The difference value and the offset value, generated by the PGA, are analog values. Each of the PGA 3-1 to 3-N outputs alternately the difference value and the offset value, which were generated for each pixel and amplified, to the corresponding ADC 4-1 to 4-N. To each of the PGA 3-1 to 3-N, a gain variable by the control circuit 9 is set. To the PGA 3-1 to 3-N, for example, gains that are variable according to colors of the linear arrays containing the pixels that output photoelectric conversion values and reset values may be set.

In a subsequent stage of the PGA 3-1 to 3-N, the ADC 4-1 to 4-N are connected, respectively. Each of the ADC 4-1 to 4-N converts the difference value and the offset value, output from the PGA connected to the ADC, from analog values to digital values, based on a plurality of second reference voltages Vad1 to VadK, that are different from each other. Each of the ADC 4-1 to 4-N outputs the difference value and the offset value, that are digital values having data width W1, to the corresponding pixel value calculators 5-1 to 5-N.

In a subsequent stage of the ADC 4-1 to 4-N, the pixel value calculators 5-1 to 5-N are connected, respectively. Each of the pixel value calculators 5-1 to 5-N, based on the difference value and the offset value output from the ADC connected to the pixel value calculator, calculates a pixel value for each pixel, stores the pixel value temporarily, and outputs the pixel value to the scan circuit 6 under the control of the control circuit 9.

The memory circuits 2-1 to 2-N configure a first circuit group (memory circuit 2) arranged along a longitudinal direction of the linear array. The PGA 3-1 to 3-N configure a second circuit group (PGA 3) arranged along a longitudinal direction of the linear array. The ADC 4-1 to 4-N configure a third circuit group (ADC 4) arranged along a longitudinal direction of the linear array. The pixel value calculators 5-1 to 5-N configure a fourth circuit group (pixel value calculator 5) arranged along a longitudinal direction of the linear array. The first to fourth circuit groups 2 to 5 are arranged so as to be moved away from the pixel array 1, in this order, in a direction orthogonal to the longitudinal direction of the linear array.

The scan circuit 6 temporarily stores pixel values of the plurality of pixels output from the respective pixel value calculators 5-1 to 5-N, and outputs at least a part of the pixel values of the plurality of pixels to the post processing circuit 7 in a specified order. The scan circuit 6 outputs the pixel values to the post processing circuit 7, as digital values having data widths W2.

The post processing circuit 7 performs a prescribed digital data processing for the pixel values output from the scan circuit 6, and outputs image data signals having digital values with data widths of W3. Respective circuits in stages subsequent to the memory circuits 2-1 to 2-N configure N individual processing systems. The processing systems may have different characteristics (gain or the like) from each other. Thus, the post processing circuit 7 may correct differences in pixel values occurring due to the different characteristics in the processing systems. Moreover, the post processing circuit 7 may multiply pixel values by coefficients of predetermined values, so as to transmit the pixel values without saturation, depending on the data width W3 of the image data signals to be output. Moreover, the post processing circuit 7 may perform a serialization process by time-division multiplexing, in order to make the data width W3 of the image data signals to be output, smaller than the data width W2 of the pixel values that are input.

The reference voltage generation circuit 8 is a reference voltage source that generates a first reference voltage Vcom and a plurality of second reference voltages Vad1 to VadK, based on a common third reference voltage. The reference voltage generation circuit 8 sends the first reference voltage Vcom to the PGA 3-1 to 3-N, and sends the plurality of second reference voltages Vad1 to Vadk to the ADC 4-1 to 4-N.

The control circuit 9 includes at least one timing generator that generates timing signals for the pixel array 1, the memory circuits 2-1 to 2-N, the PGA 3-1 to 3-N, the ADC 4-1 to 4-N, the pixel value calculators 5-1 to 5-N, the scan circuit 6 and the post processing circuit 7.

Next, configurations and operations of the components of the photoelectric conversion device, illustrated in FIG. 1, will be described.

First, the configuration and operation of the pixel array 1 will be described.

Figure 2:
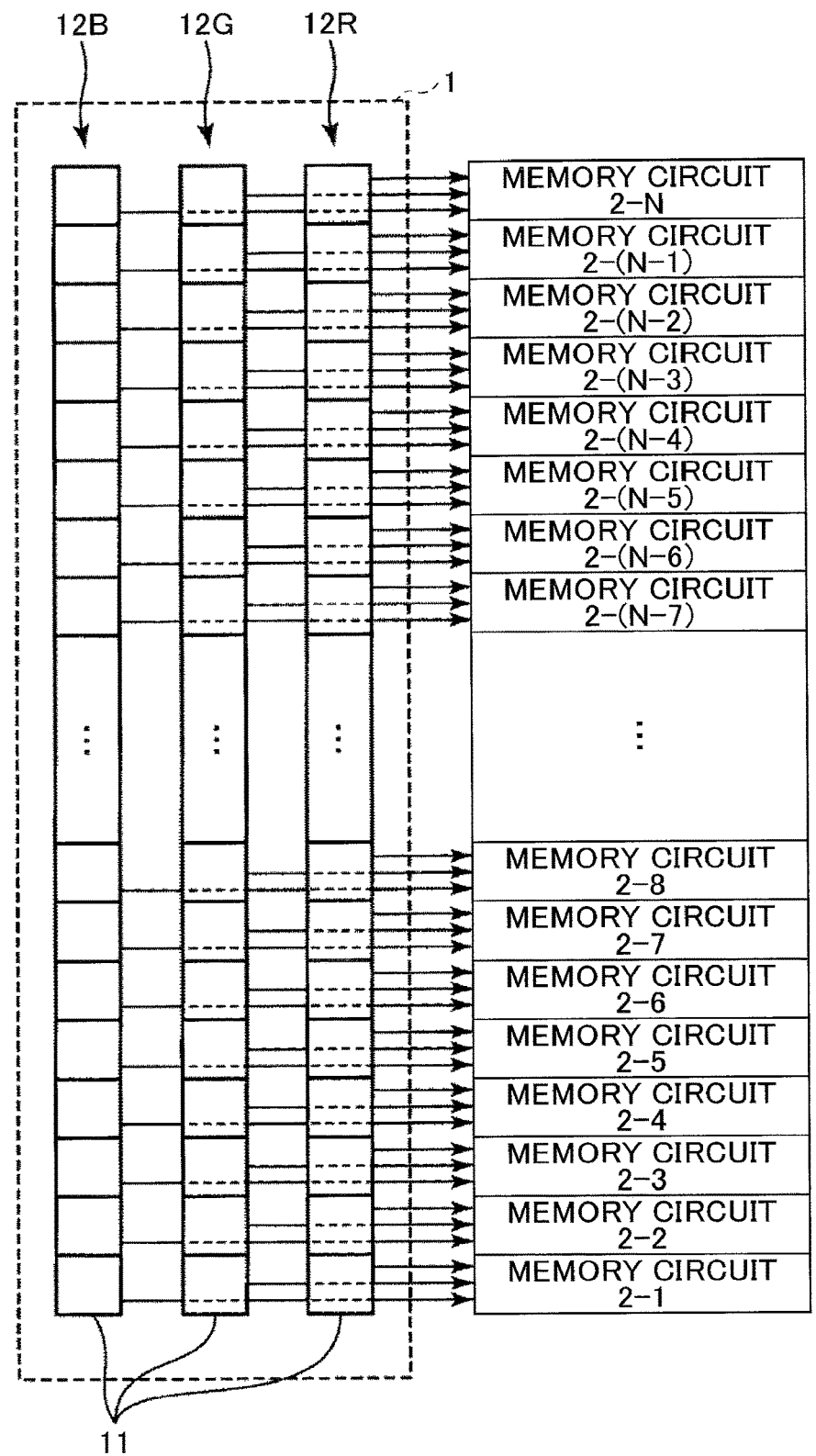
FIG. 2 is a diagram schematically depicting an example of a configuration of a connection between a pixel array and a memory circuit, illustrated in FIG. 1.

FIG. 2 is a diagram schematically depicting an example of a configuration of a connection between the pixel array 1 and the memory circuits 2-1 to 2-N, illustrated in FIG. 1. The pixel array 1 includes three linear arrays, each including a plurality of pixels 11, that are linearly arranged, i.e. a linear array of B pixels 12B, a linear array of G pixels 12G, and a linear array of R pixels 12R. In the case where the pixel array 1 includes a plurality of linear arrays, the plurality of linear arrays may correspond to a plurality of colors that are different from each other (e.g. R, G, and B). Each of the memory circuits 2-1 to 2-N has a width of one pixel 11. For each of the linear arrays 12B, 12G, and 12R, each of the memory circuits 2-1 to 2-N is connected to one pixel 11 of the linear array. For the linear arrays of different colors, for example, different color filters are arranged.

Figure 3:
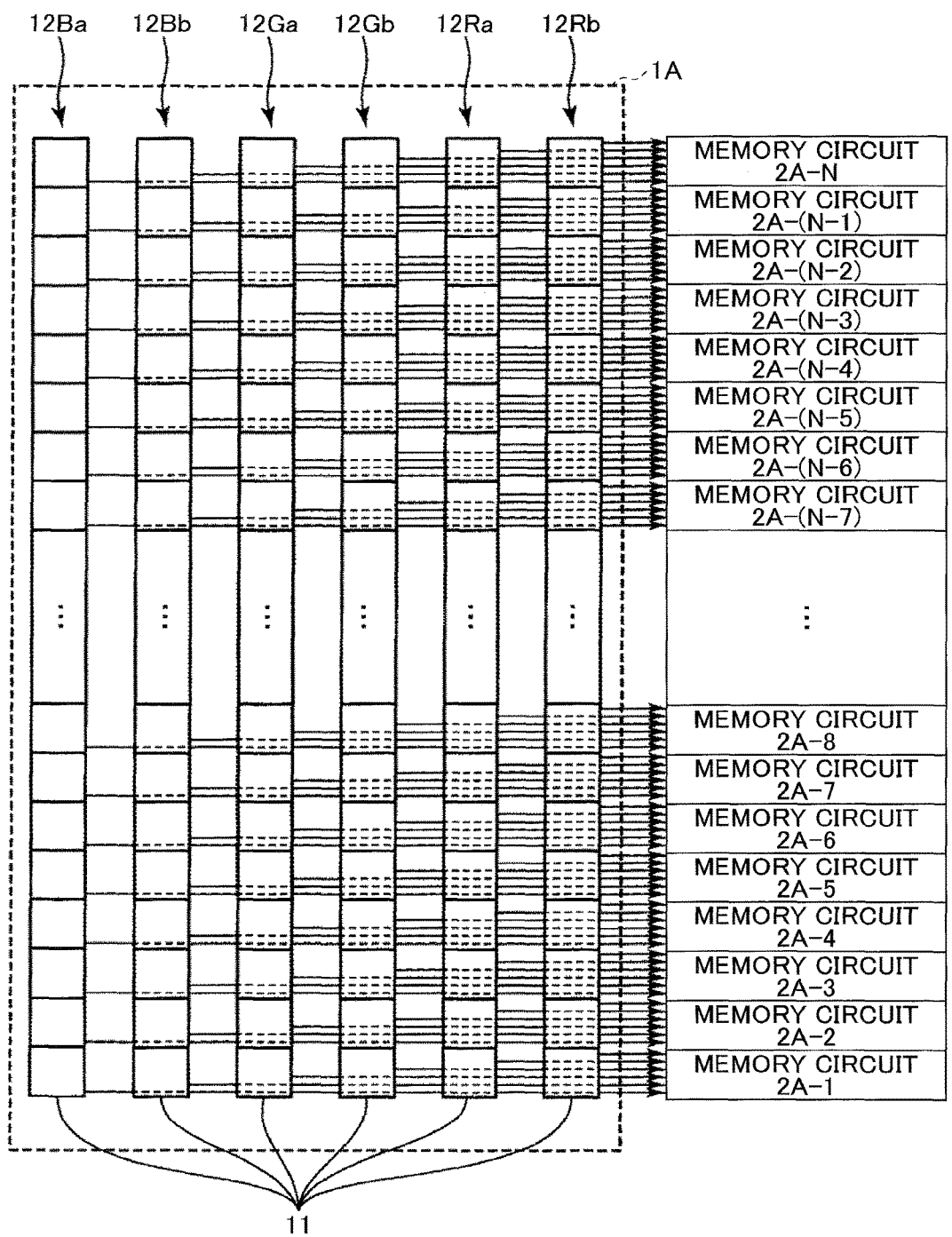
FIG. 3 is a diagram schematically depicting an example of a configuration of a connection between a pixel array and a memory circuit of a photoelectric conversion device according to a first variation of the first embodiment.

FIG. 3 is a diagram schematically depicting an example of a configuration of a connection between a pixel array Lk and memory circuits 2A-1 to 2A-N of a photoelectric conversion device according to a first variation of the first embodiment. The pixel array 1A includes six linear arrays, each including a plurality of pixels 11, that are linearly arranged, i.e. linear arrays of B pixels 12Ba, 12Bb, linear arrays of G pixels 12Ga, 12Gb, and linear arrays of R pixels 12Ra, 12Rb. In the case where the pixel array 1 includes a plurality of linear arrays, each of the plurality of linear arrays may correspond to one of the plurality of colors, or two or more linear arrays may correspond to the same color. In the pixel array 1A, six linear arrays are separated from each other. Each of the memory circuits 2A-1 to 2A-N has a width that is the same as a size of the pixel 11, and is connected to the pixel 11 of each of the linear arrays 12Ba, 12Bb, 12Ga, 12Gb, 12Ra, and 12Rb.

Figure 4:
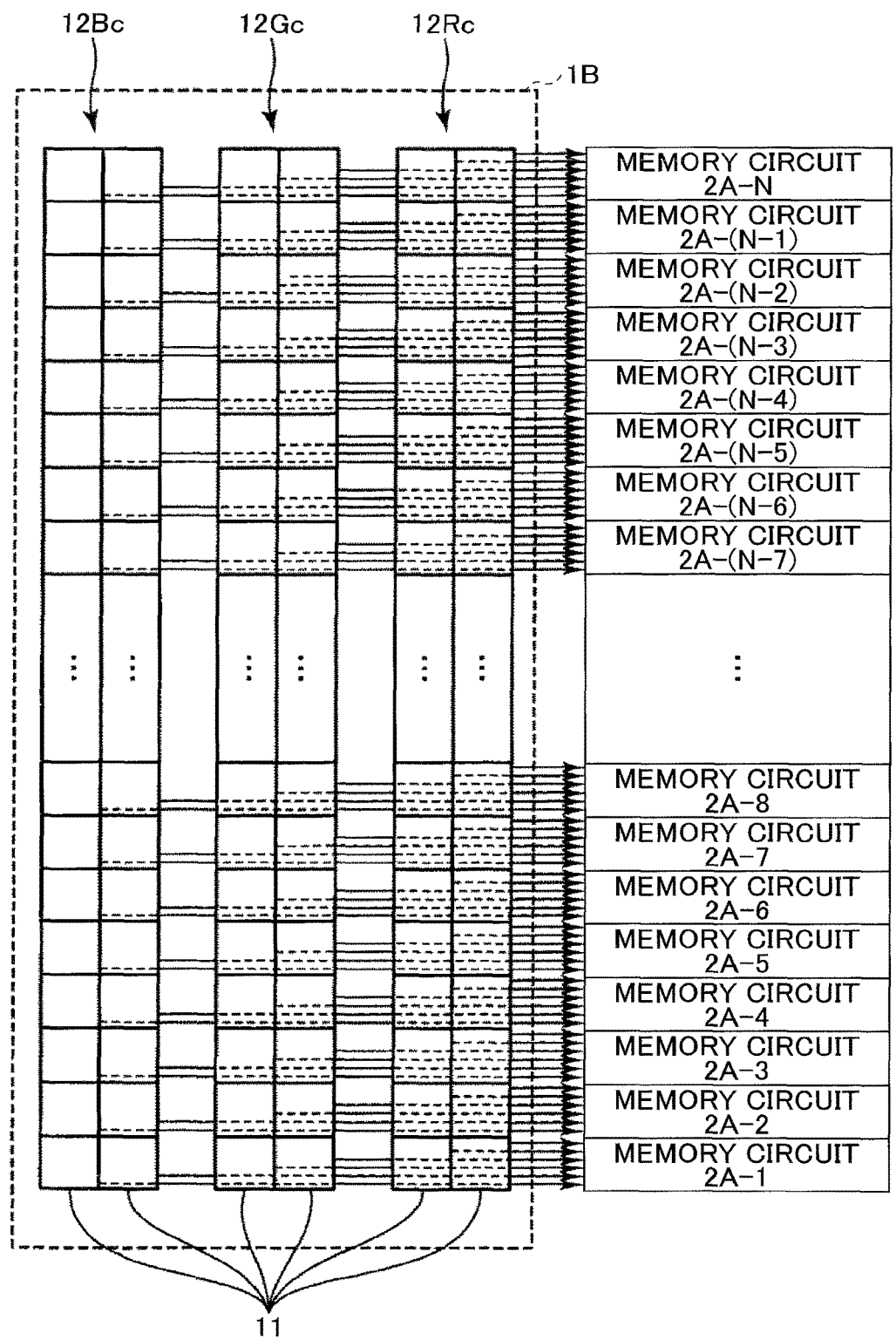
FIG. 4 is a diagram schematically depicting an example of a configuration of a connection between a pixel array and a memory circuit of a photoelectric conversion device according to a second variation of the first embodiment.

FIG. 4 is a diagram schematically depicting an example of a configuration of a connection between a pixel array 1B and memory circuits 2A-1 to 2A-N of a photoelectric conversion device according to a second variation of the first embodiment. The pixel array 1B is provided with a linear array of B pixels 12Bc, a linear array of G pixels 12Gc, and a linear array of R pixels 12Rc, each having two linear arrays contacting with each other, including a plurality of pixels 11 that are linearly arranged. The linear arrays 12Bc, 12Gc, and 12 Rc correspond to a state in which among the linear arrays 12Ba, 12Bb, 12Ga, 12Gb, 12Ra, and 12Rb, illustrated in FIG. 3, two linear arrays corresponding to the same color contact with each other. Each of the memory circuits 2A-1 to 2A-N is connected to two pixels 11 of each of the linear arrays 12Bc, 12Gc, 12Rc, i.e. two pixels 11 adjacent to each other in a direction orthogonal to a longitudinal direction of each of the linear arrays.

Figure 5:
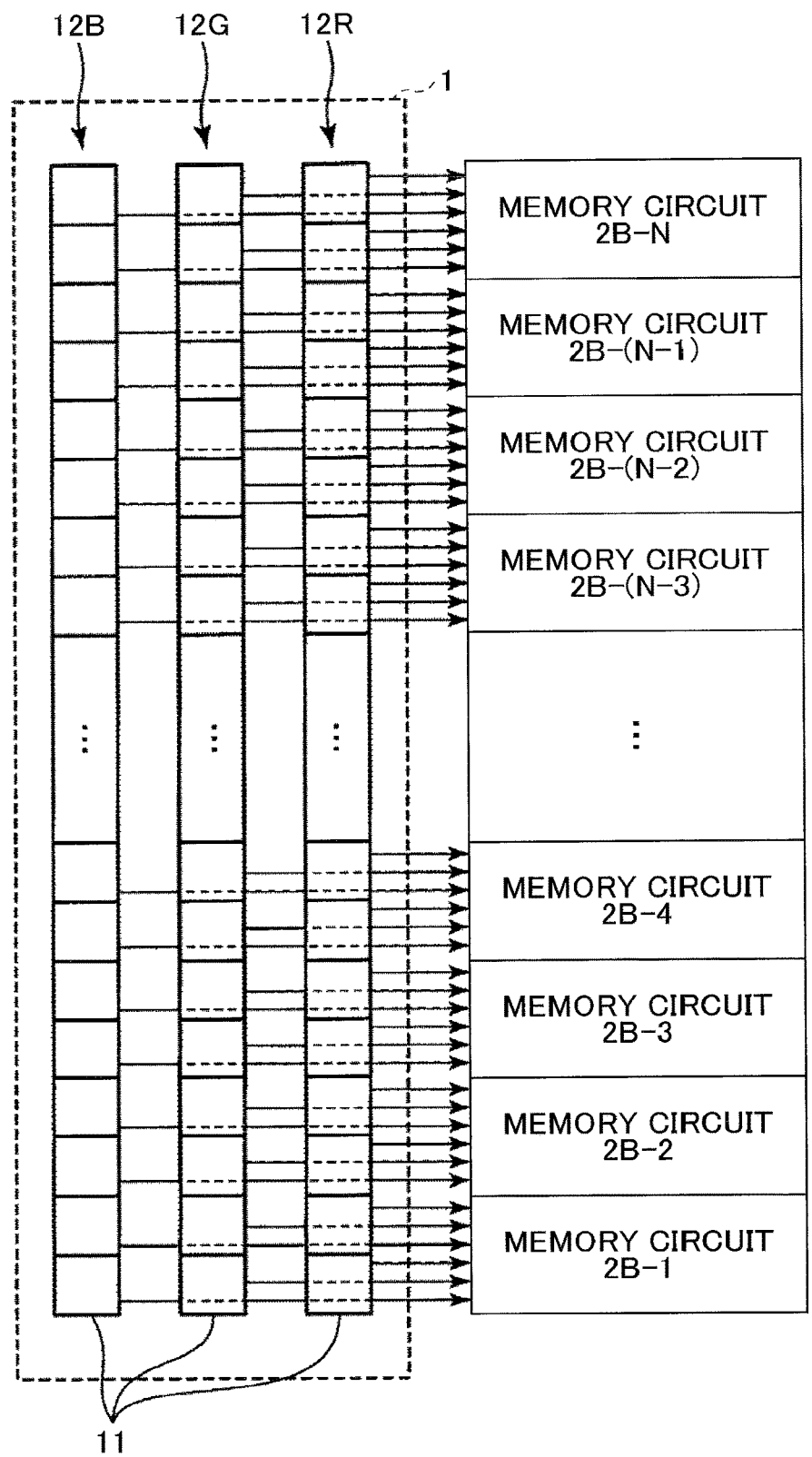
FIG. 5 is a diagram schematically depicting an example of a configuration of a connection between a pixel array and a memory circuit of a photoelectric conversion device according to a third variation of the first embodiment.

FIG. 5 is a diagram schematically depicting an example of a configuration of a connection between a pixel array 1 and memory circuits 2B-1 to 2B-N of a photoelectric conversion device according to a third variation of the first embodiment. The pixel array 1 has the same configuration as the pixel array 1 illustrated in FIG. 2. Each of the memory circuits 2B-1 to 2B-N has a width that is the same as a size of two pixels 11, and is connected to two pixels 11 of each of the linear arrays 12B, 12G, and 12R, i.e. two pixels 11 adjacent to each other in the longitudinal direction of each of the linear arrays.

As illustrated in FIGS. 2 to 5, each of the memory circuits 2-1 to 2-N may be connected to, for example, a plurality of pixels 11 adjacent to each other in the pixel array 1, 1A or 1B, i.e. a plurality of pixels 11 adjacent to each other in a row direction and/or a column direction of the pixel array.

Next, a configuration and an operation of the pixel 11 will be described.

Figure 6:
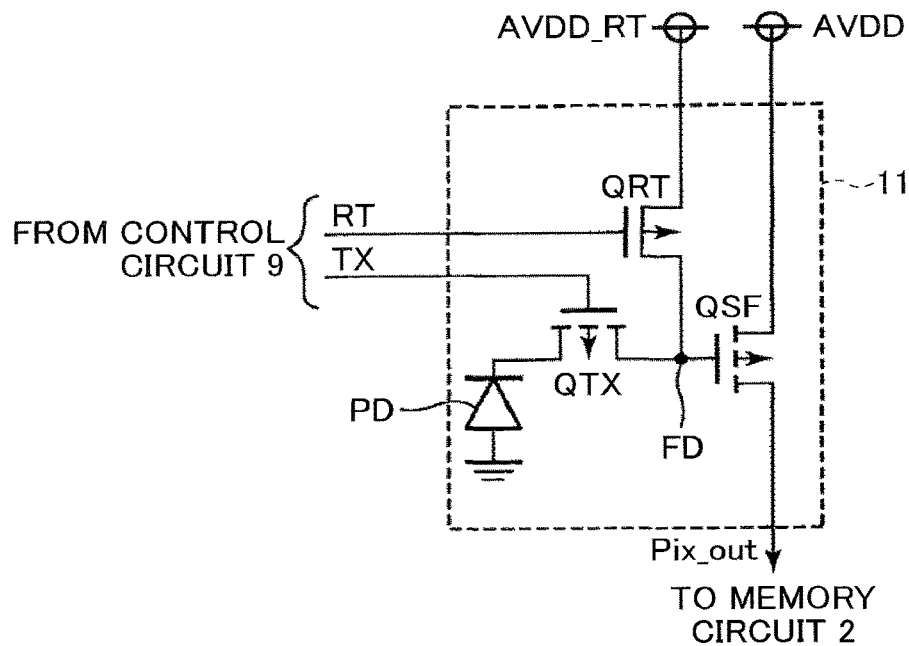
FIG. 6 is a diagram depicting an example of a configuration of a circuit of a pixel in each of the pixel arrays illustrated in FIGS. 2 to 5.

FIG. 6 is a diagram depicting an example of a configuration of a circuit of the pixel 11, illustrated in FIGS. 2 to 5. The pixel 11 includes a photodiode PD, and switching elements QTX, QRT, and QSF. To the pixel 11, a power-supply voltage AVDD, and a reset voltage AVDD_RT are applied. Moreover, from the control circuit 9, timing signals (control signals that change in a predetermined sequence) RT and TX are input to the pixel 11. The photodiode PD is a photoelectric conversion element, which generates charges in accordance with a light amount of an incident light entering the pixel 11, and retains the charges. The switching element QTX is a transfer transistor that transfers the charges in the photodiode PD to a node of a floating diffusion FD when the timing signal TX is high level. The switching element QRT is a reset transistor that resets a potential of the node FD to the reset voltage AVDD_RT, when the timing signal RT is high level. The switching element QSF is an amplification transistor that reduces an impedance of the node FD with respect to an output terminal of the pixel 11, amplifies the potential of the node FD, and outputs the potential from the output terminal of the pixel 11 as an output value Pix_out.

When a light enters the photodiode PD, charges are generated and retained in a region of the photodiode PD. In the case where the timing signal TX is low level, when the timing signal RT changes to high level, the potential of the node FD is reset to the reset voltage AVDD_RT. The potential of the node FD, after the timing signal RT is reset from high level to low level, is a reset value indicating a reference charge of the pixel 11. In the case where the timing signal is low level, when the timing signal TX is changed to high level, charges are transferred from the photodiode PD to the node FD, and at the node FD a potential in accordance with a light amount of an incident light is generated. The potential of the node FD, after all the charges of the photodiode PD are transferred to the node FD, and after the timing signal TX is reset from high level to low level, is a photoelectric conversion value indicating a voltage generated in accordance with the light amount of the incident light entering the pixel 11. In the pixel, illustrated in FIG. 6, the potential of the node FD is amplified by the switching element QSF, and output from the pixel 11 as an output value Pix_out. The pixel 11 outputs alternately the photoelectric conversion value and the reset value as the output value Pix_out under the control of the control circuit 9.

Figure 7:
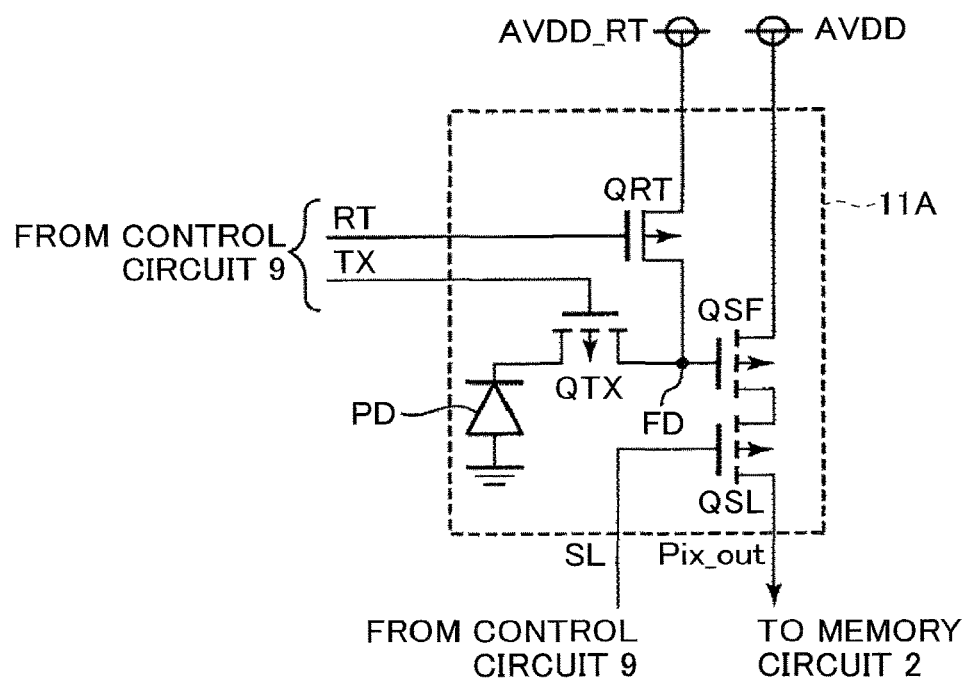
FIG. 7 is a diagram depicting an example of a configuration of a circuit of a pixel in a pixel array of a photoelectric conversion device according to a fourth variation of the first embodiment.

FIG. 7 is a diagram depicting an example of a configuration of a circuit of a pixel 11A in a photoelectric conversion device according to a fourth variation of the first embodiment. The pixel 11A, illustrated in FIG. 7, further includes a switching element QSL, in addition to the components of the pixel 11, illustrated in FIG. 6. To the pixel 11A, a timing signal SL is input from the control circuit 9. The switching element QSL is a selection transistor that connects the switching element QSF to the output terminal of the pixel 11A, when the timing signal SL is high level. In the pixel 11A, illustrated in FIG. 7, the potential of the node FD is output from the pixel 11A as an output value Pix_out, only when the timing signal SL is high level.

Next, a configuration and an operation of the memory circuit 2-1 to 2-N will be described.

Figure 8:
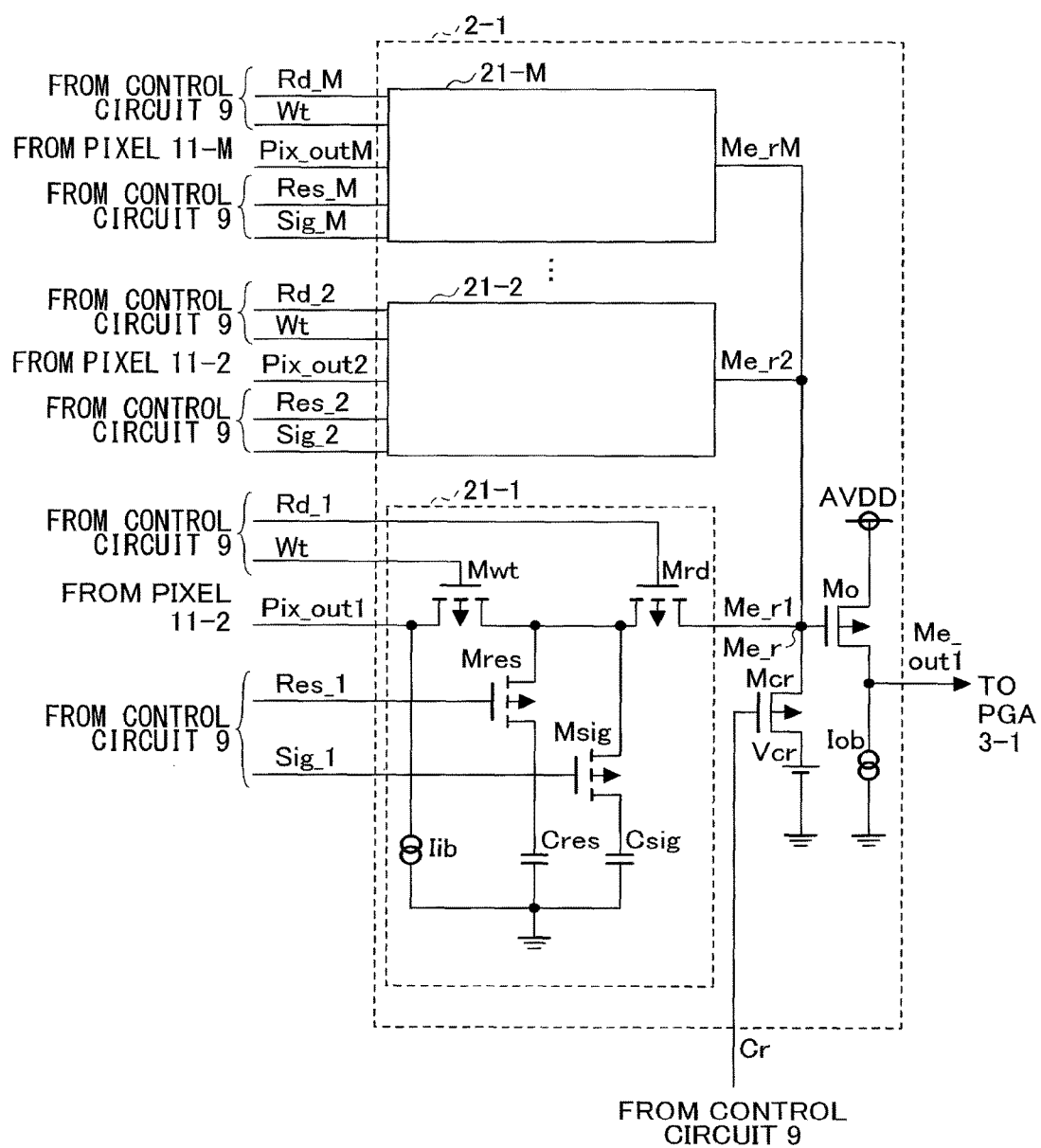
FIG. 8 is a diagram depicting an example of a configuration of a circuit of the memory circuit illustrated in FIG. 2.

FIG. 8 is a diagram depicting an example of a configuration of a circuit of the memory circuit 2-1, illustrated in FIG. 2. The memory circuit 2-1 includes a plurality of memory cells 21-1 to 21-M. The memory cells 21-1 to 21-M are connected one-to-one to a plurality of pixels 11-1 to 11-M in the pixel array 1. The memory cells 21-1 to 21-M are connected to a plurality of pixels 11 adjacent to each other in the pixel array 1, as illustrated in FIGS. 2 to 5.

The memory cell 21-1 temporarily stores a photoelectric conversion value and a reset value output as an output value Pix_out1 from the pixel 11-1 corresponding to the memory cell 21-1. The memory cell 21-1 includes switching elements Mwt, Mrd, Mres, and Msig, capacitors Cres, and Csig, and an electric current source Iib. To the memory cell 21-1, the photoelectric conversion value and the reset value, which were output as the output value Pix_out1 from the pixel 11-1 corresponding to the memory cell 21-1 are input alternately. To the memory cell 21-1, timing signals W1, Rd_1, Res_1, and Sig_1 are input from the control circuit 9. The capacitor Cres is an analog memory for storing the reset value, and the capacitor Csig is an analog memory for storing the photoelectric conversion value. To an input terminal of the memory cell 21-1 (a terminal, to which the output value Pix_out1 of the pixel 11-1 is input), the electric current source Iib is connected, and a bias current is supplied. Between the input terminal and the output terminal of the memory cell 21-1, the switching elements Mwt and Mrd are connected in sequence. The switching element Mwt permits writing into the memory cell 21-1, when the timing signal Wt is high level. The switching element Mrd permits reading out from the memory cell 21-1, when the timing signal Rd_1 is high level. A node between the switching elements Mwt and Mrd is connected to the capacitor Cres via the switching element Mres, and furthermore connected to the capacitor Csig via the switching element Msig. The switching element Mres permits writing into and reading out from the capacitor Cres, when the timing signal Res_1 is high level. The switching element Msig permits writing into and reading out from the capacitor Csig, when the timing signal Sig_1 is high level. The photoelectric conversion value and the reset value alternately read out from the capacitors Cres, and Csig are output from the memory cell 21-1 as an output values Me_r1.

Other memory cells 21-2 to 21-M are also configured in the same way as the memory cell 21-1.

The memory circuit 2-1 outputs the photoelectric conversion values and reset values, stored in the respective memory cells 21-1 to 21-M, in an order that is preliminarily determined. The memory circuit 2-1 further includes switching elements Mcr, and Mo, an electric current source Iob, and an electric voltage source Vcr. To the memory cell 21-1, a timing signal Cr is input from the control circuit 9. Output terminals of the memory cells 21-1 to 21-M are connected to a common node Me_r. The node Me_r is connected to the electric voltage source Vcr via the switching element Mcr. The switching element Mcr initializes the electric voltage of the node Me_r to an initialized electric potential of the electric voltage source Vcr, when the timing signal Cr is high level. The node Me_r is further connected to a gate of the switching element Mo. The switching element Mo is an output transistor that is biased by a bias current from the electric current source Iob. The electric voltage of the node Me_r is output via the switching element Mo as an output value Me_out1.

Figure 9:
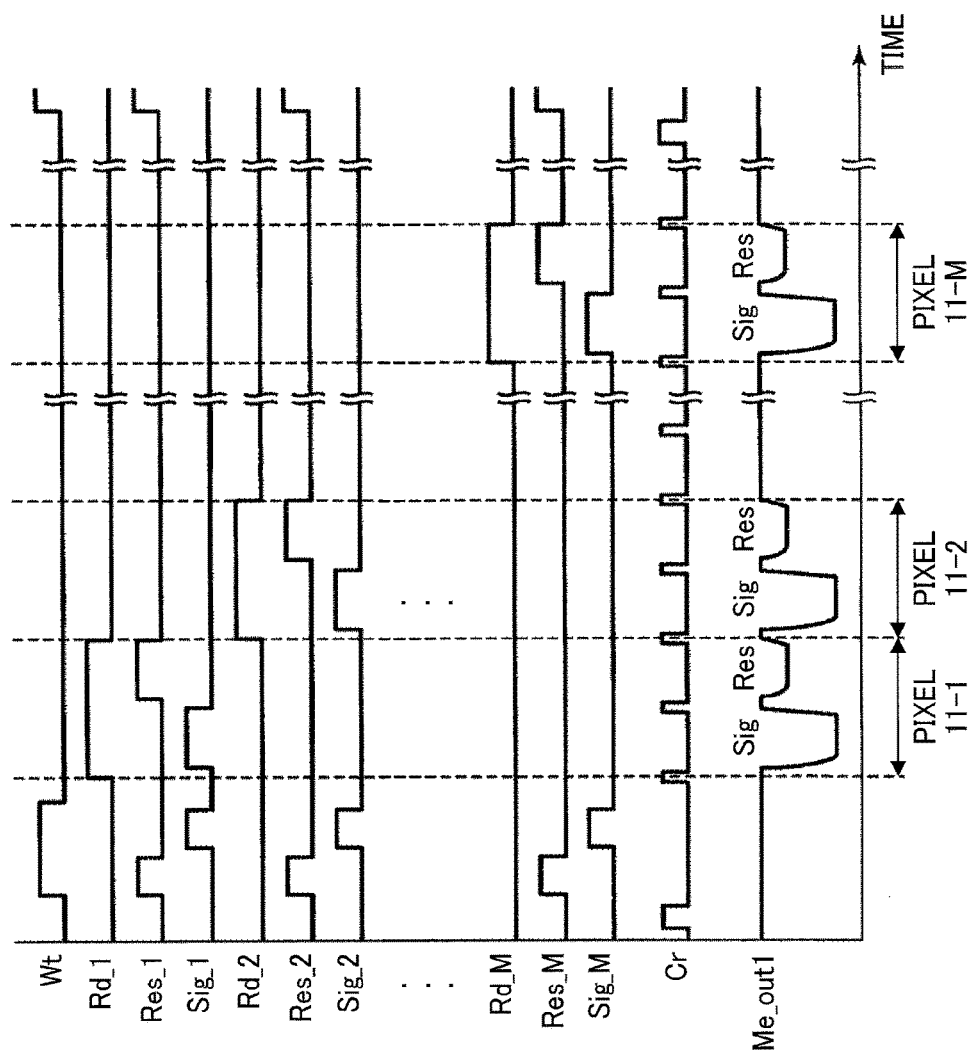
FIG. 9 is a diagram depicting an example of a timing chart for describing an operation of the memory circuit illustrated in FIG. 8.

FIG. 9 is a diagram depicting an example of a timing chart for describing an operation of the memory circuit 2-1, illustrated in FIG. 8. When the timing signal Wt is high level, writing of output values Pix_out1 to Pix_outM of the pixels 11-1 to 11-M into the memory cells 21-1 to 21-M corresponding to the pixels 11-1 to 11-M is permitted. When the output values Pix_out1 to Pix_outM of the pixels 11-1 to 11-M are reset values, by setting the timing signals Res_1 to Res_M to high level, the reset values are written into the capacitors Cres of the memory cells 21-1 to 21-M. When the output values Pix_out1 to Pix_outM of the pixels 11-1 to 11-M are photoelectric conversion values, by setting the timing signals Sig_1 to Sig_M to high level, the photoelectric conversion values are written into the capacitors Csig of the memory cells 21-1 to 21-M. Moreover, when the timing signals Rd_1 to Rd_M are high level, reading out of the photoelectric conversion values and reset values from the memory cells 21-1 to 21-M is permitted. By setting the timing signals Sig_1 to Sig_M to high level, the photoelectric conversion values are read out from the capacitors Csig of the memory cells 21-1 to 21-M. By setting the timing signals Res_1 to Res_M to high level, the reset values are read out from the capacitors Cres of the memory cells 21-1 to 21-M. The photoelectric conversion values and the reset values, which were read out, are output from the memory circuit 2-1 as output values Me_out1. Note that, in order to reduce an influence of parasitic capacitance on the node Me_r, the electric voltage of the node Me_r is initialized by setting the the timing signal Cr to high level, when both the timing signals Sig_1 to Sig_M, and Res_1 to Res_M are low level.

Other memory circuits 2-2 to 2-N are also configured in the same way as the memory circuit 2-1.

According to the memory circuits 2-1 to 2-N, illustrated in FIG. 2, pixel values of a plurality of pixels, which are adjacent to each other on the pixel array 1 and have different colors from each other, are processed in a memory circuit, and thereby performance degradation can be controlled, throughput of the processing system can be effectively used, and the area of circuits can be reduced.

Next, a configuration and an operation of the PGA 3-1 to 3-N will be described.

Figure 10:
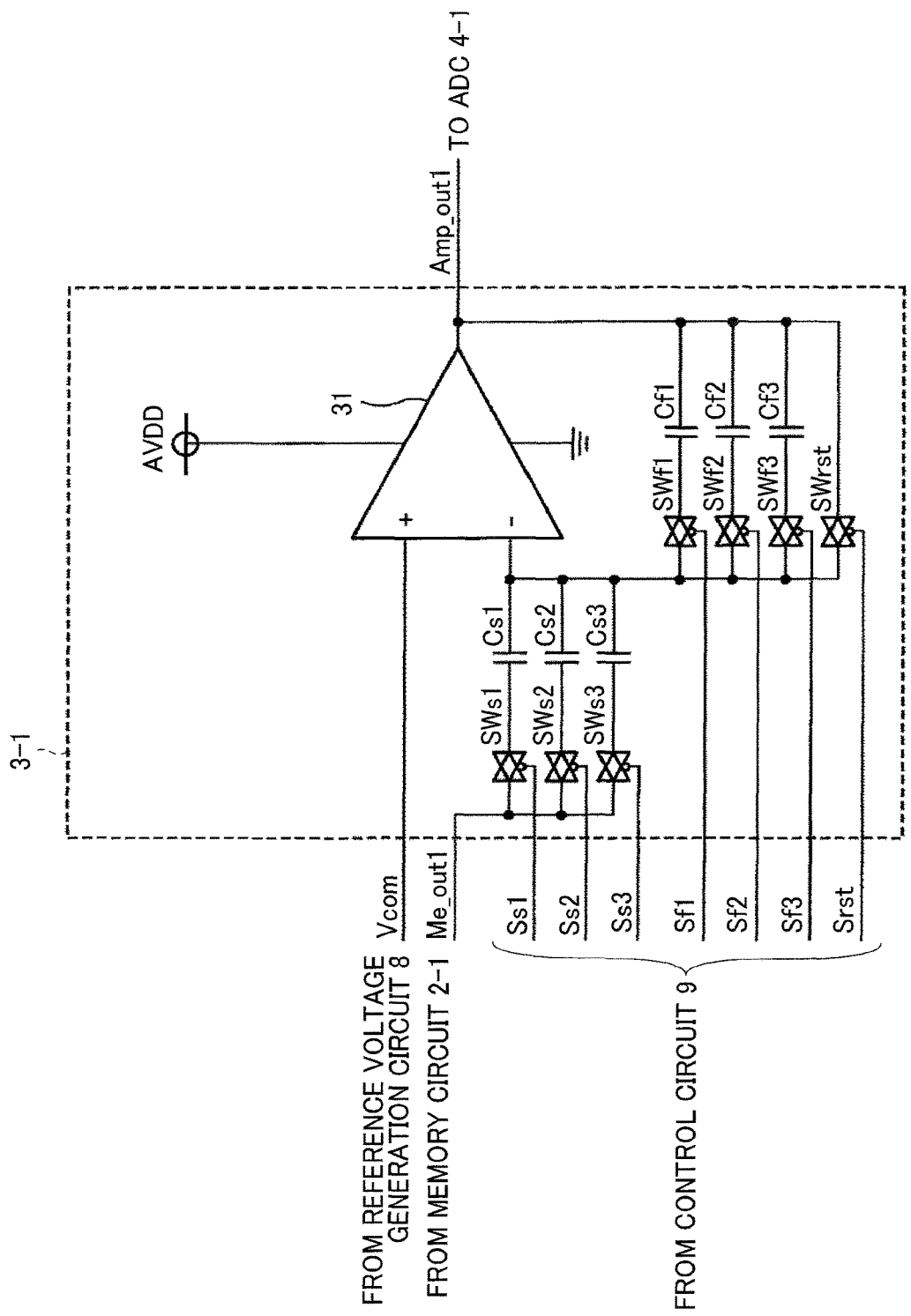
FIG. 10 is a diagram depicting an example of a configuration of a circuit of a programmable gain amplifier (PGA) illustrated in FIG. 2.

FIG. 10 is a diagram depicting an example of a configuration of a circuit of the programmable gain amplifier (PGA) 3-1, illustrated in FIG. 2. The PGA 3-1 includes an operation amplifier 31, switching elements SWs1 to SWs3, SWf1 to SWf3, and SWrst, and capacitors Cs1 to Cs3, and Cf1 to Cf3. To the PGA 3-1, the output value Me_out1 from the memory circuit 2-1 is input, and reference voltage Vcom from the reference voltage generation circuit 8 is input. Furthermore, to the PGA 3-1, timing signals Ss1 to Ss3 and Sf1 to Sf3 are input from the control circuit 9. The switching elements SWs1 to SWs3, SWf1 to SWf3, and SWrst are turned to ON when the corresponding timing signals Ss1 to Ss3, and Sf1 to Sf3 are high level, and the switching elements are turned to OFF when the timing signals are low level. The switching elements SWs1 to SWs3 select a combination of the capacitors Cs1 to Cs3 under the control of the control circuit 9, and thereby a capacitance of the operation amplifier 31 on the input side is set. The switching elements SWf1 to SWf3 select a combination of the capacitors Cf1 to Cf3 under the control of the control circuit 9, and thereby a capacitance of the operation amplifier 31 on the return side is set. The switching element SWrst resets the capacitance of the capacitors Cf1 to Cf3. In the PGA 3-1, illustrated in FIG. 10, according to a ratio of a sum of the capacitance on the input side selected by the switching elements SWs1 to SWs3 to a sum of the capacitance on the return side selected by the switching elements SWf1 to SWf3, a gain of the PGA 3-1 (Cs/Cf) is determined. The switching elements SWf1 to SWf3 are controlled so that the gain is determined, and the switching elements SWs1 to SWs3 are controlled so that unnecessary variation in the input signal is removed in addition to determining the gain. The switching element SWrst defines an initial state of the capacitances on the input side and the return side. The reference voltage Vcom is used for defining an operation potential of the PGA 3-1. The PGA 3-1 amplifies a difference value between the photoelectric conversion value and the reset value for each pixel output from the memory circuit 2-1 connected to the PGA 3-1, amplifies an offset value of the PGA 3-1 based on the reference voltage Vcom, and alternately outputs the difference value and the offset value as an output value Amp_out1.

Figure 11:
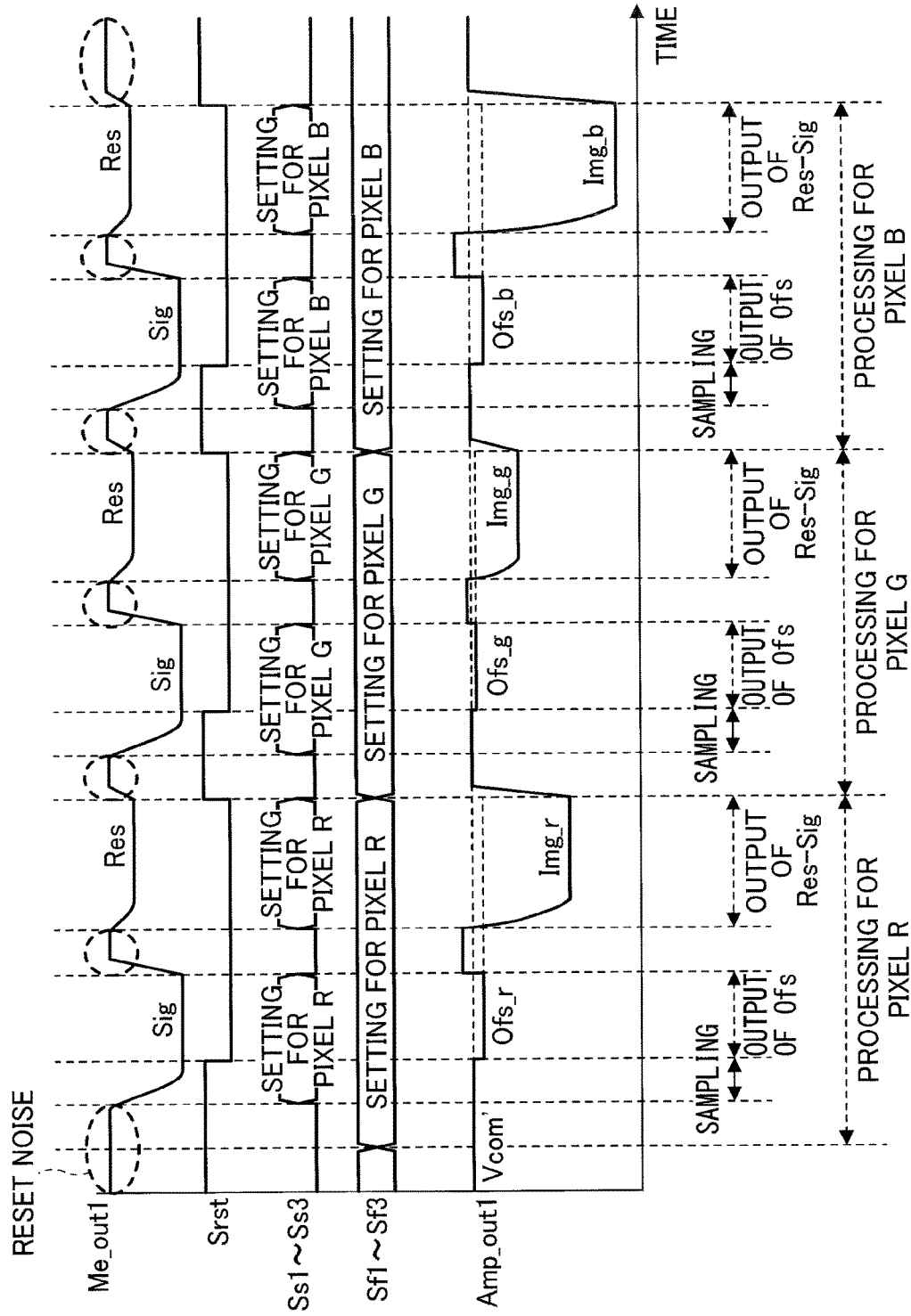
FIG. 11 is a diagram depicting an example of a timing chart for describing an operation of the programmable gain amplifier (PGA) illustrated in FIG. 10.

FIG. 11 is a diagram depicting an example of a timing chart for describing an operation of the programmable gain amplifier (PGA) illustrated in FIG. 10. FIG. 11 illustrates a case where the pixel array 1 is configured as illustrated in FIG. 2, and signals (photoelectric conversion value and reset value) of three pixels 11 (R pixel, G pixel, and B pixel) are input to the PGA 3-1. The gains specified for the signal of R pixel, the signal for G pixel, and the signal for B pixel, are assumed to be different from each other.

First, before inputting the photoelectric conversion value Sig for the R pixel to the PGA 3-1, the timing signals Ss1 to Ss3 are set to low levels, the timing signal Srst is set to a high level, and the timing signals Sf1 to Sf3 maintain the previous states. At this time, the memory circuit 2-1 is separated from the PGA 3-1, the capacitors Cf1 to Cf3 are initialized, the PGA 3-1 outputs an electric voltage value Vcom' in which the reference voltage Vcom is overlapped with the offset of the PGA 3-1.

Next, just before inputting the photoelectric conversion value Sig for the R pixel to the PGA 3-1, the switching elements SWf1 to SWf3 are controlled so that the specified gain is set for the signal for the R pixel. Then, when the photoelectric conversion value Sig for the R pixel is input, the switching elements SWs1 to SWs3 are controlled so that the specified gain is set for the signal for the R pixel. Afterwards, when the photoelectric conversion value for the R pixel Sig is stabilized, the timing signal Srst switches from high level to low level so that the reset is released, and the PGA 3-1 outputs an offset value Ofs_r that is determined with the specified gain. The offset value Ofs_r is obtained by adding an electric voltage of the capacitors Cs1 to Cs3 and Cf1 to Cf3, in which feed through noise charges in the switching element SWrst when the reset is released, are retained, to the electric voltage value Vcom' output from the PGA 3-1 during the reset. A level of the offset value Ofs_r is irrelevant to the photoelectric conversion value Sig, and determined by the reference voltage Vcom, specifications of the operation amplifier 31 and the switching element SWrst, and the gain Cs/Cf.

Next, just before ending the period of the photoelectric conversion value Sig of the R pixel, the switching elements SWs1 to SWs3 switch from high level to low level, and the memory circuit 2-1 is separated from the PGA 3-1. A feed through noise that occurs when the switching elements SWs1 to SWs3 are turned to OFF is retained in the capacitors Cs1 to Cs3 and Cf1 to Cf3. The feed through noise is also overlapped with the output value Amp_out1 from the PGA 3-1. With reference to FIG. 11, in the waveform of the output value Amp_out1, a signal level, after the end of the period of the offset value Ofs_r, becomes greater than the level of the offset value Ofs_r. The amount of increase indicates the feed through noise. Afterwards, the switching elements SWs1 to SWs3 are controlled so that when the reset value for the R pixel Res is input, the gains specified for a signal of the R pixel are set again. At this time, an electric voltage value obtained by amplifying, with the specified gain, a difference between the photoelectric conversion value Sig and the reset value Res, is output as a difference value Img_r. Note that in the difference value Img_r, the offset value Ofs_r is also overlapped. At this time, because the feed through noise retained in the capacitors Cs1 to Cs3 and Cf1 to Cf3 is released to an input terminal of the PGA 3-1, a noise occurring when the switching elements SWs1 to SWs3 are turned OFF is cancelled. The noise occurring when the switching elements SWs1 to SWS3 are turned OFF does not affect a level of the difference value Img_r.

A mechanism of generating the difference value Img_r from the photoelectric conversion value Sig and the reset value Res will be described in more detail as follows. When the switching element SWrst is turned ON, the charges in the capacitors Cf1 to Cf3 are reset via the switching elements SWr1 to SWr3 and SWrst. At this time, because the operation amplifier 31 operates as a voltage follower for the reference voltage Vcom input to a non-inverting input terminal, an electric potential at an inverting input terminal becomes "Vcom'=Vcom+offset of the operation amplifier". Furthermore, when the switching elements SWs1 to SWs3 are turned to ON, the memory circuit 2-1 is connected, and a "Sig−Vcom'" is charged in the capacitors Cs1 to Cs3 (Sig sampling). Afterwards, when the switching element SWrst is turned to OFF, the "Sig−Vcom'" is retained in the capacitors Cs1 to Cs3. From this time, a change in an electric voltage at the input terminal of the PGA 3-1 is inverted and amplified with a ratio of Cs/Cf, and output as an offset value Ofs_r. In FIG. 11, in order to simplify the illustration, a random noise included in the output value Me_out1 from the memory circuit 2-1 is omitted, and a waveform of the output value Amp_out1 from the PGA 3-1 does not contain noise. However, practically, the retention and the amplification of an electric voltage value may be affected by random noise contained in the output value Me_out1 from the memory circuit 2-1. Next, by turning OFF the switching elements SWs1 to SWs3, the memory circuit 201 is separated, and the reset noise of the pixel 11 is blocked. The reset noise of the pixel 11, when the photoelectric conversion value Sig and the reset value Res for the same pixel are processed, has little influence on the difference value between the photoelectric conversion value Sig and the reset value Res, even if the memory circuit 2-1 is not separated, because the reset operation is performed. In contrast, because a reset noise of the pixel 11, when the reset value Res of a pixel and the photoelectric conversion value Sig of the next pixel are processed, is amplified, a circuit saturation will occur, and an anomalous operation may be generated. Next, when the memory circuit 2-1 is connected by turning the switching elements SWs1 to SWs3 to ON again, a "Sig−Res" that is a difference between the "Sig−Vcom'" retained in the capacitors Cs1 to Cs3 and a present "Sig−Vcom'" occurs. The "Sig−Res" is charged (or discharged) in the capacitors Cs1 to Cs3, and the charges flow into the capacitors Cf1 to Cf3, thus the difference value of the "Sig−" is inverted and amplified with the specified amplification factor.

Afterwards, similarly, a photoelectric conversion value Sig and the reset value Res for the G-pixel are input, and an offset value Ofs_g and a difference value Img_g for the G-pixel are output. Furthermore, similarly, a photoelectric conversion value Sig and the reset value Res for the B-pixel are input, and an offset value Ofs_b and a difference value Img_b for the B-pixel are output.

Other PGA 3-2 to 3-N are also configured in the same way as the PGA 3-1.

According to the operation of the PGA 3-1 to 3-N, described with reference to FIG. 11, by changing the gain for each color, an influence from the difference in the light emission spectrum of the light source can be decreased, and thereby the performance degradation can be controlled.

Figure 12:
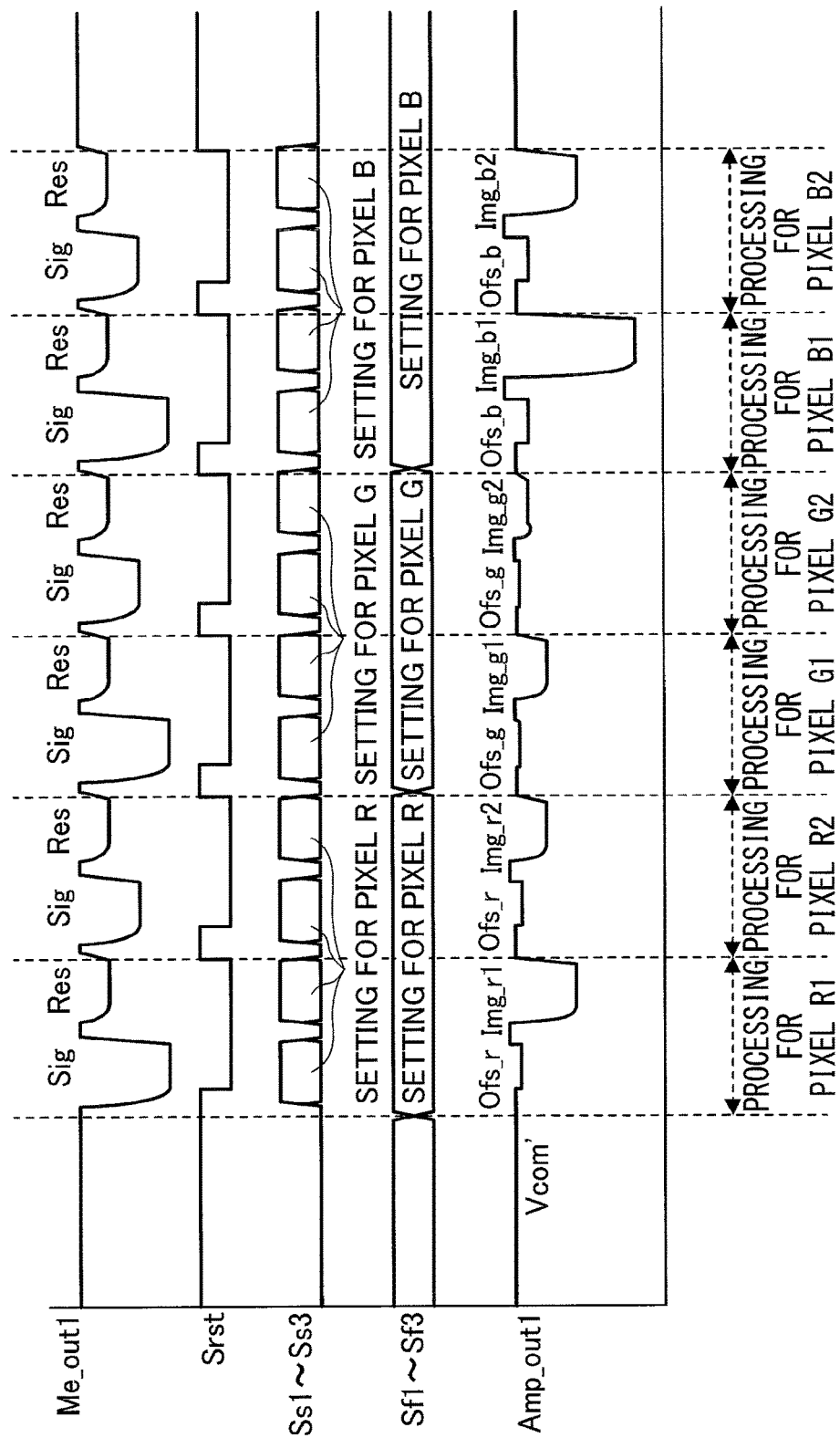
FIG. 12 is a diagram depicting an example of a timing chart for describing an operation of the programmable gain amplifier (PGA) illustrated in FIG. 10, in the case where the photoelectric conversion device is provided with the pixel array and the memory circuit illustrated in FIG. 3.

FIG. 12 is a diagram depicting an example of a timing chart for describing an operation of the programmable gain amplifier (PGA) 3-1, illustrated in FIG. 10, in the case where the photoelectric conversion device is provided with the pixel array LA and the memory circuit 2A-1 to 2A-N, illustrated in FIG. 3. FIG. 12 illustrates a case where the pixel array is configured as illustrated in FIG. 3, and to the PGA 3-1, a signal (photoelectric conversion value and reset value) of six pixels 11 (R1-pixel, R2 pixel, G1 pixel, G2 pixel, B1 pixel and B2 pixel) is input. Gains for signals of the same color are assumed to the same, and gains for signals of different colors are assumed to be different from each other. To the PGA 3-1, as an output value Me_out1 from the memory 2A-1, photoelectric conversion values and reset values for the R1 pixel, the R2 pixel, the G1 pixel, the G2 pixel, the B1 pixel and the B2 pixel are input in sequence. The PGA 3-1 outputs, in sequence, an offset value for the R pixel Ofs_r, a difference value for the R1 pixel Img_r1, the offset value for the R pixel Ofs_r, a difference value for the R2 pixel Img_r2, an offset value for the G pixel Ofs_g, a difference value for the G1 pixel Img_g1, the offset value for the G pixel Ofs_g, a difference value for the G2 pixel Img_g2, an offset value for the B pixel Ofs_b, a difference value for the B1 pixel Img_b1 the offset value for the B pixel Ofs_b, and a difference value for the B2 pixel Img_b2.

Next, a configuration and an operation of the reference voltage generation circuit 8 will be described.

Figure 13:
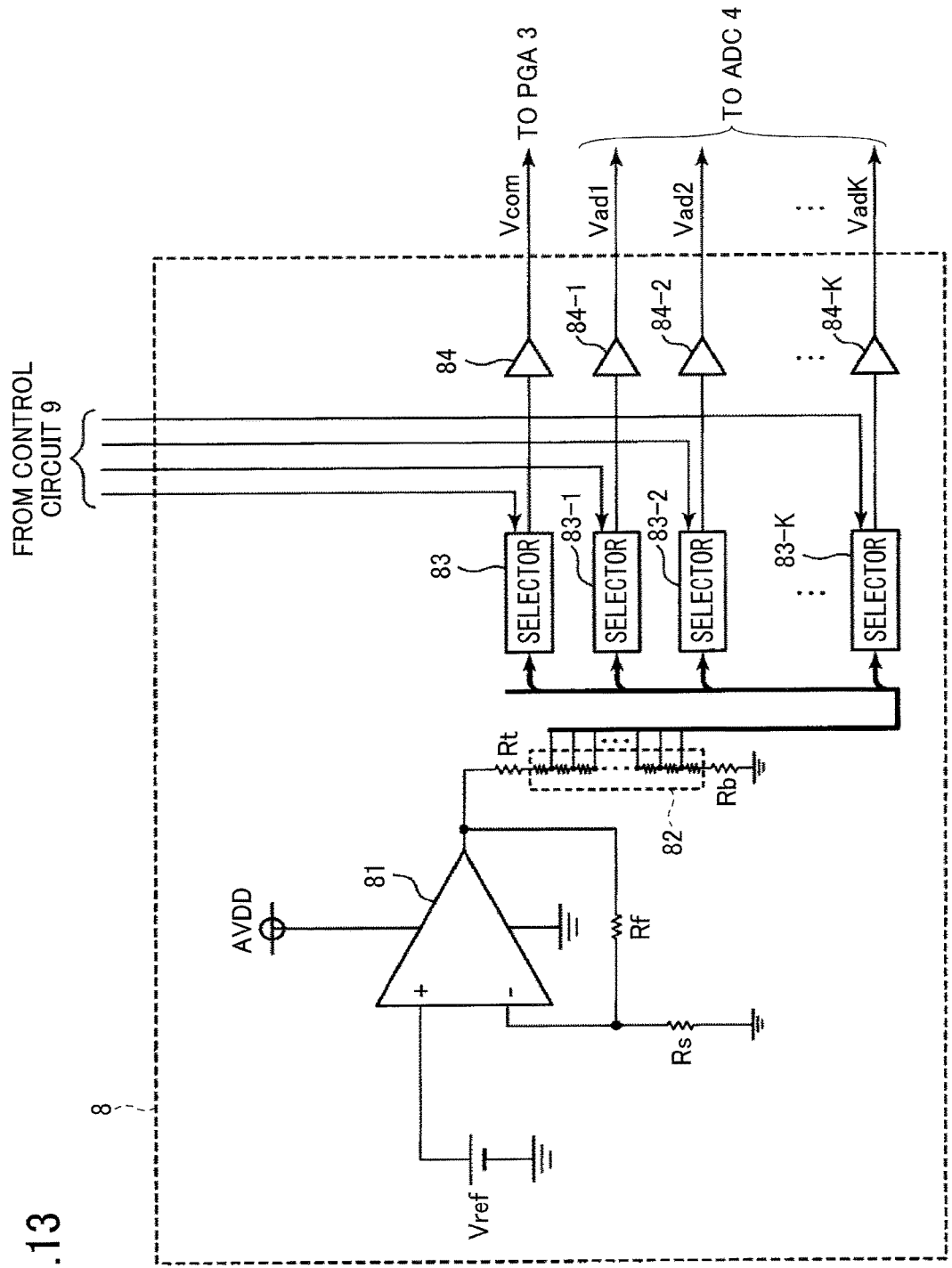
FIG. 13 is a diagram depicting an example of a configuration of a circuit of a reference voltage generation circuit illustrated in FIG. 1.

FIG. 13 is a diagram depicting an example of a configuration of a circuit of the reference voltage generation circuit 8 illustrated in FIG. 1. The reference voltage generation circuit 8 includes an operation amplifier 81, a ladder resistance circuit 82, selectors 83, and 83-1 to 83-K, buffer circuits 84, and 84-1 to 84-K, resistors Rs and Rf, and an electric voltage source Vref. The electric voltage source Vref is an embedded band gap reference or an external electric voltage source, and generates a constant reference electric voltage. The reference electric voltage of the electric voltage source Vref is amplified at a constant magnification by the operation amplifier 81 and the resistors Rs and Rf, and a plurality of reference electric voltages are generated by dividing a required electric voltage range with required steps by resistors Rt and Rb and the ladder resistance circuit 82. The plurality of reference electric voltages, divided as above, are selected by the selectors 83, and 83-1 to 83-K, under the control of the control circuit 9, and output through the buffer circuits 84, and 84-1 to 84-K as reference electric voltages Vcom, and Vad1 to VadK. The selector 83 selects a reference electric voltage for the PGA 3-1 to 3-N, and outputs the selected voltage as a reference electric voltage Vcom via the buffer circuit 84. The selectors 83-1 to 83-K select reference electric voltages for the ADC 4-1 to 4-N, respectively, and output the selected voltages via the buffer circuits 84-1 to 84-K as reference electric voltages Vad1 to VadK, respectively.

According to the reference voltage generation circuit 8, illustrated in FIG. 13, one circuit generates both the reference electric voltage Vcom and the reference electric voltages Vad1 to VadK, and thereby a variation in offsets of image data signals due to a variation in a reference electric voltage can be reduced.

Figure 14:
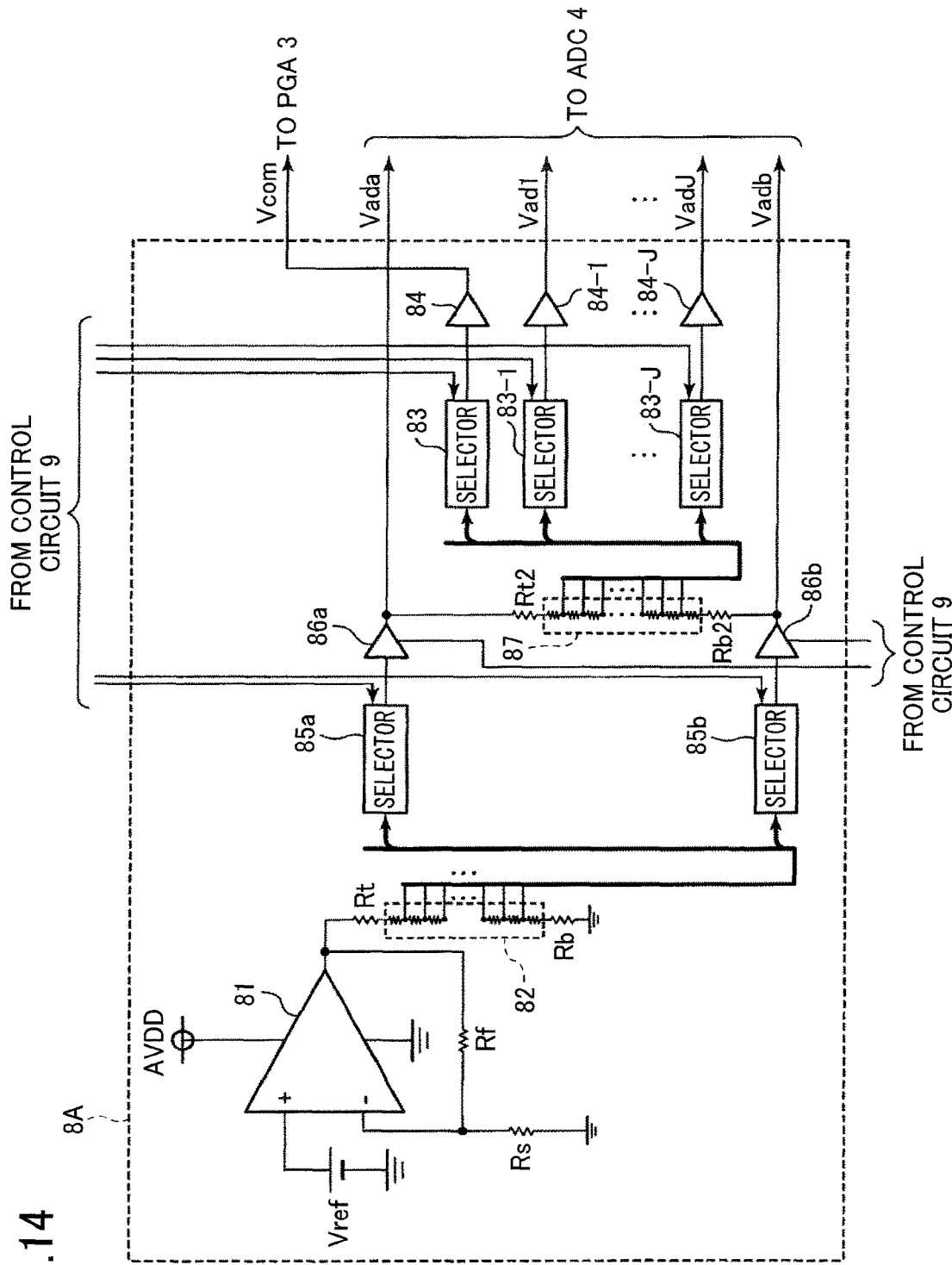
FIG. 14 is a diagram depicting an example of a configuration of a circuit of a reference voltage generation circuit of a photoelectric conversion device according to a fifth variation of the first embodiment.

FIG. 14 is a diagram depicting an example of a configuration of a circuit of a reference voltage generation circuit 8A of a photoelectric conversion device according to a fifth variation of the first embodiment. The reference voltage generation circuit 8A, illustrated in FIG. 14, includes, in addition to the components of the reference voltage generation circuit 8, illustrated in FIG. 13, selectors 85a and 85b, buffer circuits 86a and 86b, and a ladder resistance circuit 87. In the reference voltage generation circuit 8A, illustrated in FIG. 14, a part, in which a plurality of reference electric voltages are generated by dividing by the resistors Rt and Rb and the ladder resistance circuit 82, is the same as the reference voltage generation circuit 8, illustrated in FIG. 8. The selectors 85a and 85b select reference voltages indicating an upper limit and a lower limit of the conversion range for the ADC 4-1 to 4-N, respectively, under the control of the control circuit 9, and output the selected voltages as reference voltages Vada and Vadb via the buffer circuits 86a and 86b, respectively. The buffer circuits 86a and 86b, under the control of the control circuit 9, can switch between a low impedance (e.g. the same impedance as the other buffer circuits 84, and 84-1 to 84-J) and a high impedance observed from the output terminals. The reference voltages Vada and Vadb are the maximum and the minimum of the required reference voltages, respectively, and are not necessarily required to be selected actually as the reference voltage of the ADC 4-1 to 4-N. Moreover, when the reference voltage generation circuit includes the buffer circuits 86a and 86b, a variation of the reference voltage is controlled by a decoupling capacitor, and instead of the electric voltage source Vref, a reference voltage can be supplied from an external electric voltage source to the reference voltage generation circuit 8A.

Next, a configuration and an operation of the scan circuit 6 will be described in detail.

Figure 15:
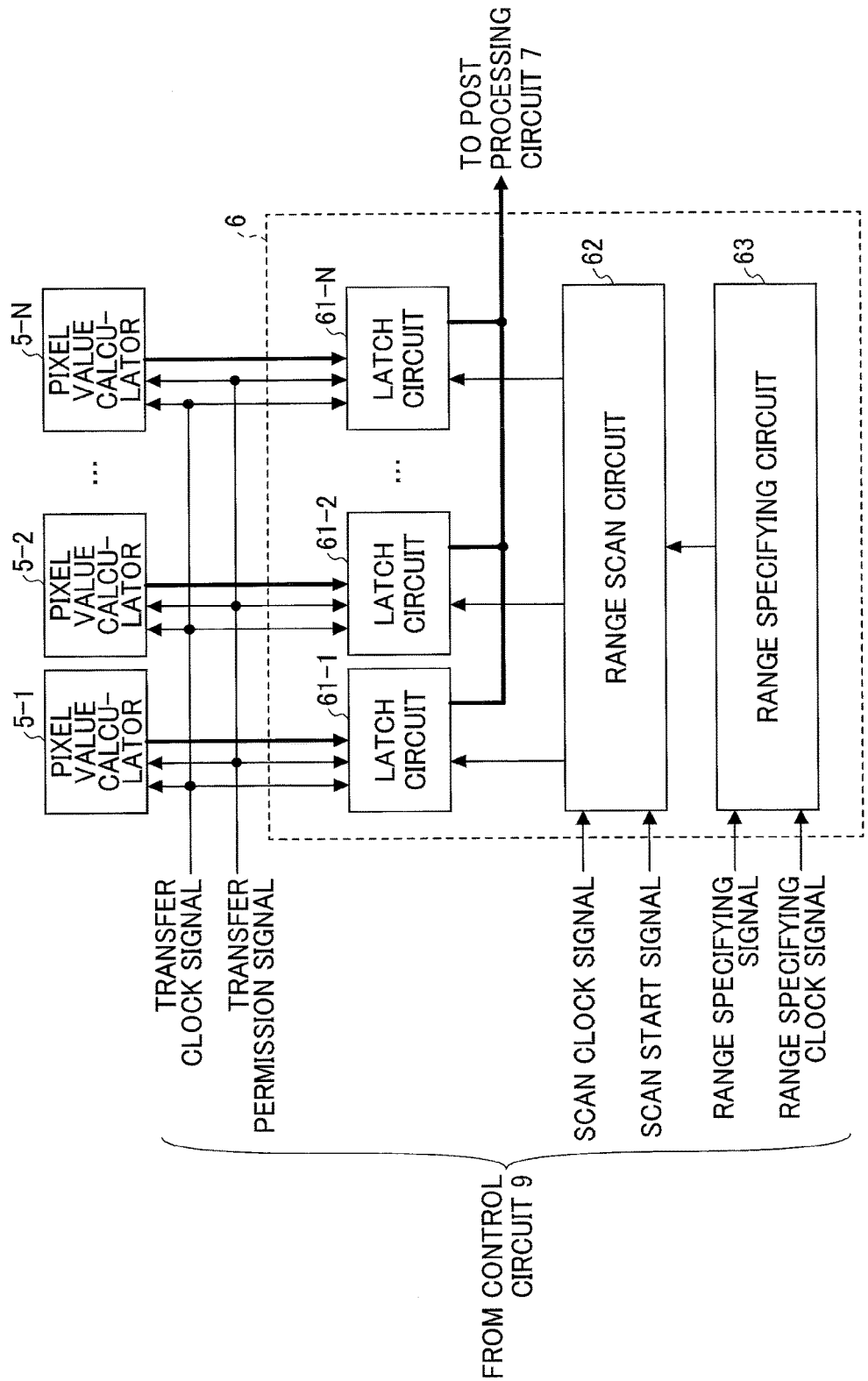
FIG. 15 is a block diagram depicting an example of a configuration of a scan circuit illustrated in FIG. 1.

FIG. 15 is a block diagram depicting an example of a configuration of the scan circuit illustrated in FIG. 1. The scan circuit 6 outputs pixel values of a plurality of pixels 11 in a specified range in the pixel array 1, in sequence. The scan circuit 6 includes latch circuits 61-1 to 61-N, a range scan circuit 62, and a range specifying circuit 63. To the scan circuit 6, from the control circuit 9, a transmission clock signal, a transmission permission signal, a scan clock signal, a scan start signal, a range specifying signal, and a range specifying clock signal are input. The transmission clock signal and the transmission permission signal are also input into pixel value calculators 5-1 to 5-N. Pixel values of a plurality of pixels calculated by the pixel value calculators 5-1 to 5-N are, in accordance with the transmission clock signal and the transmission permission signal, transmitted to the latch circuits 61-1 to 61-N of the scan circuit 6, respectively, and stored. The range specifying unit 63 specifies, in accordance with the range specifying signal and the range specifying clock signal, a range of pixels, from which pixel values are read out (scanned), in order to send the pixel values to the post-processing circuit 7, and sends a control signal indicating the range of pixels to the range scan circuit 62. The range scan circuit 62 reads out, in accordance with the scan start signal and the scan clock signal, and in accordance with the control signal from the range specifying circuit 63, pixel values in the specified range among the pixel values stored in the latch circuits 61-1 to 61-N, in sequence.

Figure 16:
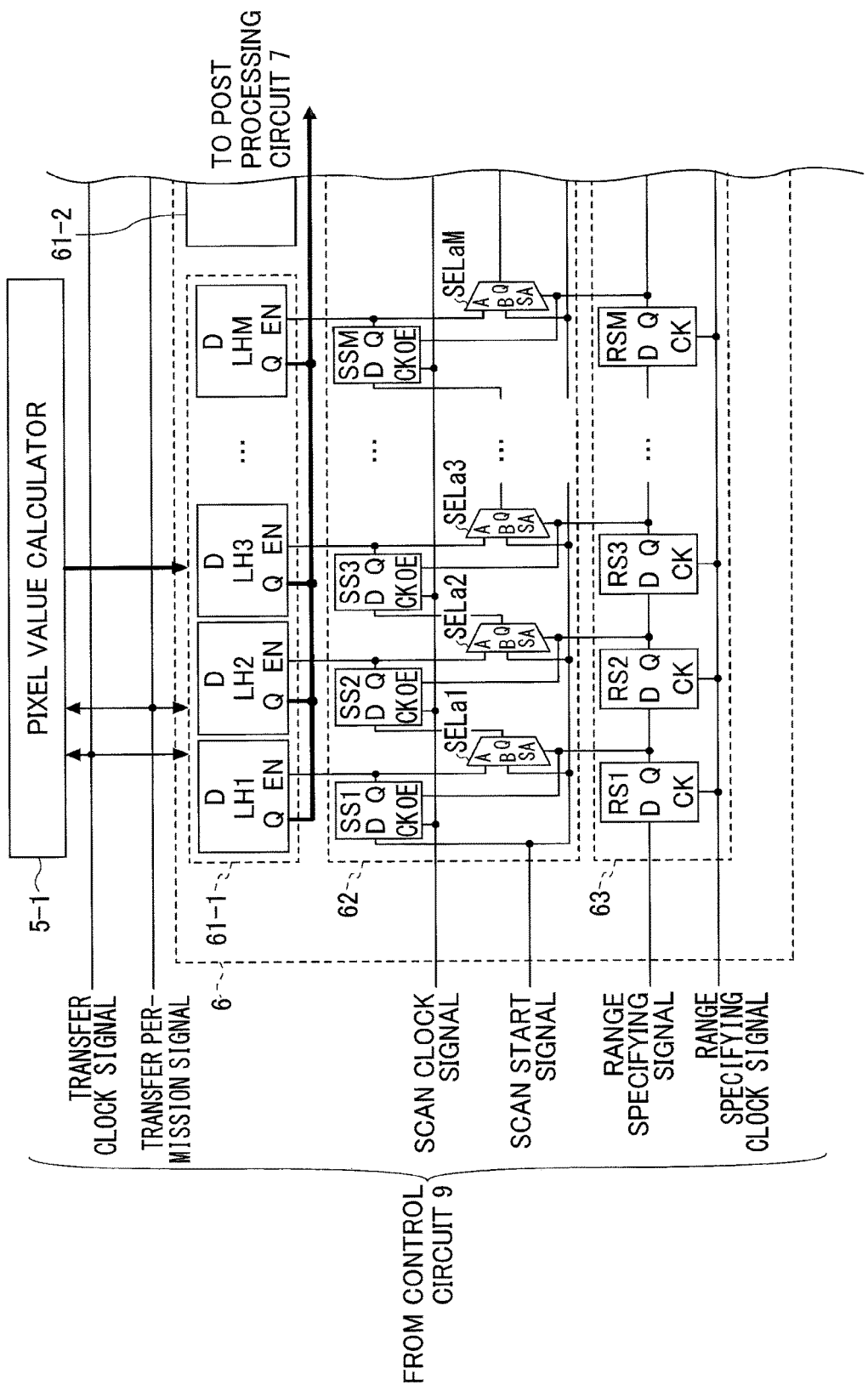
FIG. 16 is a block diagram depicting an example of a configuration of a latch circuit, a range scan circuit, and a range specifying circuit, illustrated in FIG. 15.

FIG. 16 is a block diagram depicting an example of a configuration of the latch circuit 61-1, the range scan circuit 62, and the range specifying circuit 63, illustrated in FIG. 15. The latch circuit 61-1 includes latches LH1 to LHM. A number of latches LH1 to LHM in the latch circuit 61-1, is the same as a number of pixels 11 connected to a memory circuit 2-1 on an upstream side of the pixel value calculator 5-1 connected to the latch circuit 61-1. The pixel values of the plurality of pixels transmitted from the pixel value calculator 5-1 (i.e. pixel values of the M pixels 11 connected to the memory circuit 2-1) are stored in the latches LH1 to LHM, respectively. Other latch circuits 61-2 to 61-N are configured in the same ways as the latch circuit 61-1. The range scan circuit 62 includes shift registers SS1 to SSM, . . . , and selectors SELa1 to SELaM, . . . . The range specifying circuit 63 includes shift registers RS1 to RSM, . . . .

In the range specifying circuit 63, the range specifying signal is input to D terminals of the shift registers RS1 to RSM, . . . , and output from Q terminals, and the range specifying clock signal is input to a CK terminal. The shift registers RS1 to RSM, . . . , fetch the range specifying signal from the D terminals at the rising edge of the range specifying clock signal, and output the signal from the Q terminals.

In the range scan circuit 62, the scan start signal is input to a D terminal of the shift register SS1 and B terminals of the selectors SELa1 to SELaM, . . . . The scan clock signal is input to CK terminals of the shift registers SS1 to SSM, . . . . Q terminals of the shift registers SS1 to SSM, . . . are connected to A terminals of the selectors SELa1 to SELaM, . . . , and EN terminals of the latches LH1 to LHM. Q terminals of the selectors SELa1 to SELaM, . . . are connected to D terminals of the shift registers SS1 to SSM, . . . . Thus, each of the shift registers SS1 to SSM, . . . is connected to a shift register in the latter stage, via one of the selectors SELa1 to SELaM, . . . . Output signals from the Q terminals of the shift registers RS1 to RSM, of the range specifying circuit 63, are input to OE terminals of the shift registers SS1 to SSM, . . . , and SA terminals of the selectors SELa1 to SELaM, respectively, as control signals from the range specifying circuit 63. When the OE terminals of the shift registers SS1 to SSM, are high level, an output from the Q terminals is permitted. When the SA terminals of the selectors SELa1 to SELaM, . . . are high level, signals input to the A terminals are selected and output from the Q terminals. When the SA terminals are low level, signals input to the B terminals are selected and output from the Q terminals. When the control signal from the range specifying circuit 63 is high level, the shift registers SS1 to SSM, . . . fetch signals from the previous stage from the D terminals at a rising edge of the scan clock signal of the CK terminals, and output from the Q terminals. The signals output from the Q terminals of the shift registers SS1 to SSM, . . . , are input to the A terminals of the selectors SELa1 to SELaM, . . . . When the SA terminals of the selectors SELa1 to SELaM, . . . are high level, the signals are transmitted to the latter stage. When the control signal from the range specifying circuit 63 is low level, the shift registers SS1 to SSM, . . . output low level signals from the Q terminals, regardless of the level on the D terminals, and the selectors SELa1 to SELaM, . . . transmit the scan start signals, which were input to the B terminals, to the subsequent stage.

When the EN terminals are high level, the latches LH1 to LHM output the pixel values, which are stored, from the Q terminals. When the EN terminals are low level, the latches do not output the pixel values, and the Q terminals have high impedances.

Figure 17:
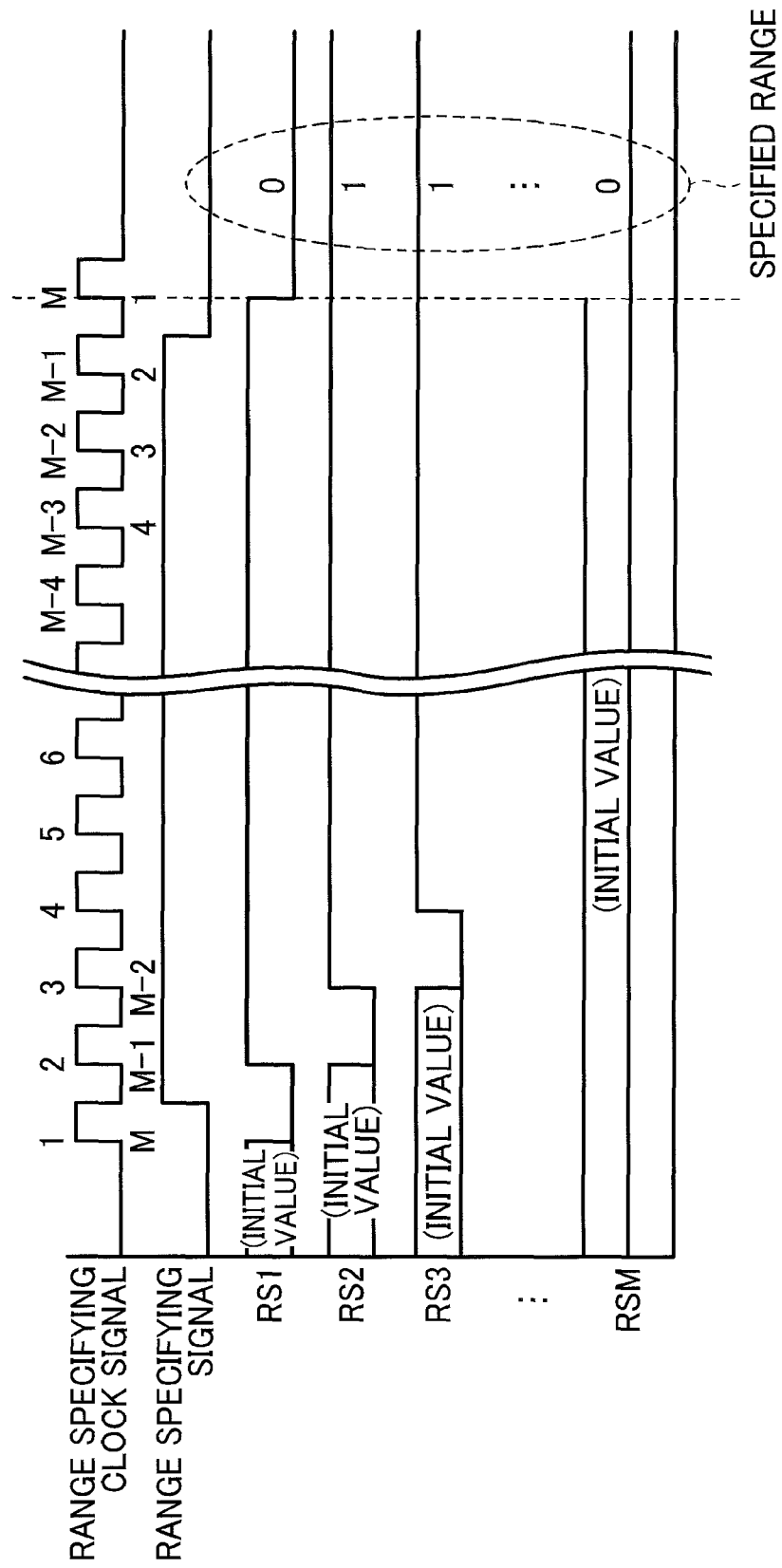
FIG. 17 is a diagram depicting an example of a timing chart for describing an operation of the range specifying circuit, illustrated in FIG. 16.

FIG. 17 is a diagram depicting an example of a timing chart for describing an operation of the range specifying circuit 63, illustrated in FIG. 16. Each bit of the range specifying signal input to the range specifying circuit 63 is sequentially shifted on the shift registers RS1 to RSM, . . . , in accordance with the range specifying clock signal. At this time, the range specifying signal is always high over the specified range from a start pixel to an end pixel, and is low level for the other pixels. The range specifying clock signal stops at a clock number that is the same as a number of steps of the shift registers RS1 to RSM, . . . (maximum number of pixels that can be specified by the range specifying signal). As illustrated in FIG. 17, after specifying the range of pixels, contents of the shift registers RS1 to RSM, . . . , corresponding to pixels within the specified range, become high level.

Figure 18:
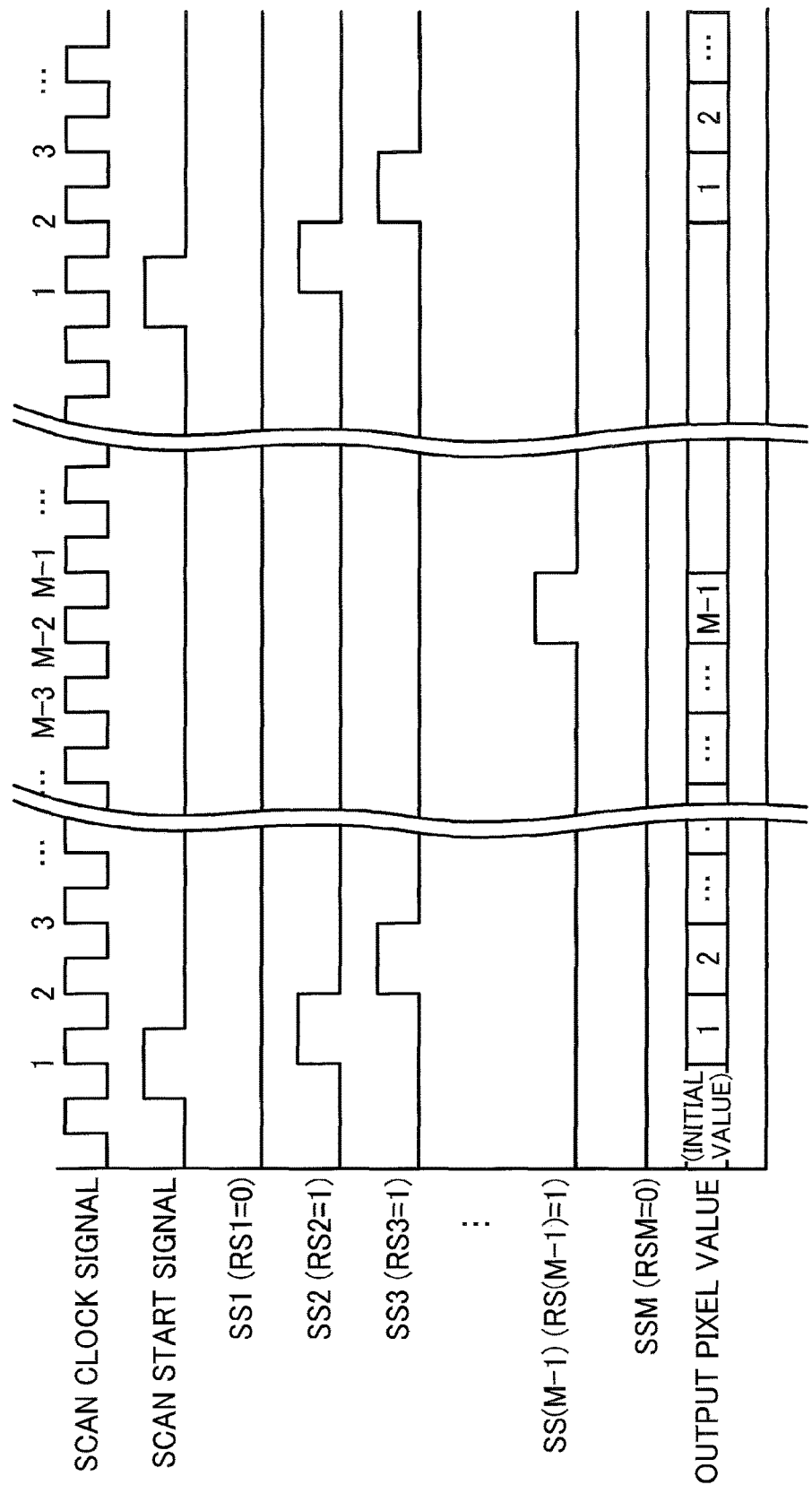
FIG. 18 is a diagram depicting an example of a timing chart for describing an operation of the range scan circuit, illustrated in FIG. 16.

FIG. 18 is a diagram depicting an example of a timing chart for describing an operation of the range scan circuit 62, illustrated in FIG. 16. The scan start signal has a time length of one clock of the scan clock signal. The scan start signal, which is input to the range scan circuit 62, is shifted in sequence within the specified range, in accordance with the scan clock signal. Thus, as illustrated in FIG. 18, only the pixel values of the pixels within the specified range are output in sequence from the scan circuit to the post processing circuits.

When the pixel array 1 and the memory circuits 2-1 to 2-N are configured, as illustrated in FIG. 2, for example, the scan circuit 6, for each of the latch circuits 61-1 to 61-N, may output simultaneously the pixel value of the R pixel, the pixel value of the G pixel and the pixel value of the B pixel, that were read out. Thus, a data width W2 on the output side of the scan circuit 6 is greater than a bus width W1 on the output side of the ADC 4-1 to 4-N. For example, the data width W2 may have a bus width of 24 bits or 36 bits.

In FIG. 16, only a part of the range scan circuit 62 and a part of the range specifying circuit 63, which correspond to the latch circuit 61-1, are illustrated. Remaining parts corresponding to the other latch circuits 61-2 to 61-N are configured in the same way as the parts illustrated in FIG. 16.

According to the scan circuit 6, illustrated in FIG. 15, in which only pixel values of pixels within a required range are read out and output, a cost of the data transmission and a processing cost in the post stage can be reduced.

Figure 19:
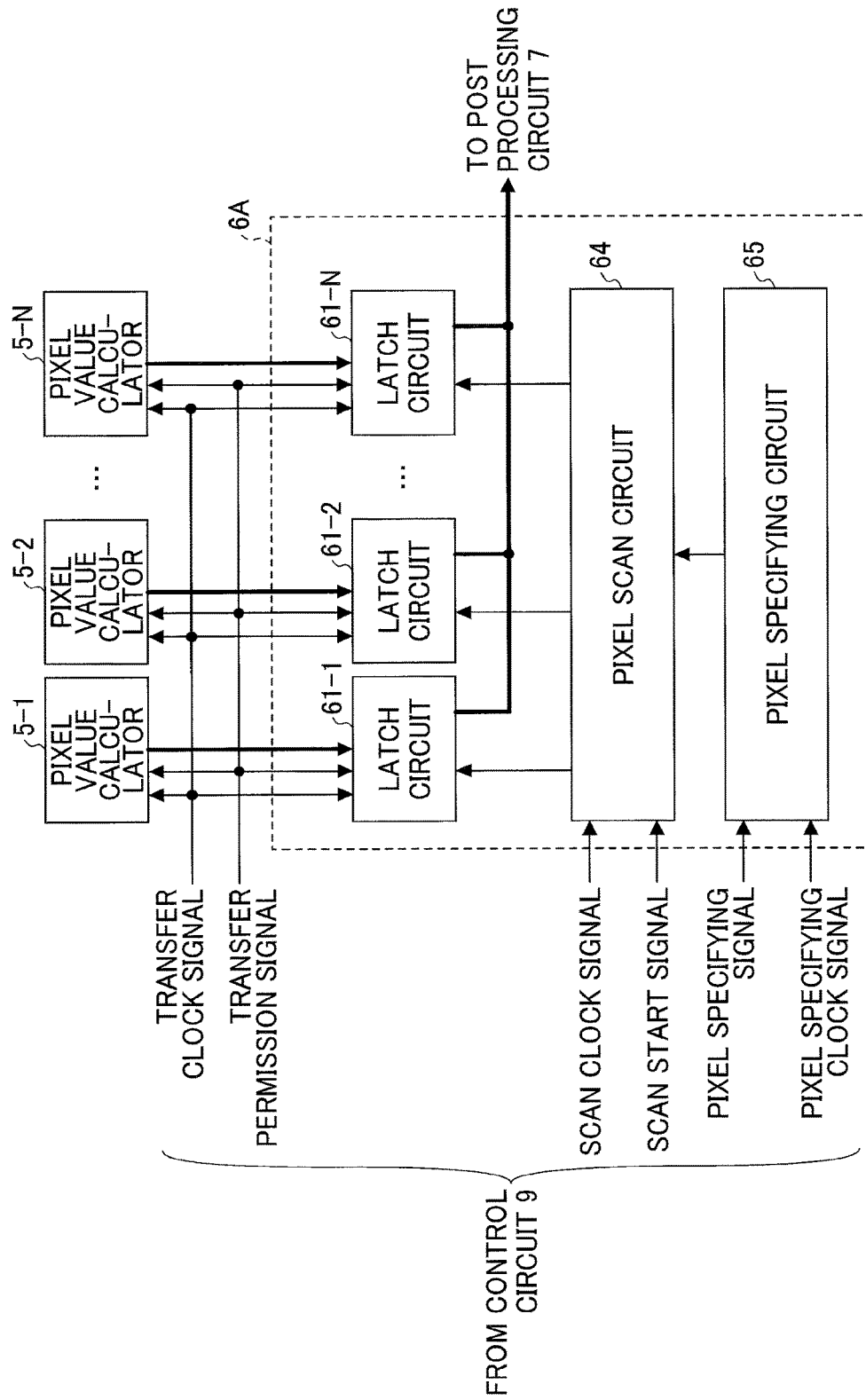
FIG. 19 is a block diagram depicting an example of a configuration of a scan circuit of a photoelectric conversion device according to a sixth variation of the first embodiment.

FIG. 19 is a block diagram depicting an example of a configuration of a scan circuit 6A of a photoelectric conversion device according to a sixth variation of the first embodiment. The scan circuit 6A outputs pixel values of a plurality of specified pixels 11 in the pixel array 1, in sequence. The scan circuit 6A, illustrated in FIG. 19, is provided with a pixel scan circuit 64 and a pixel specifying circuit 65, instead of the range scan circuit 62 and the range specifying circuit 63 in the scan circuit 6, illustrated in FIG. 15. To the scan circuit 6A, from the control circuit 9, a pixel specifying signal and a pixel specifying clock signal are input instead of the range specifying signal and the range specifying clock signal, illustrated in FIG. 15. The pixel specifying circuit 65 specifies, in accordance with the pixel specifying signal and the pixel specifying clock signal, pixels, from which pixel values to be transmitted to the post processing circuit 7 are read out, and transmits a control signal indicating the pixel to the pixel scan circuit 64. The pixel scan circuit 64 reads out, in accordance with a scan start signal and a scan clock signal and in accordance with a control signal from the pixel specifying circuit 65, pixel values of scanning pixels in the latch circuits 61-1 to 61-N, in sequence.

Figure 20:
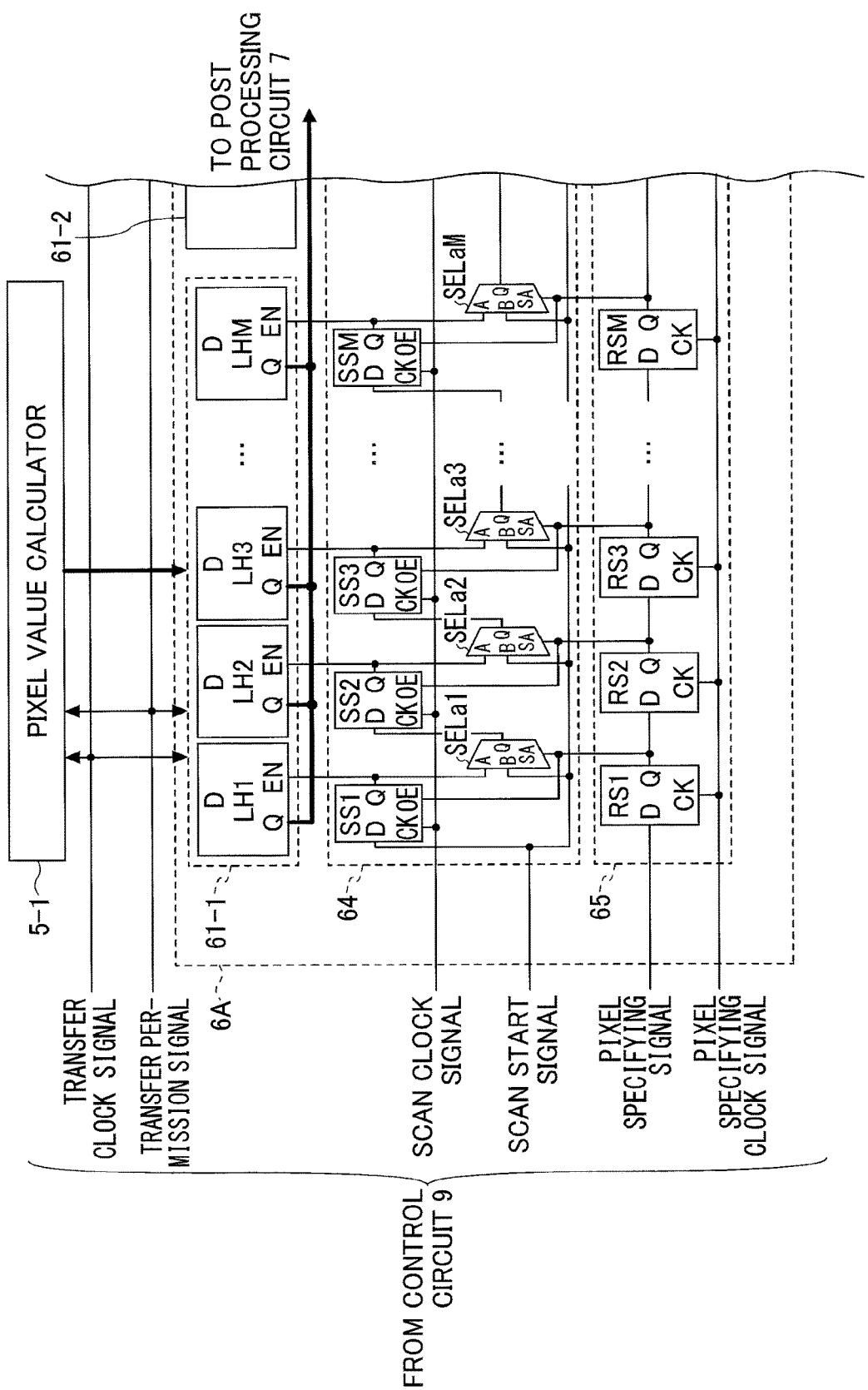
FIG. 20 is a block diagram depicting an example of a configuration of a latch circuit, a pixel scan circuit, and a pixel specifying circuit, illustrated in FIG. 19.

FIG. 20 is a block diagram depicting an example of a configuration of the latch circuit 61-1, the pixel scan circuit 64, and the pixel specifying circuit 65, illustrated in FIG. 19. The pixel scan circuit 64 and the pixel specifying circuit 65 are configured in the same way as the range scan circuit 62 and the range specifying circuit 63 illustrated in FIG. 16.

Figure 21:
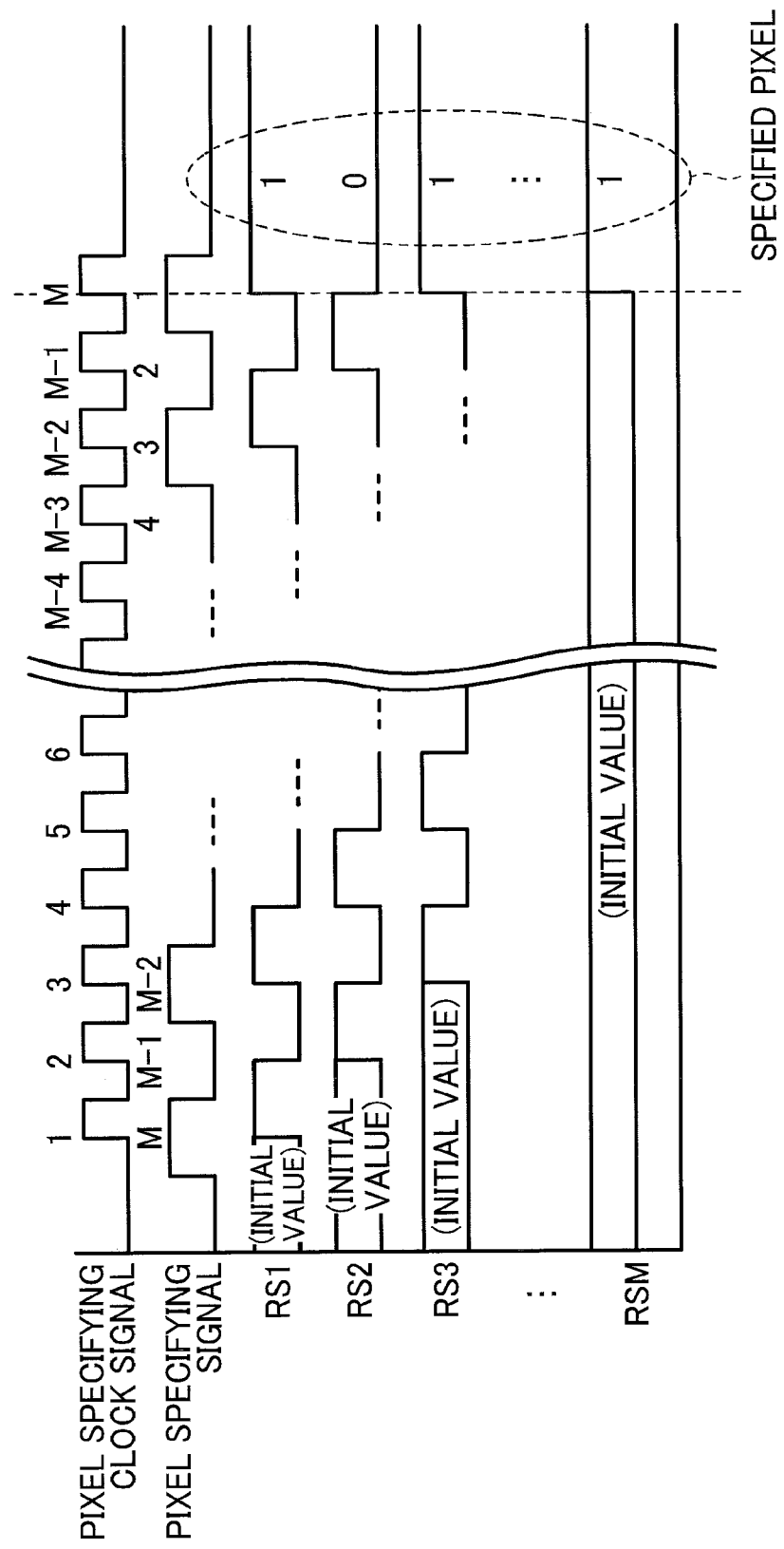
FIG. 21 is a diagram depicting an example of a timing chart for describing an operation of the pixel specifying circuit, illustrated in FIG. 20.

FIG. 21 is a diagram depicting an example of a timing chart for describing an operation of the pixel specifying circuit 65, illustrated in FIG. 20. Each bit of the pixel specifying signal input to the pixel specifying circuit 65 is sequentially shifted on the shift registers RS1 to RSM, . . . , in accordance with the pixel specifying clock signal. At this time, the pixel specifying signal is high level, only for a pixel to be read out, in units of a period of one clock in the pixel specifying clock signal. As illustrated in FIG. 21, after specifying pixels, contents of the shift registers RS1 to RSM, . . . , corresponding to the specified pixels, become high level.

Figure 22:
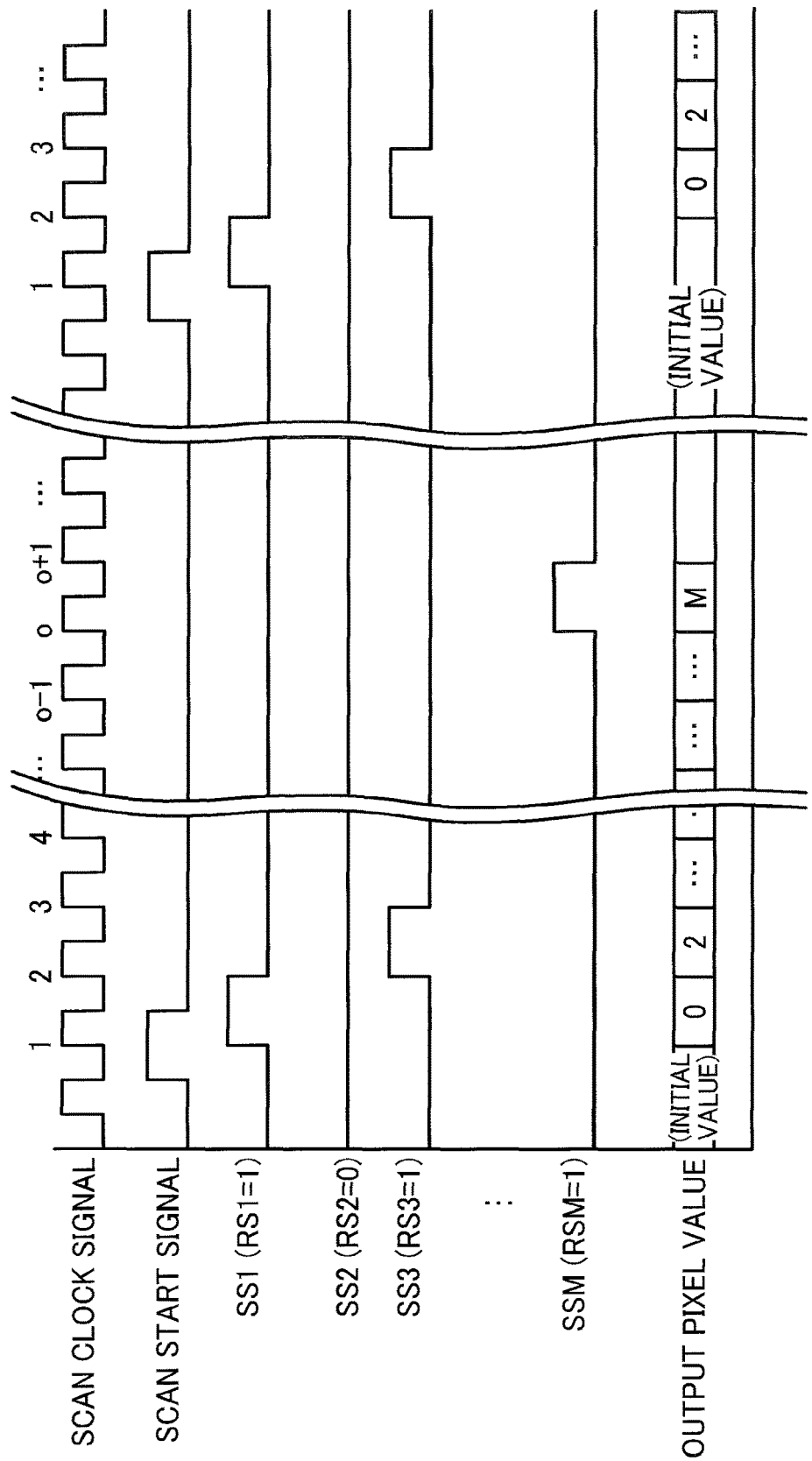
FIG. 22 is a diagram depicting an example of a timing chart for describing an operation of the pixel scan circuit, illustrated in FIG. 20.

FIG. 22 is a diagram depicting an example of a timing chart for describing an operation of the pixel scan circuit 64, illustrated in FIG. 20. The scan start signal, input to the pixel scan circuit 64, is sequentially shifted, in accordance with the scan clock signal, only for the specified pixels. Thus, as illustrated in FIG. 22, only the pixel values of the specified pixels are sequentially output from the scan circuit 6 to the post processing circuit 7.

According to the scan circuit 6A, illustrated in FIG. 19, in the photoelectric conversion device recited in claim 1, only pixel values of the required pixels are output, and thereby, a cost of the data transmission and a processing cost in the post stage can be reduced. According to the scan circuit 6A, illustrated in FIG. 19, an amount of data can be reduced from that in the case illustrated in FIG. 15.

Figure 23:
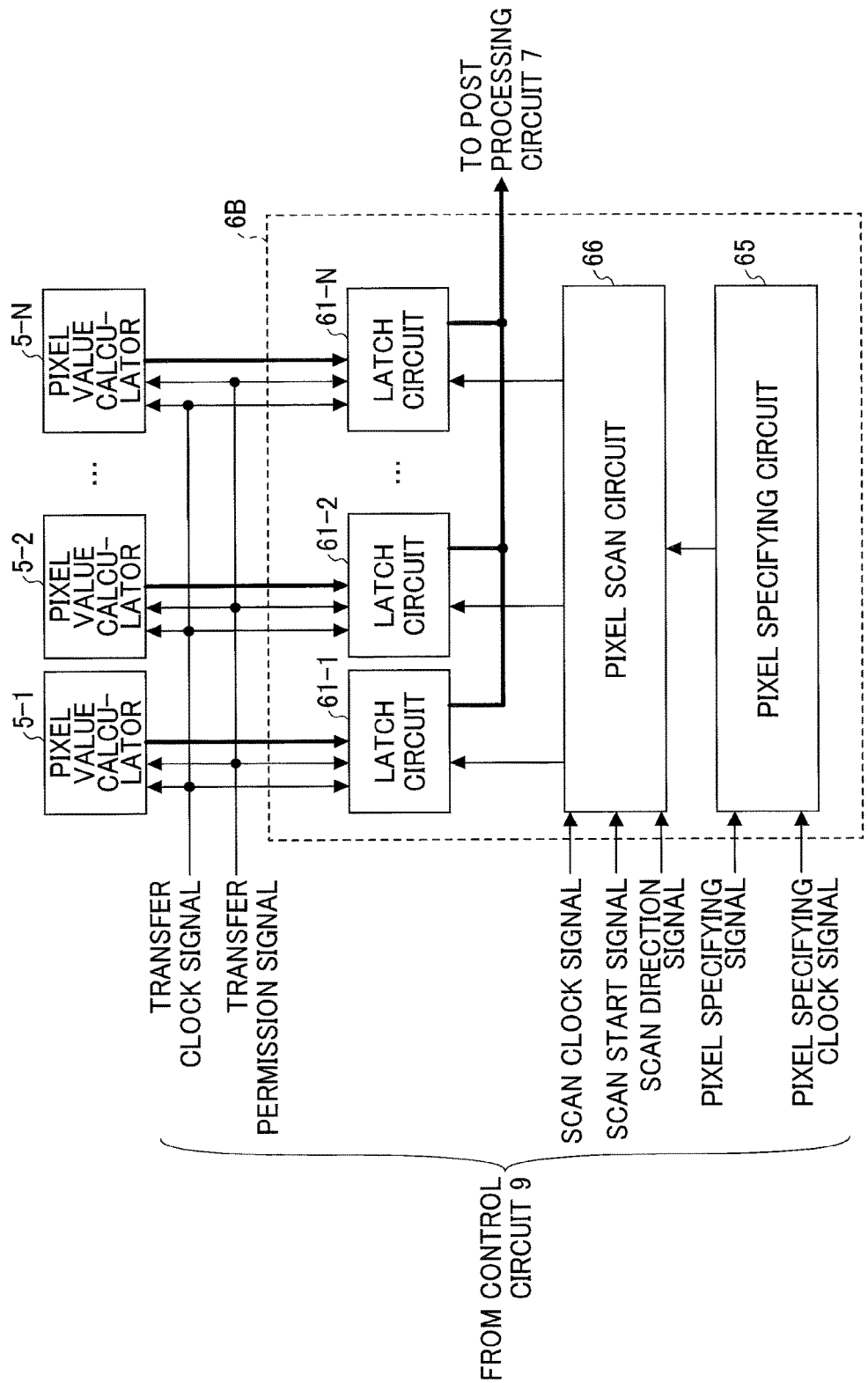
FIG. 23 is a block diagram depicting an example of a configuration of a scan circuit of a photoelectric conversion device according to a seventh variation of the first embodiment.

FIG. 23 is a block diagram depicting an example of a configuration of a scan circuit 6B of a photoelectric conversion device according to a seventh variation of the first embodiment. The scan circuit 6B outputs pixel values of a plurality of pixels 11, in an order where a plurality of pixels are arranged along a specified direction of the pixel array 1, in sequence. The scan circuit 6B, illustrated in FIG. 23, is provided with a pixel scan circuit 66, instead of the pixel scan circuit 64, illustrated in FIG. 19. To the scan circuit 6B, from the control circuit 9, a scan direction signal is further input. The pixel scan circuit 64 reads out, in accordance with the scan start signal, the scan clock signal, and the scan direction signal, and in accordance with a control signal from the pixel specifying circuit 65, pixel values of scanning pixels in the latch circuits 61-1 to 61-N, in sequence.

Figure 24:
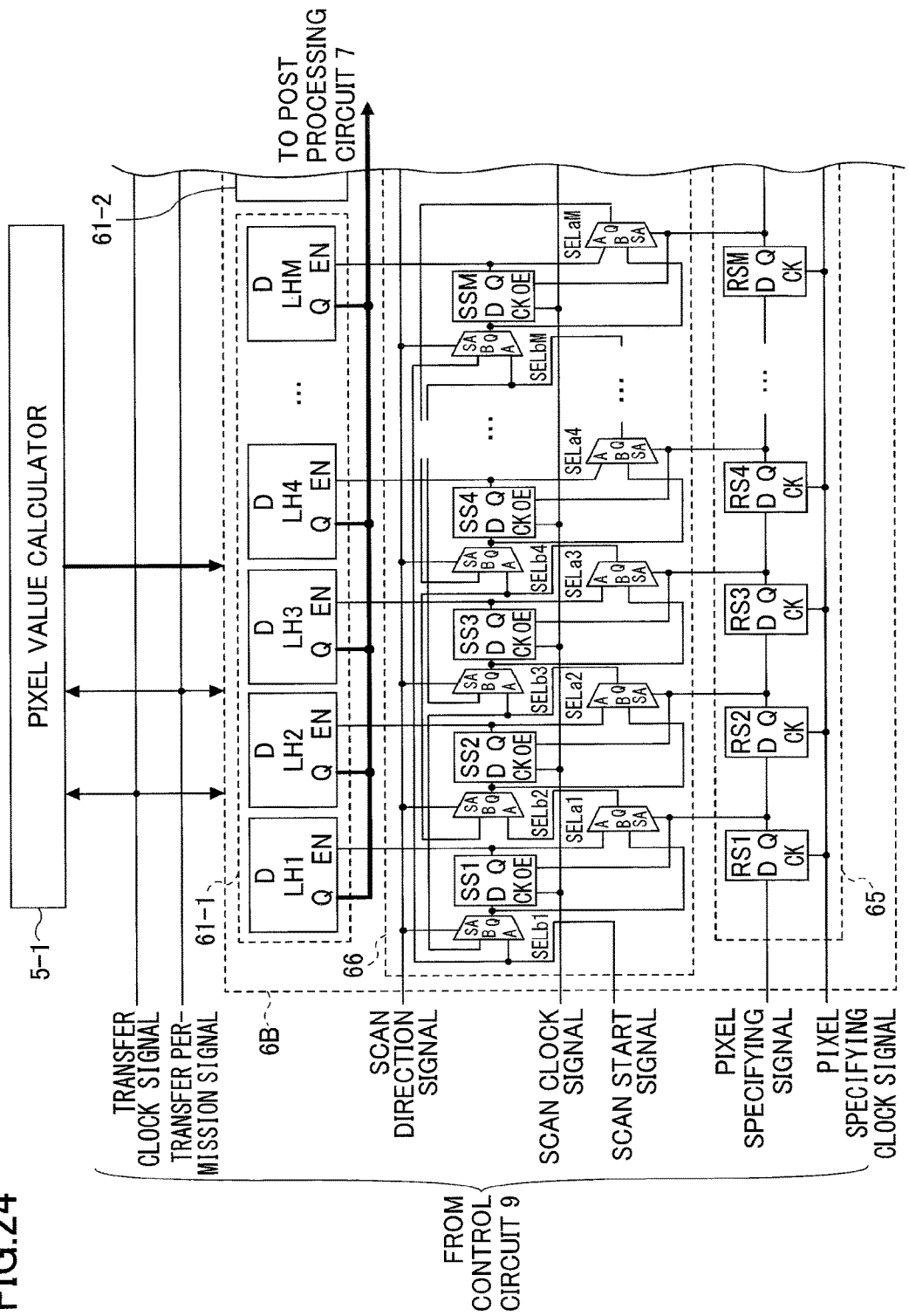
FIG. 24 is a block diagram depicting an example of a configuration of a latch circuit, a pixel scan circuit, and a pixel specifying circuit, illustrated in FIG. 23.

FIG. 24 is a block diagram depicting an example of a configuration of the latch circuit 61-1, the pixel scan circuit 66, and the pixel specifying circuit 65, illustrated in FIG. 23.

The pixel specifying circuit 65, illustrated in FIG. 24, is configured in the same way as the pixel specifying circuit 65, illustrated in FIG. 20.

The pixel scan circuit 66 includes selectors SELb1 to SELbM, in addition to the components of the pixel scan circuit 64, illustrated in FIG. 20. In the pixel scan circuit 66, the scan start signal is input to an A terminal of the selector SELb1, which is at one end of an array of the selectors SELb1 to SELbM, and to a B terminal of the selector SELbM, which is at the other end of the array. The scan clock signal is input to the CK terminals of the shift registers SS1 to SSM. The scan direction signal is input to SA terminals of the selectors SELb1 to SELbM. Q terminals of the selectors SELb1 to SELbM are connected to the D terminals of the shift registers SS1 to SSM, and to the B terminals of the selectors SELa1 to SELaM. The Q terminals of the shift registers SS1 to SSM are connected to the A terminals of the selectors SELa1 to SELaM, and to the EN terminals of the latches LH1 to LHM. The Q terminals of the selectors SELa1 to SELaM are connected to the A terminals of the post-stage selectors SELb2 to SELbM and to the B terminals of the prior-stage selectors SELb1 to SELb(M−1). Thus, each of the shift registers SS1 to SSM is connected to the post-stage shift register via one of the selectors SELa1 to SELaM, and via one of the selectors SELb1 to SELbM. The selectors SELb1 to SELbM generally select one of an output signal from the prior-stage shift register and an output signal from the post-stage shift register, with respect to the shift register connected to the Q terminal, and output the output signal from the Q terminal. Output signals from the Q terminals of the shift registers RS1 to RSM of the pixel specifying circuit 65 are input to the OE terminals of the shift registers SS1 to SSM, and to the SA terminals of the selectors SELa1 to SELaM, as control signals from the pixel specifying circuit 65.

When the control signals from the pixel specifying circuit 65 are high level, the shift registers SS1 to SSM fetch, at a rising edge of the scan clock signal at the CK terminal, signals from the prior stage from the D terminals, and output the signal from the Q terminals. The signals, output from the Q-terminals of the shift registers SS1 to SSM, are input to the A terminals of the selectors SELa1 to SELaM. When the SA terminals of the selectors SELa1 to SELaM are high levels, the signals are sent to the prior-stage shift registers and the post-stage shift registers. When the control signals from the pixel specifying circuit 65 are low level, the shift registers SS1 to SSM output low level signals from the Q terminals, regardless of levels of the D terminals, and the selectors SELa1 to SELaM transmit the output signals from the selectors SELb1 to SELbM, input to the B terminals, to the post stage. When the scan direction signal is high level, the selectors SELb1 to SELbM select output signals from the prior-stage shift registers, with respect to the shift registers connected to the Q terminals, and output the output signals from the Q terminals. When the scan direction signal is low level, the selectors SELb1 to SELbM select output signals from the post-stage shift registers, with respect to the shift registers connected to the Q terminals, and output the output signals from the Q terminals.

Figure 25:
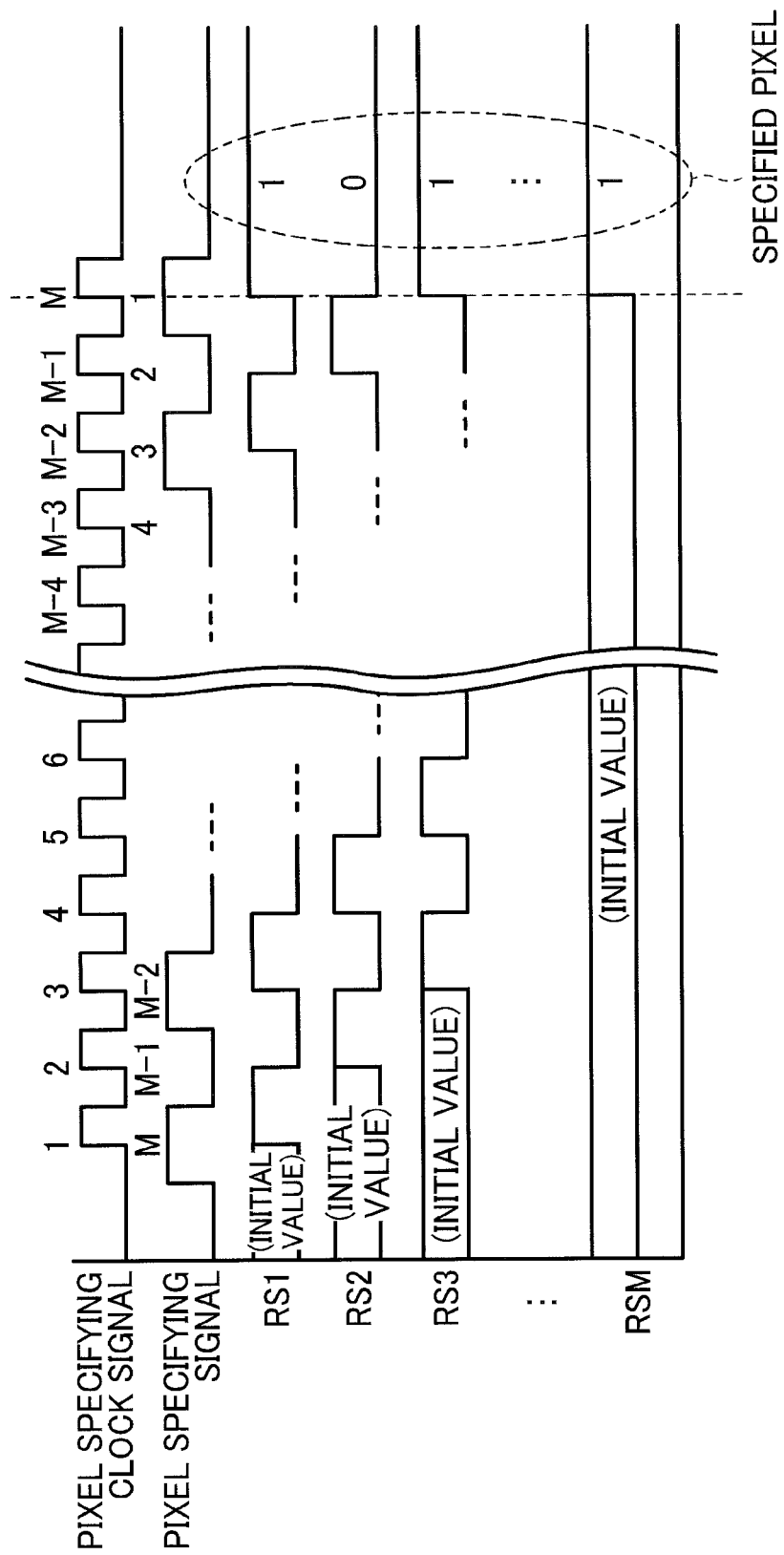
FIG. 25 is a diagram depicting an example of a timing chart for describing an operation of the pixel specifying circuit, illustrated in FIG. 24.

FIG. 25 is a diagram depicting an example of a timing chart for describing an operation of the pixel specifying circuit 65, illustrated in FIG. 24. The pixel specifying circuit 65, illustrated in FIG. 24, operates in the same way as the pixel specifying circuit 65, illustrated in FIG. 20 (See FIG. 21).

Figure 26:
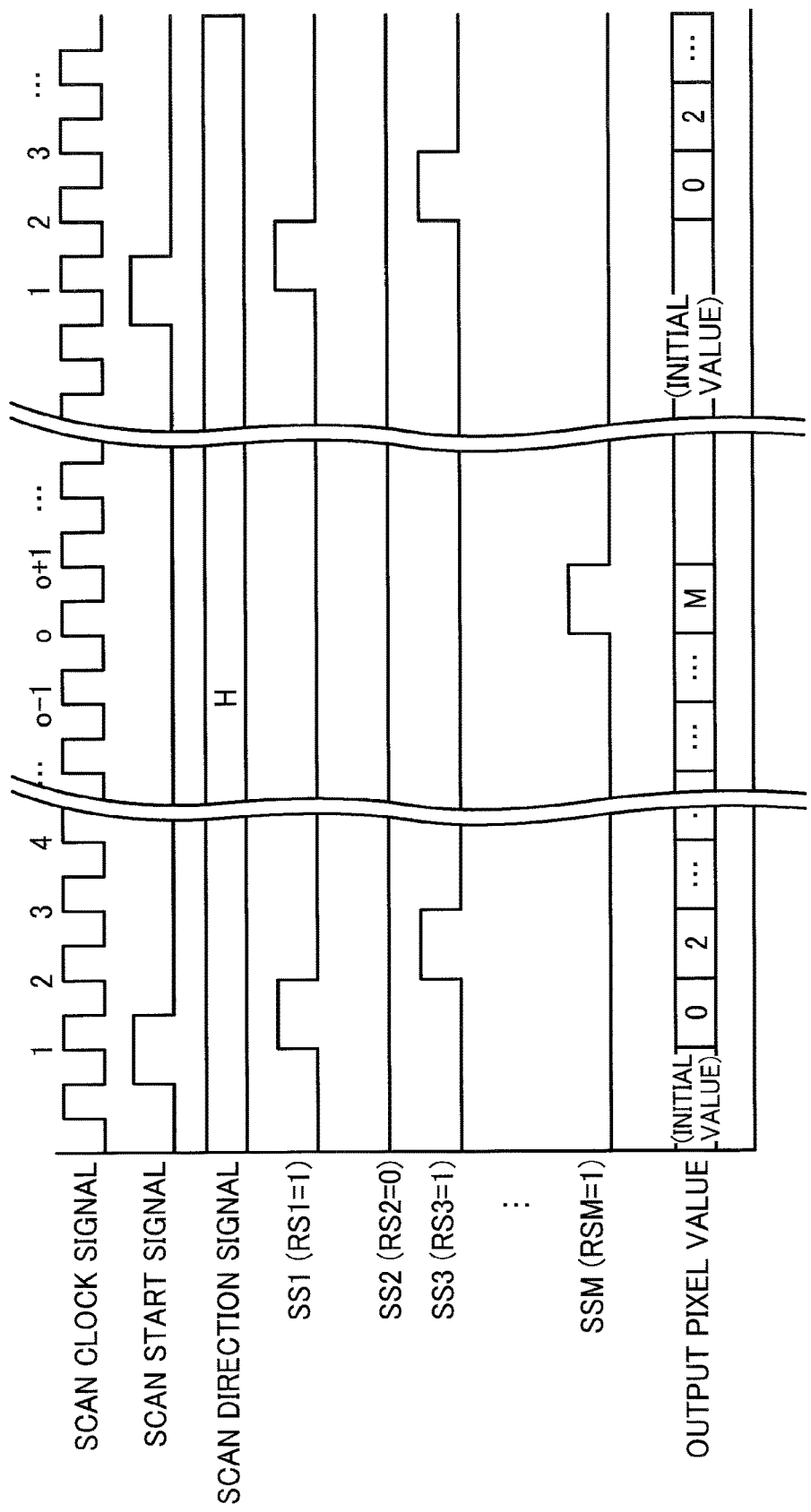
FIG. 26 is a diagram depicting an example of a timing chart for describing a first operation of the pixel scan circuit, illustrated in FIG. 24.
Figure 27:
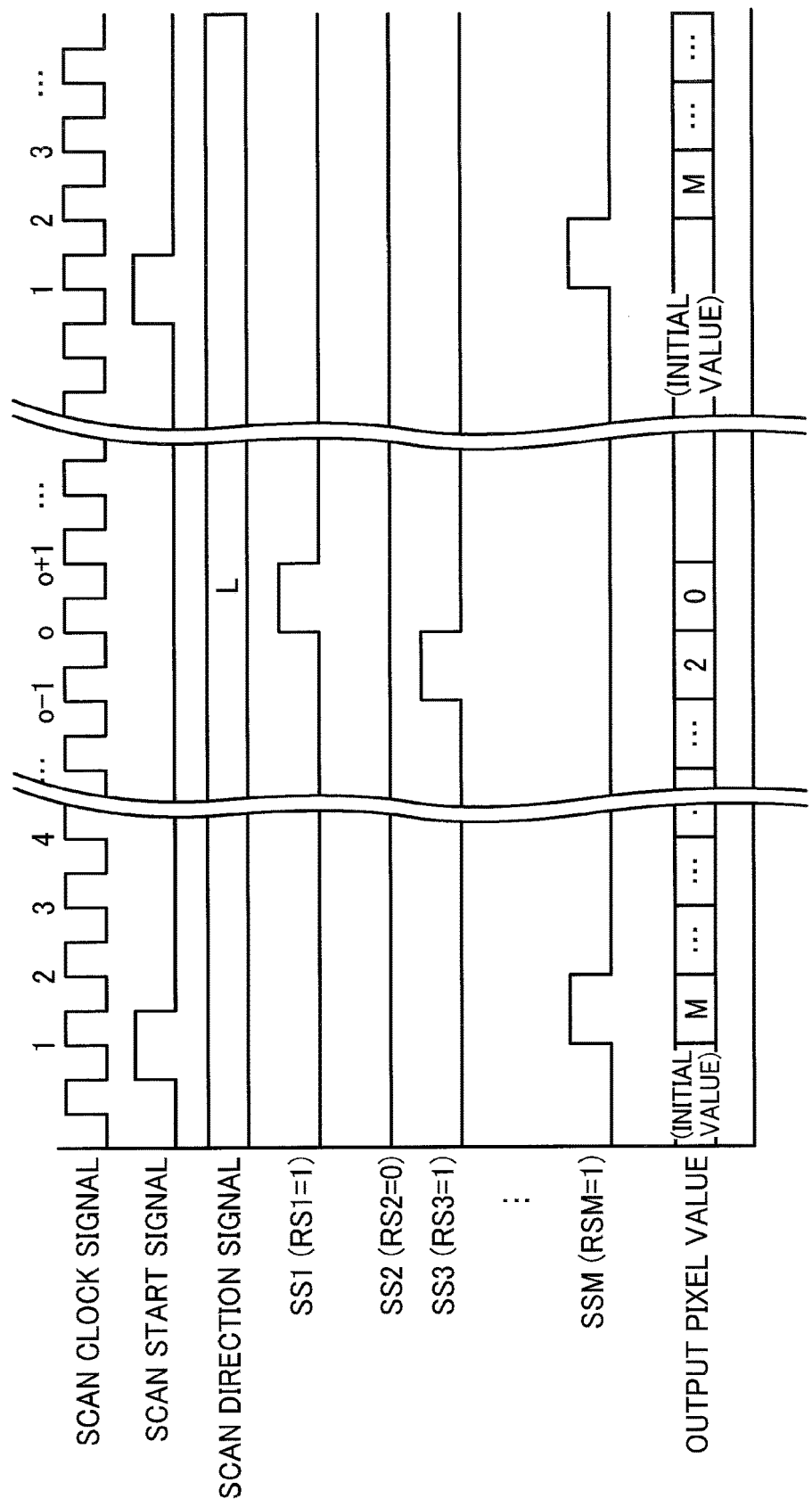
FIG. 27 is a diagram depicting an example of a timing chart for describing a second operation of the pixel scan circuit, illustrated in FIG. 24.

FIG. 26 is a diagram depicting an example of a timing chart for describing a first operation of the pixel scan circuit 66, illustrated in FIG. 24. FIG. 26 illustrates the case where the scan direction signal is high level (H), and pixel values of specified pixels are scanned in a forward direction. FIG. 27 is a diagram depicting an example of a timing chart for describing a second operation of the pixel scan circuit 66, illustrated in FIG. 24. FIG. 27 illustrates the case where the scan direction signal is low level (L), and pixel values of specified pixels are scanned in a backward direction. According to any of the operations illustrated in FIG. 26 and FIG. 27, the pixel values of the specified pixels are read out and output to the post processing circuit, in sequence.

According to the scan circuit 6B, illustrated in FIG. 23, in a document scanner of a flatbed type, a sheet through type, or the like, even if a relative direction of movement between a document and a photoelectric conversion device is changed, the document can be scanned.

With reference to FIGS. 23 to 26, the operation of sequentially outputting pixel values of a plurality of specified pixels 11 in the pixel array 1 in a forward direction or a backward direction has been described. Similarly, also in the case of sequentially outputting pixel values of a plurality of pixels 11 in a specified range in the pixel array 1 (See FIGS. 15 to 18), the pixel values of the plurality of pixels may be output in the forward direction or the backward direction.

Next, a configuration and an operation of the post processing circuit 7 will be described.

As described above, the post processing circuit 7 may multiply pixel values by coefficients of predetermined values, so as to transmit the pixel values without saturation, depending on the data width W3 of the image data signals to be output. In this case, the post processing circuit 7 may multiply different coefficients for different colors. In the following, a case in which a data width of output signals of the ADC 4-1 to 4-N is 12 bits (0 to 4095), and the data width W3 of the image data signals output from the post processing circuit 7 is 10 bits (0 to 1023) will be described, as an example.

Maximum values of pixel values of the R pixel, the G pixel and the B pixel output from the ADC 4-1 to 4-N are assumed to be 2600, 3400 and 2200, respectively, taking into account a distribution in the case of scanning a blank document. In order to indicate such pixel values in 10 bits, pixel values are reduced with a ratio so that the maximum value is 1023 or less. However, the pixel values are further reduced with a ratio so that the maximum value is 800 or less, so that even in the case where the output value is increased due to a variation in a light amount of the light source or the like, the pixel value will not be saturated (i.e. the pixel value will not exceed 1023). In order to make the maximum values of pixel values the R pixel, the G pixel and the B pixel less than or equal to 800, the coefficients for the respective colors are 800/2600≈0.31, 800/3400≈0.24, and 800/2200≈0.36, respectively.

By multiplying the pixel values by the coefficients, obtained as above, the data width W3 of the image data signals output from the post processing circuit 7 can be effectively used.

Figure 28:
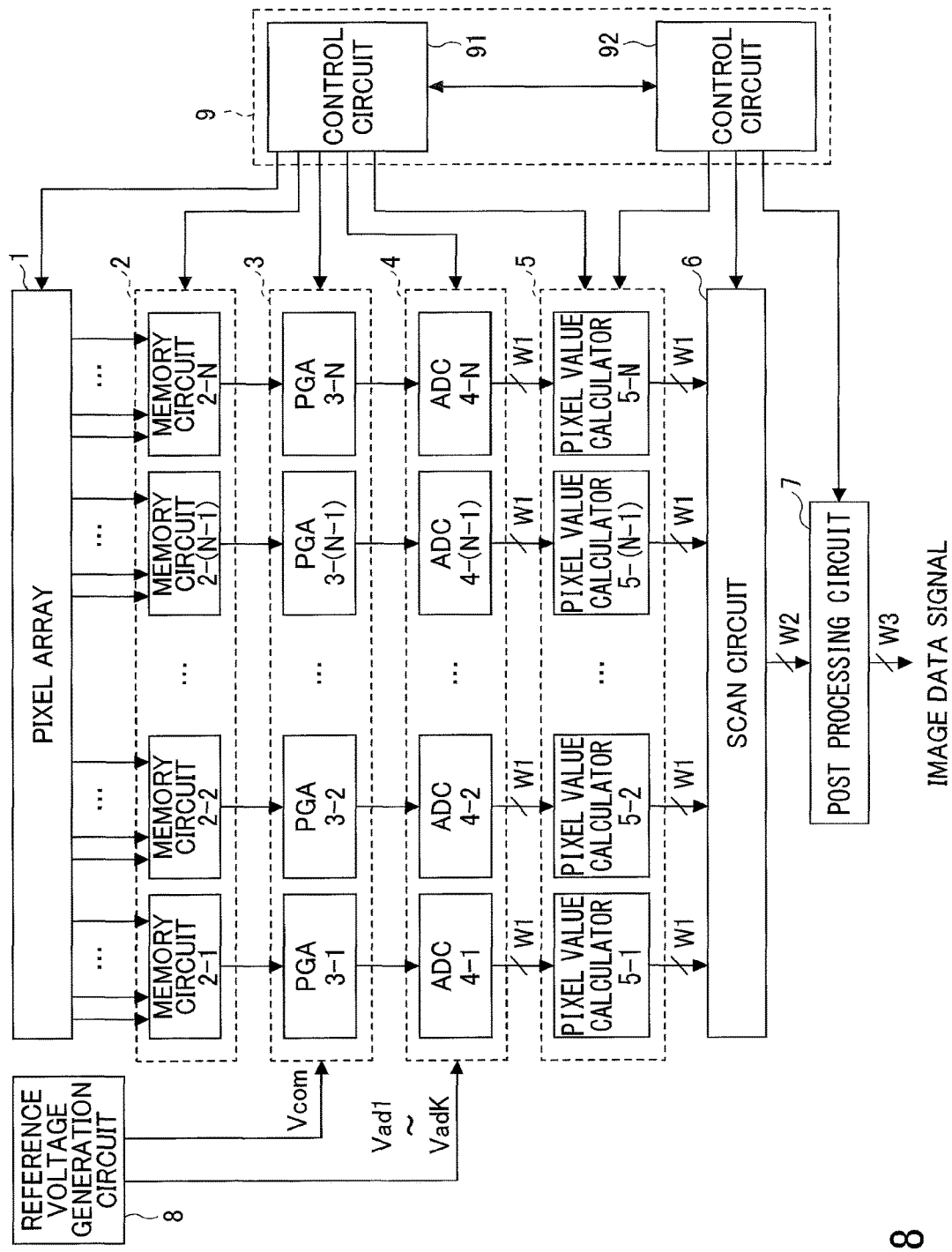
FIG. 28 is a block diagram depicting an example of a configuration of a control circuit, illustrated in FIG. 1.

FIG. 28 is a block diagram depicting an example of a configuration of the control circuit 9, illustrated in FIG. 1. The control circuit 9 includes a control circuit 91 and a control circuit 92 that operate as timing generators for generating timing signals for the other components, respectively. The control circuit 91 generates timing signals for the pixel array 1, the memory circuits 2-1 to 2-N, the PGA 3-1 to 3-N, the ADC 4-1 to 4-N, and the pixel value calculators 5-1 to 5-N. The control circuit 92 generates timing signals for the pixel value calculators 5-1 to 5-N and the scan circuit 6. In other words, the control circuit 91 generates timing signals for analog circuits and digital circuits that operate in synchronization with the analog circuits, and the control circuit 92 generates timing signals for digital circuits. The control circuits 91 and 92 mutually exchange synchronization signals, and operate in synchronization with each other. According to the configuration, illustrated in FIG. 28, to the pixel value calculators 5-1 to 5-N, both the timing signals from the control circuit 91 and the timing signals from the control circuit 92 are input. According to the configuration, illustrated in FIG. 28, an operation rate of a signal processing in the photoelectric conversion device, and an operation rate for outputting image data signals from the photoelectric conversion device can be separated from each other. Thus, a processing inside the photoelectric conversion device and a processing outside the photoelectric conversion device can be separated from each other, and an effect of an external environment of the photoelectric conversion device (such as a data transfer rate) on a performance of the signal processing inside the photoelectric conversion device can be reduced.

Figure 29:
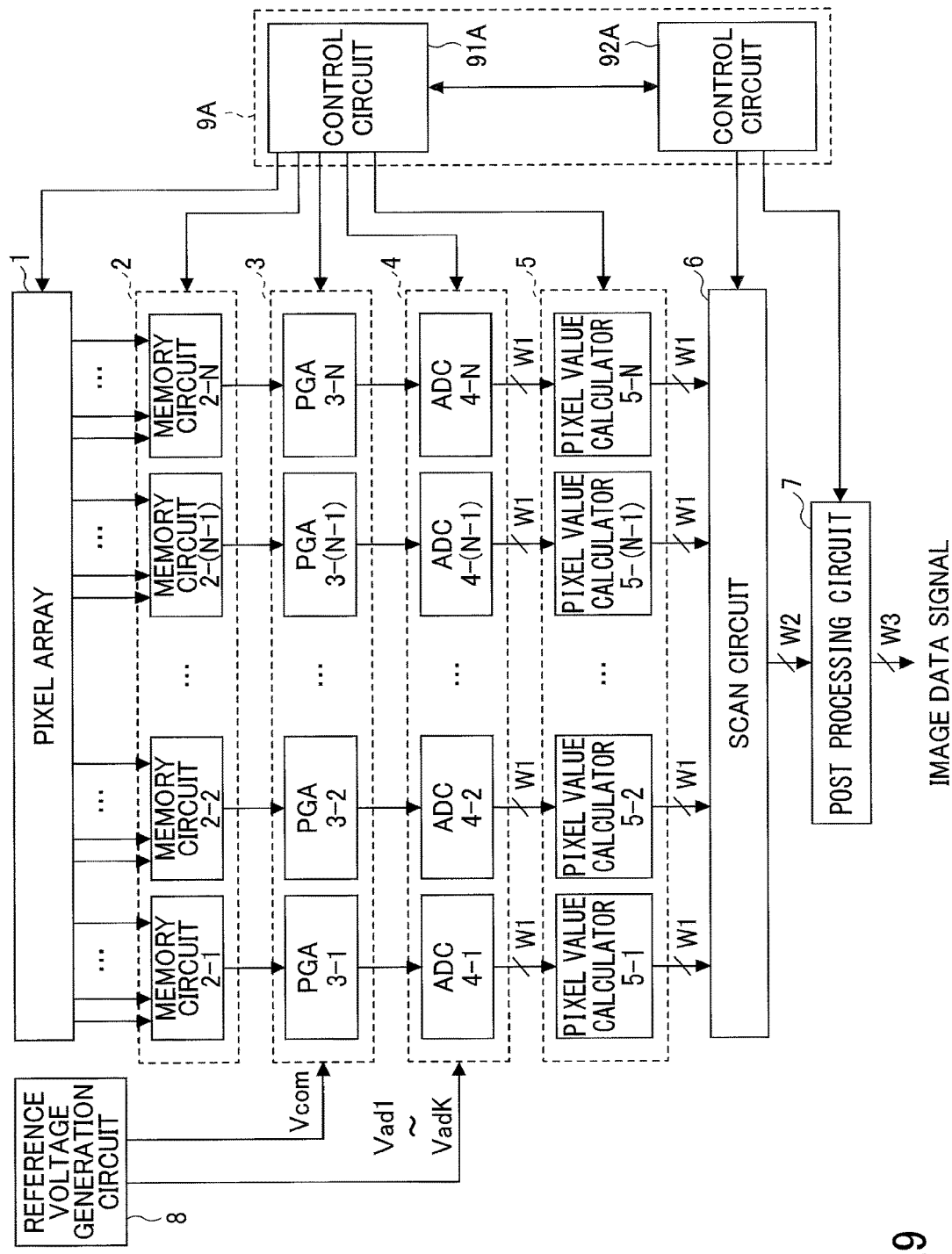
FIG. 29 is a block diagram depicting an example of a configuration of a control circuit of a photoelectric conversion device according to an eighth variation of the first embodiment.

FIG. 29 is a block diagram depicting an example of a configuration of a control circuit 9A of a photoelectric conversion device according to an eighth variation of the first embodiment. The control circuit 9A includes a control circuit 91A and a control circuit 92A that operate as timing generators for generating timing signals for the other components, respectively. The control circuit 91A generates timing signals for the pixel array 1, the memory circuits 2-1 to 2-N, the PGA 3-1 to 3-N, the ADC 4-1 to 4-N, and the pixel value calculators 5-1 to 5-N. The control circuit 92A generates timing signals for the scan circuit 6. The control circuits 91A and 92A mutually exchange synchronization signals, and operate in synchronization with each other. According to the configuration, illustrated in FIG. 29, in the same way as the configuration illustrated in FIG. 28, an effect of a data transfer rate on a performance of the signal processing inside the photoelectric conversion device can be reduced. According to the configuration, illustrated in FIG. 29, because the pixel value calculators 5-1 to 5-N do not use timing signals generated by different control circuits, the effect of separating the processing inside the photoelectric conversion device from the processing outside the photoelectric conversion device is greater than the configuration illustrated in FIG. 28.

The photoelectric conversion device according to the first embodiment has the following specific effects.

According to the embodiment, a photoelectric conversion device of a CMOS linear sensor, which can operate by a global shutter, which can effectively operate even in the case of including a plurality of linear arrays, and which can be easily integrated with peripheral circuits, although the cost is lower than the conventional one, can be provided.

According to the embodiment, a CMOS linear sensor of a digital output type, which has a proper specification that can be used as a scanner of a printer/MFP designed for offices, and has a function of signal processing or the like, in which a cost is reduced as much as possible, can be provided.

According to the embodiment, in the case where each line of an pixel array is separated into colors of R/G/B or the like, and a plurality of pixels are arranged in a column direction, a memory cell, for storing a photoelectric conversion value and a reset value, is connected to each pixel, and thereby a global shutter operation of the pixel array can be handled.

According to the embodiment, the memory cell includes separately a capacitor for the photoelectric conversion value and a capacitor for the reset value, and an operation of writing into the memory cell and an operation of reading out from the memory cell can be controlled independently. The memory circuit outputs photoelectric conversion values and reset values of a plurality of pixels in time series. The photoelectric conversion values and the reset values read out from the memory circuit are transmitted through the PGA and the ADC to the pixel value calculator, and processed by the pixel value calculator. Thus, an increase in a scale of circuits can be controlled appropriately.

According to the embodiment, because the PGA amplifies difference values between the photoelectric conversion values and the reset values, a quality of image data signals can be enhanced by correcting variations in offsets in the pixel array and the memory circuit, and signal levels of the image data signals can be made suitable for the AD conversion. Thus, performance degradation in the AD conversion can be minimized.

According to the embodiment, the ADC performs conversion for the offset value and the difference value for each pixel from analog values to digital values. Afterwards, the pixel value calculator corrects offsets of the PGA and the ADC included in the difference value. Thus, a variation in offsets that depend on a plurality of processing systems can be reduced, and a quality of image data signals can be enhanced.

According to the embodiment, for the image data, transmitted from the pixel value calculator to the scan circuit 6, respective colors are read out in parallel, and pixel values of the respective colors are read out in time series, depending on an arrangement of the pixels on the pixel array. The pixel values that are read out are transmitted to the post processing circuit, subjected to a variety of data processing, and output to the outside of the photoelectric conversion device.

According to the embodiment, because, in the scan circuit 6, the image data of the respective colors are output in parallel, and the pixel values of the respective colors are output in time series depending on the arrangement of the pixels on the pixel array, a rearrangement of pixel values or the like is unnecessary and a component for the rearrangement is not required.

According to the embodiment, the post processing circuit may correct differences in pixel values occurring due to the different characteristics in the processing systems. Moreover, the post processing circuit may multiply pixel values by coefficients of predetermined values, so as to transmit the pixel values without saturation, depending on the data width of the image data signals to be output. Moreover, the post processing circuit may perform a serialization process by time-division multiplexing, in order to make the data width of the image data signals to be output, smaller than the data width of the pixel values that are input. Thus, the data transmission cost can be reduced.

Second Embodiment

Figure 30:
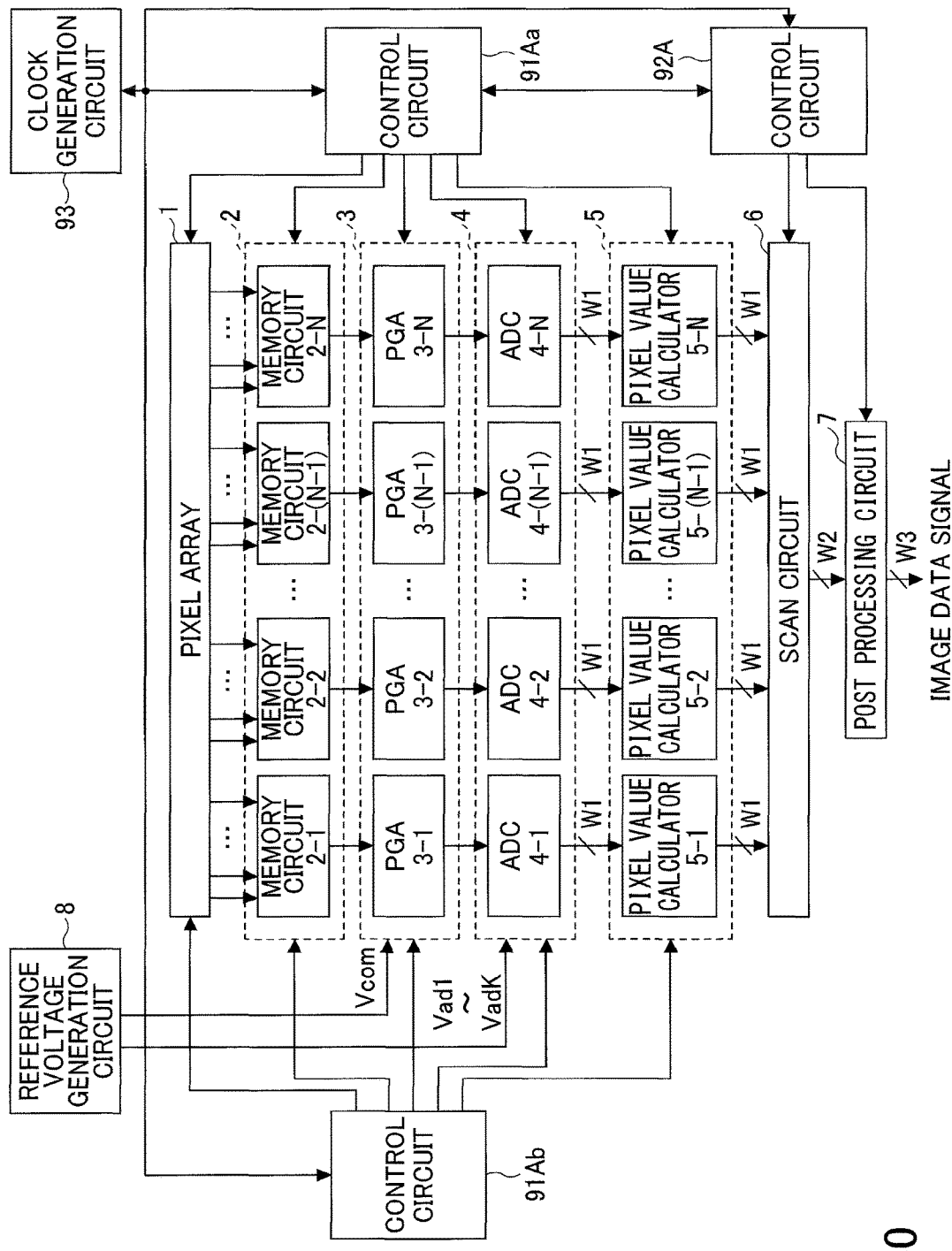
FIG. 30 is a block diagram depicting an example of a configuration of a photoelectric conversion device according to a second embodiment.

FIG. 30 is a block diagram depicting an example of a configuration of a photoelectric conversion device according to a second embodiment. The photoelectric conversion device, illustrated in FIG. 30, includes two control circuits 91Aa and 91Ab, each having the same configuration and the same function as the control circuit 91A, illustrated in FIG. 29, instead of the control circuit 91A. Each of the control circuits 91Aa and 91Ab operates as a timing generator for generating the same timing signal for a pixel array 1, memory circuits 2-1 to 2-N, PGA 3-1 to 3-N, ADC 4-1 to 4-N, and a pixel value calculators 5-1 to 5-N. The control circuits 91Aa and 91Ab mutually exchange synchronization signals, and operate in synchronization with each other. The photoelectric conversion device, illustrated in FIG. 30, further includes a clock generation circuit 93 for generating a common clock signal for the control circuits 91Aa, 91Ab, and 92A. The clock generation circuit 93 generates a trigger signal for staring operations of the control circuits 91Aa and 91Ab. The control circuit 92A and the control circuit 91Aa operate in synchronization with each other, and the control circuit 91Aa and the control circuit 91Ab operate in synchronization with each other, and the control circuit 92A and the control circuit 91Ab operate in synchronization with each other.

Figure 31:
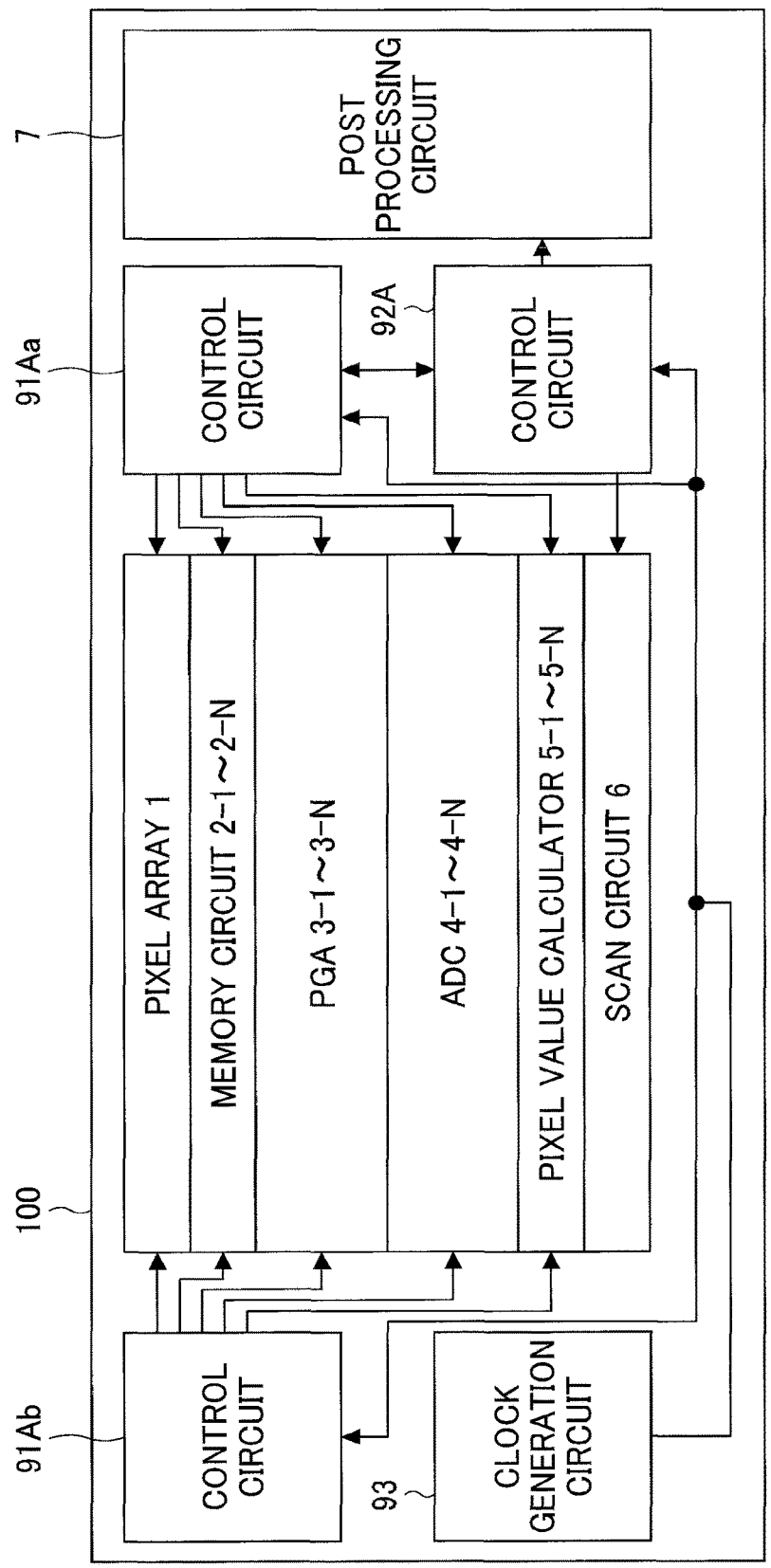
FIG. 31 is a diagram depicting an example of a layout of components of the photoelectric conversion device, illustrated in FIG. 30.

FIG. 31 is a diagram depicting an example of a layout of components of the photoelectric conversion device, illustrated in FIG. 30. In the photoelectric conversion device 100, illustrated in FIG. 31, the memory circuits 2-1 to 2-N, the PGA 3-1 to 3-N, the ADC 4-1 to 4-N, and the pixel value calculators 5-1 to 5-N are arranged so as to be moved away from the pixel array 1, in this order, in a direction orthogonal to the longitudinal direction of the linear array. The pixel array 1, the memory circuits 2-1 to 2-N, the PGA 3-1 to 3-N, the ADC 4-1 to 4-N, and the pixel value calculators 5-1 to 5-N have, corresponding to both ends of the linear array, first end portions (end portions on the left in FIG. 31) and second end portions (end portions on the right in FIG. 31). The control circuit 91Aa is connected to the first end portions, and the control circuit 91Ab is connected to the second end portions. Lengths of signal lines from the control circuit 91Aa to the first end portions are the same as lengths of signal lines from the control circuit 91Ab to the second end portions. The control circuit 92A sends timing signals to the scan circuit 6 and the post processing circuit 7. In order to make lengths of signal lines from the clock generation circuit 93 to the control circuits 91Aa and 91Ab the same, the signal lines proceed from the clock generation circuit 93 to around a center in the longitudinal direction of the pixel array 1 or the like, and bifurcate at the center and reach the control circuits 91Aa, 91Ab, and 92A.

According to the configuration illustrated in FIGS. 30 and 31, a difference in timing signals that may occur due to an arrangement on an elongated components, specific to the linear sensor, can be reduced.

Third Embodiment

Figure 32:
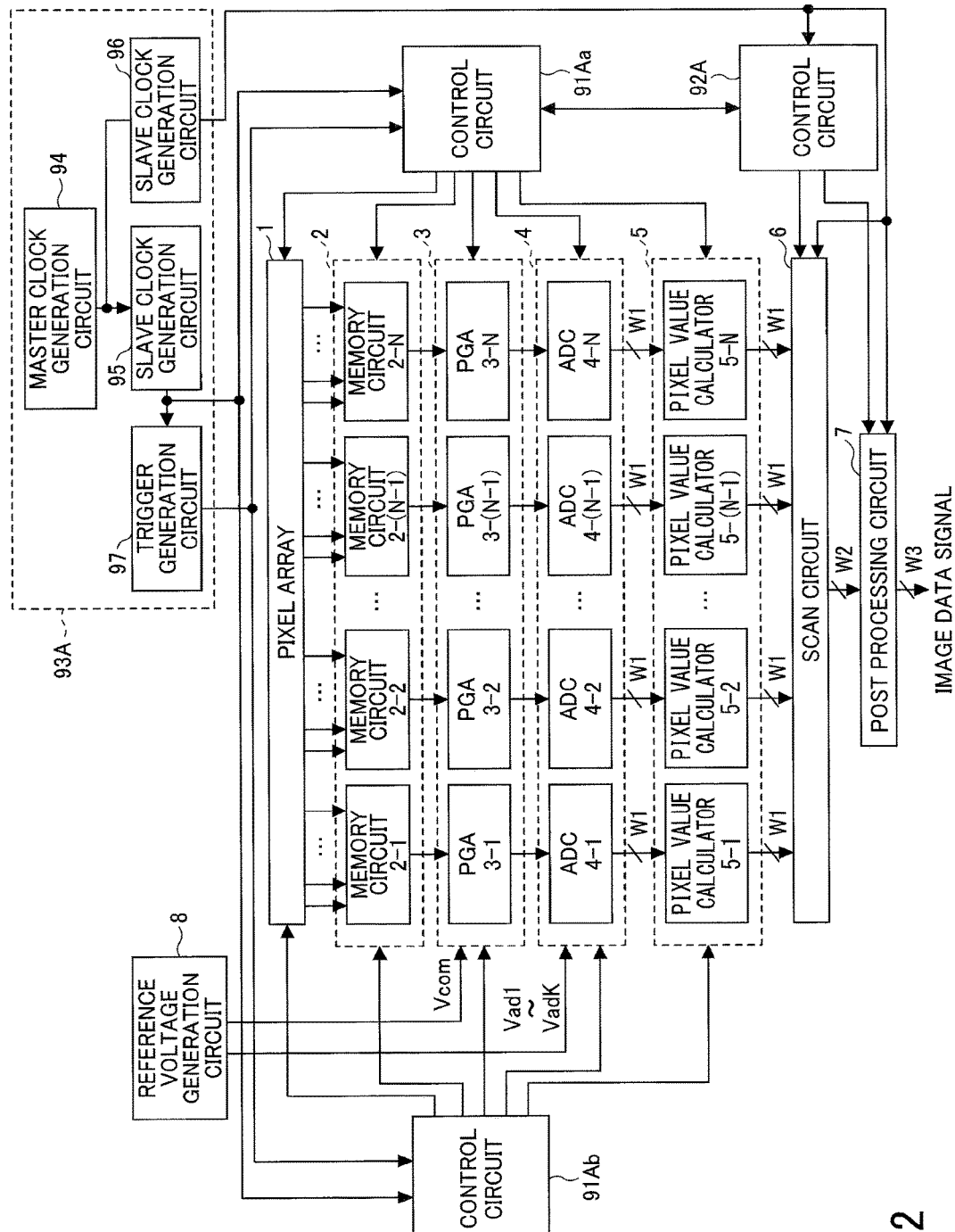
FIG. 32 is a block diagram depicting an example of a configuration of a photoelectric conversion device according to a third embodiment.

FIG. 32 is a block diagram depicting an example of a configuration of a photoelectric conversion device according to a third embodiment. The photoelectric conversion device, illustrated in FIG. 32, includes a clock generation circuit 93A, instead of the clock generation circuit 93, illustrated in FIG. 30. The clock generation circuit 93A includes a master clock generation circuit 94, slave clock generation circuits 95 and 96, and a trigger generation circuit 97. The slave clock generation circuit 95 generates a first clock signal based on a master clock signal generated by the master clock generation circuit 94. The slave clock generation circuit 96 generates a second clock signal based on a master clock signal generated by the master clock generation circuit 94. The control circuits 91Aa and 91Ab operate based on the first clock signal, and the control circuit 92A operates based on the second clock signal. Moreover, the trigger generation circuit 97 generates a trigger signal based on the first clock signal generated by the slave clock generation circuit 95. The trigger signal has a rising edge or a falling edge for each constant period of the first clock signal. According to FIG. 32, a clock signal, for analog circuits and digital circuits that operate in synchronization with the analog circuits, and a clock signal, for digital circuits, are generated separately.

Figure 33:
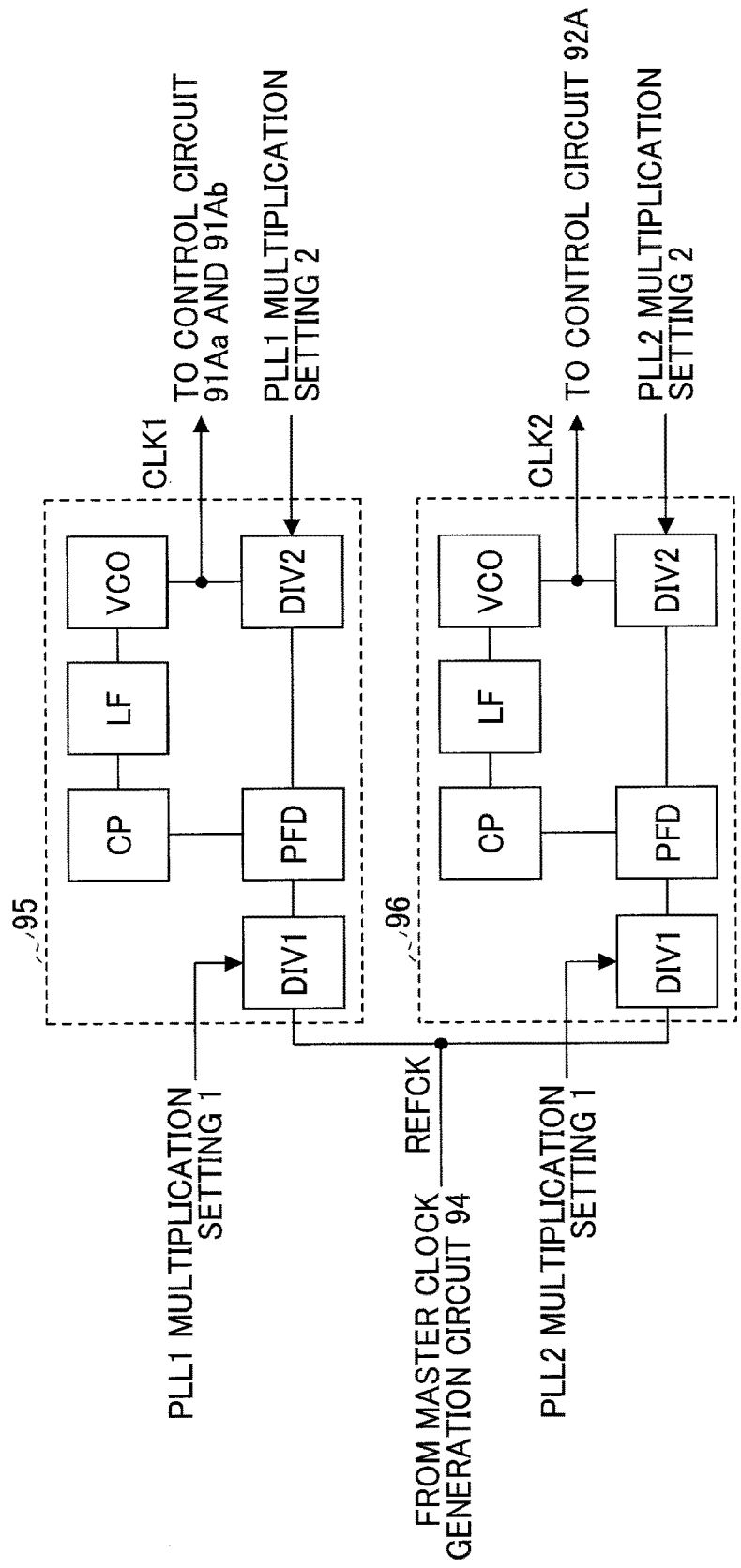
FIG. 33 is a block diagram depicting an example of a configuration of a slave clock generation circuit, illustrated in FIG. 32.

FIG. 33 is a block diagram depicting an example of a configuration of the slave clock generation circuits 95 and 96, illustrated in FIG. 32. Each of the slave clock generation circuits 95 and 96 is a frequency multiplying circuit by using a phase lock loop (PLL). Each of the slave clock generation circuits 95 and 96 includes frequency dividers DIV1 and DIV2, a phase frequency detector PFD, a charge pump CP, a loop filter LF, and a voltage control oscillator VCO. To each of the slave clock generation circuits 95 and 96, a master clock signal REFCK is input from the master clock generation circuit 94. For the frequency dividers DIV1 and DIV2 of the slave clock generation circuit 95, division ratios for setting a first multiplication rate (PLL 1 multiplication settings 1 and 2) are set, respectively. For the frequency dividers DIV1 and DIV2 of the slave clock generation circuit 96, division ratios for setting a second multiplication rate that is different from the first multiplication rate (PLL 2 multiplication settings 1 and 2) are set, respectively. In the slave clock generation circuit 95, the master clock signal REFCK that is input is divided at the frequency divider DIV1, and the clock signal CLK1 to be output from the slave clock generation circuit 95 is divided at the frequency divider DIV2. The signals divided at the frequency dividers DIV1 and DIV2, respectively, are input to the phase frequency detector PFD. The phase frequency detector PFD detects a phase shift between two input signals (positive or negative) or a frequency shift (high or low), and sends the shift to the charge pump CP. The charge pump CP generates charges so as to correct the input signals, the charges are converted into an electric voltage at the loop filter LF, a proper frequency characteristic is added to the electric voltage, and the electric voltage is output to the voltage control oscillator VCO. The voltage control oscillator VCO generates an oscillation frequency that changes in accordance with an input electric voltage. The aforementioned operations are repeated until the output signal from the phase frequency detector PFD becomes stable, and finally, the slave clock generation circuit 95 outputs the clock signal CLK1 in which the master clock signal REFCK is multiplied with a multiplication rate that is determined by the division ratio of the frequency dividers DIV1 and DIV2. The slave clock generation circuit 96 is configured in the same way as the slave clock generation circuit 95.

In this way, the clock signal CLK1 is generated by multiplying the master clock signal REFCK with the first multiplication rate, and a clock signals CLK2 is generated by multiplying the master clock signal REFCK with the second multiplication rate.

According to the configurations, illustrated in FIG. 32 and FIG. 33, by using the clock signals CLK1 and CLK2, that are different from each other, a clock signal, for a signal processing in the photoelectric conversion device, and a clock signal, for outputting an image data signal from the photoelectric conversion device, can be separated from each other. Thus, a degree of freedom of data transmission is enhanced.

Furthermore, by generating the clock signals CLK1 and CLK2, which are different from each other, from the master clock signal REFCK, the clock signal for the signal processing in the photoelectric conversion device and the clock signal for outputting an image data signal from the photoelectric conversion device are clearly separated. Thus, the degree of freedom of data transmission is further enhanced.

Figure 34:
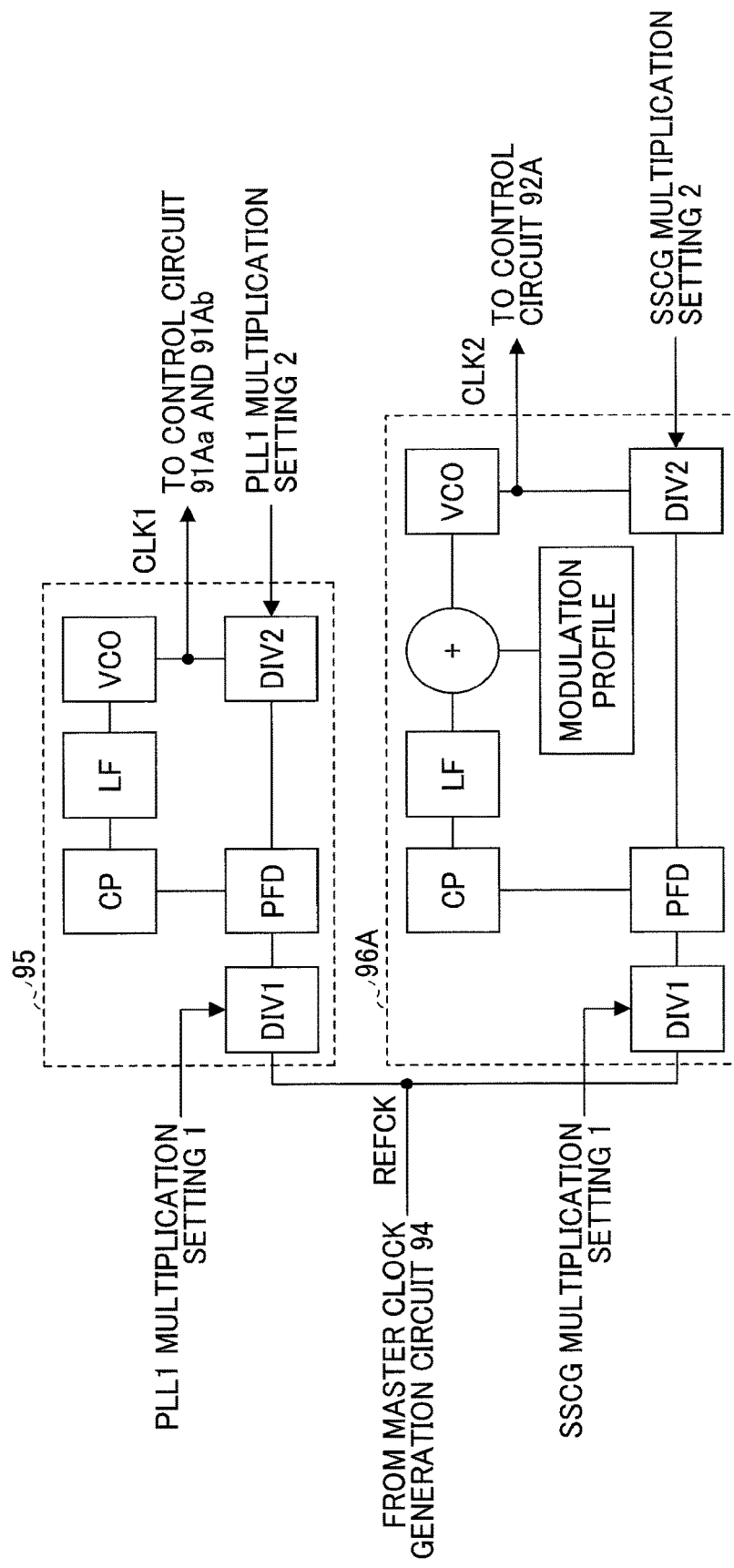
FIG. 34 is a block diagram depicting an example of a configuration of a slave clock generation circuit of a photoelectric conversion device according to a variation of the third embodiment.

FIG. 34 is a block diagram depicting an example of a configuration of the slave clock generation circuits 95 and 96 of the photoelectric conversion device according to a variation of the third embodiment. The configuration illustrated in FIG. 34 includes a slave clock generation circuit 96A, instead of the slave clock generation circuit 96 illustrated in FIG. 33. The slave clock generation circuit 96A is a spread spectrum clock generation (SSCG) circuit. The slave clock generation circuit 96A includes, in addition to the components of the slave clock generation circuit 96 illustrated in FIG. 33, a component for adding a modulation profile for spreading spectrum to the clock signal CLK2. To each of the slave clock generation circuits 95 and 96A, the master clock signal REFCK is input from the master clock generation circuit 94. For the frequency dividers DIV1 and DIV2 of the slave clock generation circuit 95, division ratios for setting a first multiplication rate (PLL 1 multiplication settings 1 and 2) are set, respectively. For the frequency dividers DIV1 and DIV2 of the slave clock generation circuit 96A, division ratios for setting a second multiplication rate that is different from the first multiplication rate (SSCG multiplication settings 1 and 2) are set, respectively. The spread spectrum clock generation circuit operates in almost the same way as the phase lock loop, but is different from the phase lock loop, in that the output signal from the loop filter LF is overlapped with the modulation profile of the clock signals CLK2, and is input to the voltage control oscillator VCO. In this case, the frequency characteristics of the loop filter LF are required to be low, so that an influence of the modulation profile on a waveform falls within a tolerable range. As described above, the clock signal CLK1 is a signal, in which the master clock signal REFCK is multiplied with a predetermined multiplication rate. Moreover, the clock signal CLK2 is a spread spectrum clock signal having a frequency of a signal, in which the master clock signal REFCK is multiplied with a predetermined multiplication rate, as an average frequency, and frequency modulated in accordance with the modulation profile.

When at least one of the clock signals CLK1 and CLK2 is a spread spectrum clock signal, an unnecessary radiation noise can be controlled, and expenses associated with EMI can be reduced. When the clock signal for the signal processing in the photoelectric conversion device (clock signal for control circuits 91Aa and 91Ab) is subjected to the spread spectrum treatment, the characteristics of an image data signal may be degraded. Thus, performing the spread spectrum treatment for the clock signal for outputting the image data signal from the photoelectric conversion device is effective, from the standpoint of the EMI.

According to FIG. 32, the trigger signal is generated based on the clock signal that is generated by one of the two slave clock generation circuits. When the trigger signal is generated from the clock signal that is subjected to the spread spectrum treatment, cycles of starting the operations of the control circuits 91Aa and 91Ab vary, depending on the trigger signal. For example, in the case of applying the photoelectric conversion device to an image reading device, a characteristic of reading document is degraded. With the clock signal or the master clock signal, which is not subjected to the spread spectrum modulation, it is not necessary to be concerned about the defect. Thus, the trigger signal is generated based on a clock signal of the clock signals CLK1 and CLK2, that is not subjected to the spread spectrum treatment. The trigger signal may be generated based on the master clock signal REFCK.

Fourth Embodiment

Figure 35:
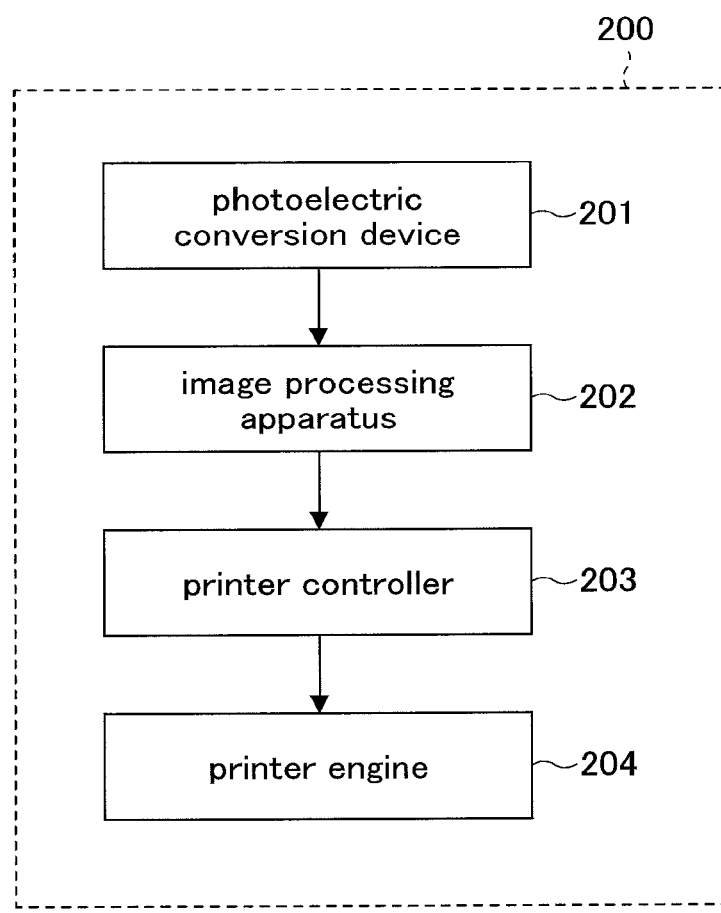
FIG. 35 is a block diagram depicting an example of a configuration of an image forming apparatus according to a fourth embodiment.

FIG. 35 is a block diagram depicting an example of a configuration of an image forming apparatus 200 according to a fourth embodiment. The image forming apparatus 200 includes a photoelectric conversion device 201, an image processing apparatus 202, a printer controller 203, and a printer engine 204. The photoelectric conversion device 201 is any one of the photoelectric conversion devices described in the first to third embodiments. The image forming apparatus 200 is, for example, a scanner (image reading device), which processes an image imported by the photoelectric conversion device 201 using the image processing apparatus 202. Moreover, the image forming apparatus 200 is, for example, a copying machine that prints an image imported by the photoelectric conversion device 201 using the printer controller 203 and the printer engine 204.

The embodiments and variations thereof, as described above, may be combined.

The photoelectric conversion device, an image reading device and image forming apparatus according to the embodiments of the present invention are characterized by including the following configurations.

According to a photoelectric conversion device in a first aspect, the photoelectric conversion device includes a pixel array provided with a linear array or a plurality of linear arrays, each includes a plurality of pixels that are linearly arranged; and a plurality of memory circuits, each including a plurality of memory cells, the plurality of pixels in the pixel array are connected one-to-one to the plurality of memory cells of the plurality of memory circuits, each of the plurality of pixels alternately outputs a photoelectric conversion value indicating an electric voltage generated in accordance with a light amount of an incident light entering the pixel, and a reset value indicating a reference charge of the pixel, to the memory cell corresponding to the pixel, each of the plurality of memory cells temporarily stores the photoelectric conversion value and the reset value output from the pixel corresponding to the memory cell, and each of the plurality of memory circuits outputs the photoelectric conversion values and the reset values stored in corresponding memory cells of the plurality of memory cells of the memory circuit, in an order determined in advance.

According to a photoelectric conversion device in a second aspect, in the photoelectric conversion device in the first aspect, the pixel array includes a plurality of linear arrays, each of the plurality of linear arrays corresponds to one of a plurality of colors that are different from each other, and each of the plurality of memory circuits is connected, for each of the plurality of linear arrays, to at least one pixel in the linear array.

According to a photoelectric conversion device in a third aspect, in the photoelectric conversion device in the first or second aspect, for each of the plurality of memory circuits, the plurality of memory cells of the memory circuit are connected to a plurality of pixels in the pixel array that are adjacent to each other.

According to a photoelectric conversion device in a fourth aspect, in any one of the photoelectric conversion devices in the first to third aspects, the photoelectric conversion device further includes a plurality of amplifiers, each of the plurality of amplifiers being connected to a corresponding memory circuit of the plurality of memory circuits, a plurality of analog/digital converters, each of the plurality of analog/digital converters being connected to a corresponding amplifier of the plurality of amplifiers, and a plurality of pixel value calculators, each of the plurality of pixel value calculators being connected to a corresponding analog/digital converter of the plurality of analog/digital converters, each of the plurality of amplifiers amplifies a difference value between the photoelectric conversion value and the reset value, for each pixel, that are output from the corresponding memory circuit connected to the amplifier, and an offset value for the amplifier based on a first reference electric voltage, and outputs alternately the difference value and the offset value, each of the plurality of analog/digital converters, based on a plurality of second reference electric voltages, which are different from each other, converts the difference value and the offset value, output from the corresponding amplifier connected to the analog/digital converter, from an analog value to a digital value, and outputs the difference value and the offset value, each of the plurality of pixel value calculators, based on the difference value and the offset value, output from the corresponding analog/digital converter connected to the pixel value calculator, calculates a pixel value of each pixel, and outputs the pixel value.

According to a photoelectric conversion device in a fifth aspect, in the photoelectric conversion device in the fourth aspect, each of the plurality of amplifiers sets a gain which is variable according to a color of a linear array including pixels that output the photoelectric conversion values and the reset values.

According to a photoelectric conversion device in a sixth aspect, in the photoelectric conversion device in the fourth or fifth aspect, the photoelectric conversion device further includes a reference voltage source that generates the first reference electric voltage and the plurality of second reference electric voltages based on a common third reference voltage.

According to a photoelectric conversion device in a seventh aspect, in any one of the photoelectric conversion devices in the fourth to sixth aspects, the photoelectric conversion device further includes a scan circuit that temporarily stores pixel values of the plurality of pixels, which are each output from a corresponding pixel value calculator of the plurality of pixel value calculators, and outputs at least a part of the pixel values of the plurality of pixels in a specified order.

According to a photoelectric conversion device in a eighth aspect, in the photoelectric conversion device in the seventh aspect, the scan circuit outputs pixel values of a plurality of pixels in a specified range in the pixel array, in sequence.

According to a photoelectric conversion device in a ninth aspect, in the photoelectric conversion device in the seventh aspect, the scan circuit outputs pixel values of a plurality of specified pixels in the pixel array, in sequence.

According to a photoelectric conversion device in a tenth aspect, in the photoelectric conversion device in the eighth or ninth aspect, the scan circuit outputs pixel values of the plurality of pixels, in an order where the plurality of pixels are arranged along a specified direction of the pixel array, in sequence.

According to a photoelectric conversion device in an eleventh aspect, in any one of the photoelectric conversion devices in the seventh to tenth aspects, the photoelectric conversion device further includes at least one timing generator that generates a timing signal for the pixel array, the plurality of memory circuits, the plurality of amplifiers, the plurality of analog/digital converters, the plurality of pixel value calculators, and the scan circuit.

According to a photoelectric conversion device in a twelfth aspect, in the photoelectric conversion device in the eleventh aspect, the timing generator includes a first timing generator that generates a timing signal for the pixel array, the plurality of memory circuits, the plurality of amplifiers, the plurality of analog/digital converters, and the plurality of pixel value calculators; and a second timing generator that generates a timing signal for the plurality of pixel value calculators and the scan circuit, and the first timing generator and the second timing generator operate in synchronization with each other.

According to a photoelectric conversion device in a thirteenth aspect, in the photoelectric conversion device in the eleventh aspect, the timing generator includes a first timing generator that generates a timing signal for the pixel array, the plurality of memory circuits, the plurality of amplifiers, the plurality of analog/digital converters, and the plurality of pixel value calculators; and a second timing generator that generates a timing signal for the scan circuit, and the first timing generator and the second timing generator operate in synchronization with each other.

According to a photoelectric conversion device in a fourteenth aspect, in the photoelectric conversion device in the twelfth or thirteenth aspect, the plurality of memory circuits configure a first circuit group, arranged along a longitudinal direction of the linear array, the plurality of amplifiers configure a second circuit group, arranged along the longitudinal direction of the linear array, the plurality of analog/digital converters configure a third circuit group, arranged along the longitudinal direction of the linear array, the plurality of pixel values calculators configure a fourth circuit group, arranged along the longitudinal direction of the linear array, the first to fourth circuit groups are arranged so as to become more distant from the pixel array, in this order, in a direction orthogonal to the longitudinal direction of the linear array, the pixel array and the first to fourth circuit groups have first end portions and second end portions corresponding to both ends of the linear array, the first timing generator includes a third timing generator and a fourth timing generator which are configured so as to each generate the same timing signal, the third timing generator and the fourth timing generator operate in synchronization with each other, the third timing generator is connected to the first end portions of the pixel array and of the first to fourth circuit groups, the fourth timing generator is connected to the second end portions of the pixel array and of the first to fourth circuit groups, and a length of a signal line from the third timing generator to the first end portions of the pixel array and of the first to fourth circuit groups, is the same as a length of a signal line from the fourth timing generator to the second end portions of the pixel array and of the first to fourth circuit groups.

According to a photoelectric conversion device in a fifteenth aspect, in any one of the photoelectric conversion devices in the twelfth to fourteenth aspects, the first timing generator operates based on a first clock signal, and a second timing generator operates based on a second clock signal.

According to a photoelectric conversion device in a sixteenth aspect, in the photoelectric conversion device in the fifteenth aspect, the first clock signal is generated by multiplying a third clock signal with a first multiplication rate, and the second clock signal is generated by multiplying the third clock signal with a second multiplication rate.

According to a photoelectric conversion device in a seventeenth aspect, in the photoelectric conversion device in the sixteenth aspect, at least one of the first clock signal and the second clock signal is subjected to a spread spectrum modulation.

According to a photoelectric conversion device in an eighteenth aspect, in the photoelectric conversion device in the seventeenth aspect, the first timing generator starts an operation in accordance with a trigger signal generated based on a clock signal, from among the first clock signal and the second clock signal, that is not subjected to the spread spectrum modulation, or based on the third clock signal.

According to an image reading device in a nineteenth aspect, in the image reading device including a photoelectric conversion device, the photoelectric conversion device includes a pixel array provided with a linear array or a plurality of linear arrays, each including a plurality of pixels that are linearly arranged; and a plurality of memory circuits, each including a plurality of memory cells, the plurality of pixels in the pixel array are connected one-to-one to the plurality of memory cells of the plurality of memory circuits, each of the plurality of pixels alternately outputs a photoelectric conversion value indicating an electric voltage generated in accordance with a light amount of an incident light entering the pixel, and a reset value indicating a reference charge of the pixel, to the memory cell corresponding to the pixel, each of the plurality of memory cells temporarily stores the photoelectric conversion value and the reset value output from the pixel corresponding to the memory cell, and each of the plurality of memory circuits outputs the photoelectric conversion values and the reset values stored in corresponding memory cells of the plurality of memory cells, of the memory circuit, in an order determined in advance.

According to an image forming apparatus in a twentieth aspect, in the image forming apparatus including a photoelectric conversion device, the photoelectric conversion device includes a pixel array provided with a linear array or a plurality of linear arrays, each including a plurality of pixels that are linearly arranged; and a plurality of memory circuits, each including a plurality of memory cells, the plurality of pixels in the pixel array are connected one-to-one to the plurality of memory cells of the plurality of memory circuits, each of the plurality of pixels alternately outputs a photoelectric conversion value indicating an electric voltage generated in accordance with a light amount of an incident light entering the pixel, and a reset value indicating a reference charge of the pixel, to the memory cell corresponding to the pixel, each of the plurality of memory cells temporarily stores the photoelectric conversion value and the reset value output from the pixel corresponding to the memory cell, and each of the plurality of memory circuits outputs the photoelectric conversion values and the reset values stored in corresponding memory cells of the plurality of memory cells, of the memory circuit, in an order determined in advance.

REFERENCE SIGNS LIST 1, 1A, 1B pixel array
2, 2-1 to 2-N, 2A-1 to 2A-N, 2B-1 to 2B-N memory circuit
3, 3-1 to 3-N programmable gain amplifier (PGA)
4, 4-1 to 4-N analog/digital converter (ADC)
5, 5-1 to 5-N pixel value calculator
6, 6A, 6B scan circuit
7 post processing circuit
8, 8A reference voltage generation circuit
9, 9A control circuit
11, 11A pixel
12B, 12Ba, 12Bb, 12Bc linear array of B pixel
12G, 12Ga, 12Gb, 12Gc linear array of G pixel
12R, 12Ra, 12Rb, 12Rc linear array of R pixel
PD photodiode
QTX, QRT, QSF, QSL switching element
21-1 to 21-M memory cell
Mwt, Mrd, Mres, Msig, Mcr, Mo switching element
Cres, Csig capacitor
Iib, Iob electric current source
Vcr electric voltage source
31 operation amplifier
SWs1 to SWs3, SWf1 to SWf3, SWrst switching element
Cs1 to Cs3, Cf1 to Cf3 capacitor
61-1 to 61-N latch circuit 62 range scan circuit
63 range specifying circuit
64, 66 pixel scan circuit
65 pixel specifying circuit
LH1 to LHM latch
RS1 to RSM, SS1 to SSM shift register
SELa1 to SELaM, SELb1 to SELbM selector
81 operation amplifier
82 ladder resistance circuit
83, 83-1 to 83-K selector
84, 84-1 to 84-K buffer circuit
85a, 85b selector
86a, 86b buffer circuit
87 ladder resistance circuit
Rs, Rf, Rt, Rb resistor
Vref electric voltage source
91, 91A, 91Aa, 91Ab, 92, 92A control circuit
93, 93A clock generation circuit
94 master clock generation circuit
95, 96, 96A slave clock generation circuit
97 trigger generation circuit
100 photoelectric conversion device
200 image forming apparatus
201 photoelectric conversion device
202 image processing apparatus
203 printer controller
204 printer engine

What is claimed is:

1. A photoelectric conversion device comprising:
a pixel array provided with a linear array or a plurality of linear arrays, each linear array including a plurality of pixels that are linearly arranged;
a plurality of memory circuits, each including a plurality of memory cells;
a plurality of amplifiers, each of the plurality of amplifiers being connected to a corresponding memory circuit of the plurality of memory circuits;
a plurality of analog/digital converters, each of the plurality of analog/digital converters being connected to a corresponding amplifier of the plurality of amplifiers; and
a plurality of pixel value calculators, each of the plurality of pixel value calculators being connected to a corresponding analog/digital converter of the plurality of analog/digital converters,
wherein the plurality of pixels in the pixel array are connected one-to-one to the plurality of memory cells of the plurality of memory circuits,
wherein each of the plurality of pixels alternately outputs a photoelectric conversion value indicating an electric voltage generated in accordance with a light amount of an incident light entering the pixel, and a reset value indicating a reference charge of the pixel, to the memory cell corresponding to the pixel,
wherein each of the plurality of memory cells temporarily stores the photoelectric conversion value and the reset value output from the pixel corresponding to the memory cell,
wherein each of the plurality of memory circuits outputs the photoelectric conversion values and the reset values stored in corresponding memory cells of the plurality of memory cells of the memory circuit, in an order determined in advance,
wherein each of the plurality of amplifiers amplifies a difference value between the photoelectric conversion value and the reset value, for each pixel, that are output from the corresponding memory circuit connected to the amplifier, and an offset value for the amplifier based on a first reference electric voltage, and outputs alternately the difference value and the offset value,
wherein each of the plurality of analog/digital converters, based on a plurality of second reference electric voltages, which are different from each other, converts the difference value and the offset value, output from the corresponding amplifier connected to the analog/digital converter, from an analog value to a digital value, and outputs the difference value and the offset value, and
wherein each of the plurality of pixel value calculators, based on the difference value and the offset value, output from the corresponding analog/digital converter connected to the pixel value calculator, calculates a pixel value of each pixel, and outputs the pixel value.

2. The photoelectric conversion device according to claim 1, wherein each of the plurality of amplifiers sets a gain which is variable according to a color of a linear array including pixels that output the photoelectric conversion values and the reset values.

3. The photoelectric conversion device according to claim 1, further comprising:
a reference voltage source configured to generate the first reference electric voltage and the plurality of second reference electric voltages based on a common third reference voltage.

4. The photoelectric conversion device according to claim 1, further comprising:
a scan circuit configured to temporarily store pixel values of the plurality of pixels, which are each output from a corresponding pixel value calculator of the plurality of pixel value calculators, and output at least a part of the pixel values of the plurality of pixels in a specified order.

5. The photoelectric conversion device according to claim 4, wherein the scan circuit outputs pixel values of a plurality of pixels in a specified range in the pixel array, in sequence.

6. The photoelectric conversion device according to claim 5, wherein the scan circuit outputs pixel values of the plurality of pixels, in an order where the plurality of pixels are arranged along a specified direction of the pixel array, in sequence.

7. The photoelectric conversion device according to claim 4, wherein the scan circuit outputs pixel values of a plurality of specified pixels in the pixel array, in sequence.

8. The photoelectric conversion device according to claim 4, further comprising:
at least one timing generator configured to generate a timing signal for the pixel array, the plurality of memory circuits, the plurality of amplifiers, the plurality of analog/digital converters, the plurality of pixel value calculators, and the scan circuit.

9. The photoelectric conversion device according to claim 8, wherein the timing generator includes
a first timing generator configured to generate a timing signal for the pixel array, the plurality of memory circuits, the plurality of amplifiers, the plurality of analog/digital converters, and the plurality of pixel value calculators; and
a second timing generator configured to generate a timing signal for the plurality of pixel value calculators and the scan circuit,
wherein the first timing generator and the second timing generator operate in synchronization with each other.

10. The photoelectric conversion device according to claim 9, wherein the plurality of memory circuits configure a first circuit group, arranged along a longitudinal direction of the linear array, wherein the plurality of amplifiers configure a second circuit group, arranged along the longitudinal direction of the linear array, wherein the plurality of analog/digital converters configure a third circuit group, arranged along the longitudinal direction of the linear array, wherein the plurality of pixel value calculators configure a fourth circuit group, arranged along the longitudinal direction of the linear array, wherein the first to fourth circuit groups are arranged so as to become more distant from the pixel array, in this order, in a direction orthogonal to the longitudinal direction of the linear array, wherein the pixel array and the first to fourth circuit groups have first end portions and second end portions corresponding to both ends of the linear array, wherein the first timing generator includes a third timing generator and a fourth timing generator which are each configured so as to generate the same timing signal, wherein the third timing generator and the fourth timing generator operate in synchronization with each other, wherein the third timing generator is connected to the first end portions of the pixel array and of the first to fourth circuit groups, wherein the fourth timing generator is connected to the second end portions of the pixel array and of the first to fourth circuit groups, and wherein a length of a signal line from the third timing generator to the first end portions of the pixel array and of the first to fourth circuit groups, is the same as a length of a signal line from the fourth timing generator to the second end portions of the pixel array and of the first to fourth circuit groups.

11. The photoelectric conversion device according to claim 8, wherein the timing generator includes a first timing generator configured to generate a timing signal for the pixel array, the plurality of memory circuits, the plurality of amplifiers, the plurality of analog/digital converters, and the plurality of pixel value calculators; and a second timing generator configured to generate a timing signal for the scan circuit, wherein the first timing generator and the second timing generator operate in synchronization with each other.

12. The photoelectric conversion device according to claim 9, wherein the first timing generator operates based on a first clock signal, and a second timing generator operates based on a second clock signal.

13. The photoelectric conversion device according to claim 12, wherein the first clock signal is generated by multiplying a third clock signal with a first multiplication rate, and the second clock signal is generated by multiplying the third clock signal with a second multiplication rate.

14. The photoelectric conversion device according to claim 13, wherein at least one of the first clock signal and the second clock signal is subjected to a spread spectrum modulation.

15. The photoelectric conversion device according to claim 14, wherein the first timing generator starts an operation in accordance with a trigger signal generated based on a clock signal, from among the first clock signal and the second clock signal, that is not subjected to the spread spectrum modulation, or based on the third clock signal.

16. An image reading device comprising a photoelectric conversion device, wherein the photoelectric conversion device includes a pixel array provided with a linear array or a plurality of linear arrays, each linear array including a plurality of pixels that are linearly arranged;

a plurality of memory circuits, each including a plurality of memory cells;

a plurality of amplifiers, each of the plurality of amplifiers being connected to a corresponding memory circuit of the plurality of memory circuits;

a plurality of analog/digital converters, each of the plurality of analog/digital converters being connected to a corresponding amplifier of the plurality of amplifiers; and a plurality of pixel value calculators, each of the plurality of pixel value calculators being connected to a corresponding analog/digital converter of the plurality of analog/digital converters, wherein the plurality of pixels in the pixel array are connected one-to-one to the plurality of memory cells of the plurality of memory circuits, wherein each of the plurality of pixels alternately outputs a photoelectric conversion value indicating an electric voltage generated in accordance with a light amount of an incident light entering the pixel, and a reset value indicating a reference charge of the pixel, to the memory cell corresponding to the pixel, wherein each of the plurality of memory cells temporarily stores the photoelectric conversion value and the reset value output from the pixel corresponding to the memory cell, wherein each of the plurality of memory circuits outputs the photoelectric conversion values and the reset values stored in corresponding memory cells of the plurality of memory cells of the memory circuit, in an order determined in advance, wherein each of the plurality of amplifiers amplifies a difference value between the photoelectric conversion value and the reset value, for each pixel, that are output from the corresponding memory circuit connected to the amplifier, and an offset value for the amplifier based on a first reference electric voltage, and outputs alternately the difference value and the offset value, wherein each of the plurality of analog/digital converters, based on a plurality of second reference electric voltages, which are different from each other, converts the difference value and the offset value, output from the corresponding amplifier connected to the analog/digital converter, from an analog value to a digital value, and outputs the difference value and the offset value, and wherein each of the plurality of pixel value calculators, based on the difference value and the offset value, output from the corresponding analog/digital converter connected to the pixel value calculator, calculates a pixel value of each pixel, and outputs the pixel value.

17. An image forming apparatus comprising a photoelectric conversion device, wherein the photoelectric conversion device includes a pixel array provided with a linear array or a plurality of linear arrays, each linear array including a plurality of pixels that are linearly arranged;

a plurality of memory circuits, each including a plurality of memory cells;

a plurality of amplifiers, each of the plurality of amplifiers being connected to a corresponding memory circuit of the plurality of memory circuits;

a plurality of analog/digital converters, each of the plurality of analog/digital converters being connected to a corresponding amplifier of the plurality of amplifiers; and a plurality of pixel value calculators, each of the plurality of pixel value calculators being connected to a corresponding analog/digital converter of the plurality of analog/digital converters, wherein the plurality of pixels in the pixel array are connected one-to-one to the plurality of memory cells of the plurality of memory circuits, wherein each of the plurality of pixels alternately outputs a photoelectric conversion value indicating an electric voltage generated in accordance with a light amount of an incident light entering the pixel, and a reset value indicating a reference charge of the pixel, to the memory cell corresponding to the pixel, wherein each of the plurality of memory cells temporarily stores the photoelectric conversion value and the reset value output from the pixel corresponding to the memory cell, wherein each of the plurality of memory circuits outputs the photoelectric conversion values and the reset values stored in corresponding memory cells of the plurality of memory cells of the memory circuit, in an order determined in advance, wherein each of the plurality of amplifiers amplifies a difference value between the photoelectric conversion value and the reset value, for each pixel, that are output from the corresponding memory circuit connected to the amplifier, and an offset value for the amplifier based on a first reference electric voltage, and outputs alternately the difference value and the offset value, wherein each of the plurality of analog/digital converters, based on a plurality of second reference electric voltages, which are different from each other, converts the difference value and the offset value, output from the corresponding amplifier connected to the analog/digital converter, from an analog value to a digital value, and outputs the difference value and the offset value, and wherein each of the plurality of pixel value calculators, based on the difference value and the offset value, output from the corresponding analog/digital converter connected to the pixel value calculator, calculates a pixel value of each pixel, and outputs the pixel value.

* * * * *